(12) United States Patent
Wallis et al.

(10) Patent No.: US 9,590,413 B2
(45) Date of Patent: Mar. 7, 2017

(54) SYSTEM AND METHOD FOR COMPRESSOR MOTOR PROTECTION

(71) Applicant: Emerson Climate Technologies, Inc., Sidney, OH (US)

(72) Inventors: Frank S. Wallis, Sidney, OH (US); Joseph James Rozsnaki, Troy, OH (US)

(73) Assignee: Emerson Climate Technologies, Inc., Sidney, OH (US)

( * ) Notice: Subject to any disclaimer, the term of this patent is extended or adjusted under 35 U.S.C. 154(b) by 6 days.

(21) Appl. No.: 14/617,451

(22) Filed: Feb. 9, 2015

(65) Prior Publication Data
US 2015/0155701 A1 Jun. 4, 2015

Related U.S. Application Data

(63) Continuation of application No. 13/737,566, filed on Jan. 9, 2013, now Pat. No. 8,964,338.
(Continued)

(51) Int. Cl.
*H02H 5/00* (2006.01)
*H02H 3/08* (2006.01)
(Continued)

(52) U.S. Cl.
CPC .............. *H02H 3/08* (2013.01); *F04B 35/04* (2013.01); *F04B 49/10* (2013.01); *F04C 23/02* (2013.01);
(Continued)

(58) Field of Classification Search
CPC H02H 3/08; H02H 3/06; H02H 5/041; H02H 7/08; F04B 35/04; F04B 2203/0201;
(Continued)

(56) References Cited

U.S. PATENT DOCUMENTS 2,054,542 A 9/1936 Hoelle
2,296,822 A 9/1942 Wolfert
(Continued)

FOREIGN PATENT DOCUMENTS

CA 1147440 A1 5/1983
CA 2528778 A1 12/2004
(Continued)

OTHER PUBLICATIONS

Advisory Action regarding U.S. Appl. No. 13/269,188, dated Apr. 13, 2015.
(Continued)

*Primary Examiner* — Rita Leykin
(74) *Attorney, Agent, or Firm* — Harness, Dickey & Pierce, P.L.C.

(57) ABSTRACT

A refrigerant compressor includes an electric motor. A current sensor measures current flow to the electric motor. A switching device is configured to close and open to allow and prevent current flow to the electric motor, respectively. A maximum continuous current (MCC) device includes a stored digital value corresponding to a maximum continuous current for the electric motor. A motor protection module: communicates with the MCC device, the current sensor, and the switching device; determines a first MCC for the electric motor as a function of the stored digital value received from the MCC device; selectively sets a predetermined MCC to the first MCC; and controls the switching device based on a comparison of the current flow to the electric motor and the predetermined MCC.

17 Claims, 6 Drawing Sheets

Related U.S. Application Data

(60) Provisional application No. 61/585,382, filed on Jan. 11, 2012.

(51) Int. Cl.

| | | |
|---|---|---|
| *H02H 5/04* | (2006.01) | |
| *H02H 3/00* | (2006.01) | |
| *H02H 7/08* | (2006.01) | |
| *F04B 35/04* | (2006.01) | |
| *F04B 49/10* | (2006.01) | |
| *F04C 23/02* | (2006.01) | |
| *F04C 28/28* | (2006.01) | |

(52) U.S. Cl.
CPC ............. *F04C 28/28* (2013.01); *H02H 3/006* (2013.01); *H02H 5/041* (2013.01); *H02H 7/08* (2013.01); *F04B 2203/0201* (2013.01); *F04B 2203/0205* (2013.01); *F04C 2270/07* (2013.01); *F04C 2270/80* (2013.01); *F04C 2270/86* (2013.01)

(58) Field of Classification Search
CPC .. F04B 49/10; F04B 2203/0205; F04C 23/02; F04C 28/28; F04C 2270/07; F04C 2270/80; F04C 2270/86
USPC .... 361/24, 22, 23, 25, 31, 87; 318/471, 432, 318/434; 62/126, 132, 215
See application file for complete search history.

(56) References Cited

U.S. PATENT DOCUMENTS

| | | | |
|---|---|---|---|
| 2,631,050 A | 3/1953 | Haeberlein |
| 2,804,839 A | 9/1957 | Hallinan |
| 2,961,606 A | 11/1960 | Mead |
| 2,962,702 A | 11/1960 | Derr et al. |
| 2,978,879 A | 4/1961 | Heidorn |
| 3,027,865 A | 4/1962 | Kautz et al. |
| 3,047,696 A | 7/1962 | Heidorn |
| 3,082,951 A | 3/1963 | Kayan |
| 3,107,843 A | 10/1963 | Finn |
| 3,170,304 A | 2/1965 | Hale |
| 3,232,519 A | 2/1966 | Long |
| 3,278,111 A | 10/1966 | Parker |
| 3,327,197 A | 6/1967 | Marquis |
| 3,400,374 A | 9/1968 | Schumann |
| 3,513,662 A | 5/1970 | Golber |
| 3,581,281 A | 5/1971 | Martin et al. |
| 3,585,451 A | 6/1971 | Day, III |
| 3,653,783 A | 4/1972 | Sauder |
| 3,660,718 A | 5/1972 | Pinckaers |
| 3,665,399 A | 5/1972 | Zehr et al. |
| 3,697,953 A | 10/1972 | Schoenwitz |
| 3,707,851 A | 1/1973 | McAshan, Jr. |
| 3,729,949 A | 5/1973 | Talbot |
| 3,735,377 A | 5/1973 | Kaufman |
| 3,742,302 A | 6/1973 | Neill |
| 3,742,303 A | 6/1973 | Dageford |
| 3,767,328 A | 10/1973 | Ladusaw |
| 3,777,240 A | 12/1973 | Neill |
| 3,783,681 A | 1/1974 | Hirt et al. |
| 3,820,074 A | 6/1974 | Toman |
| 3,882,305 A | 5/1975 | Johnstone |
| 3,924,972 A | 12/1975 | Szymaszek |
| 3,927,712 A | 12/1975 | Nakayama |
| 3,935,519 A | 1/1976 | Pfarrer et al. |
| 3,950,962 A | 4/1976 | Odashima |
| 3,960,011 A | 6/1976 | Renz et al. |
| 3,978,382 A | 8/1976 | Pfarrer et al. |
| 3,998,068 A | 12/1976 | Chirnside |
| 4,006,460 A | 2/1977 | Hewitt et al. |
| 4,014,182 A | 3/1977 | Granryd |
| 4,018,584 A | 4/1977 | Mullen |
| 4,019,172 A | 4/1977 | Srodes |
| 4,024,725 A | 5/1977 | Uchida et al. |
| 4,027,289 A | 5/1977 | Toman |
| 4,034,570 A | 7/1977 | Anderson et al. |
| 4,038,061 A | 7/1977 | Anderson et al. |
| 4,045,973 A | 9/1977 | Anderson et al. |
| 4,046,532 A | 9/1977 | Nelson |
| RE29,450 E | 10/1977 | Goldsby et al. |
| 4,060,716 A | 11/1977 | Pekrul et al. |
| 4,066,869 A | 1/1978 | Apaloo et al. |
| 4,090,248 A | 5/1978 | Swanson et al. |
| 4,102,150 A | 7/1978 | Kountz |
| 4,102,394 A | 7/1978 | Botts |
| 4,104,888 A | 8/1978 | Reedy et al. |
| 4,105,063 A | 8/1978 | Bergt |
| 4,112,703 A | 9/1978 | Kountz |
| 4,132,086 A | 1/1979 | Kountz |
| 4,136,730 A | 1/1979 | Kinsey |
| 4,137,057 A | 1/1979 | Piet et al. |
| 4,137,725 A | 2/1979 | Martin |
| 4,142,375 A | 3/1979 | Abe et al. |
| 4,143,707 A | 3/1979 | Lewis et al. |
| 4,146,085 A | 3/1979 | Wills |
| RE29,966 E | 4/1979 | Nussbaum |
| 4,151,725 A | 5/1979 | Kountz et al. |
| 4,153,003 A | 5/1979 | Willis |
| 4,156,350 A | 5/1979 | Elliott et al. |
| 4,161,106 A | 7/1979 | Savage et al. |
| 4,165,619 A | 8/1979 | Girard |
| 4,171,622 A | 10/1979 | Yamaguchi et al. |
| 4,173,871 A | 11/1979 | Brooks |
| 4,178,988 A | 12/1979 | Cann et al. |
| RE30,242 E | 4/1980 | del Toro et al. |
| 4,197,717 A | 4/1980 | Schumacher |
| 4,205,381 A | 5/1980 | Games et al. |
| 4,209,994 A | 7/1980 | Mueller et al. |
| 4,211,089 A | 7/1980 | Mueller et al. |
| 4,217,761 A | 8/1980 | Cornaire et al. |
| 4,220,010 A | 9/1980 | Mueller et al. |
| 4,227,862 A | 10/1980 | Andrew et al. |
| 4,232,530 A | 11/1980 | Mueller |
| 4,233,818 A | 11/1980 | Lastinger |
| 4,236,379 A | 12/1980 | Mueller |
| 4,244,182 A | 1/1981 | Behr |
| 4,246,763 A | 1/1981 | Mueller et al. |
| 4,248,051 A | 2/1981 | Darcy et al. |
| 4,251,988 A | 2/1981 | Allard et al. |
| 4,257,795 A | 3/1981 | Shaw |
| 4,259,847 A | 4/1981 | Pearse, Jr. |
| 4,267,702 A | 5/1981 | Houk |
| 4,270,174 A | 5/1981 | Karlin et al. |
| 4,271,898 A | 6/1981 | Freeman |
| 4,281,358 A | 7/1981 | Plouffe et al. |
| 4,284,849 A | 8/1981 | Anderson et al. |
| 4,286,438 A | 9/1981 | Clarke |
| 4,290,480 A | 9/1981 | Sulkowski |
| 4,296,727 A | 10/1981 | Bryan |
| 4,301,660 A | 11/1981 | Mueller et al. |
| 4,306,293 A | 12/1981 | Marathe |
| 4,307,775 A | 12/1981 | Saunders et al. |
| 4,308,725 A | 1/1982 | Chiyoda |
| 4,311,188 A | 1/1982 | Kojima et al. |
| 4,319,461 A | 3/1982 | Shaw |
| 4,321,529 A | 3/1982 | Simmonds et al. |
| 4,325,223 A | 4/1982 | Cantley |
| 4,328,678 A | 5/1982 | Kono et al. |
| 4,328,680 A | 5/1982 | Stamp, Jr. et al. |
| 4,333,316 A | 6/1982 | Stamp, Jr. et al. |
| 4,333,317 A | 6/1982 | Sawyer |
| 4,336,001 A | 6/1982 | Andrew et al. |
| 4,338,790 A | 7/1982 | Saunders et al. |
| 4,338,791 A | 7/1982 | Stamp, Jr. et al. |
| 4,345,162 A | 8/1982 | Hammer et al. |
| 4,346,755 A | 8/1982 | Alley et al. |
| 4,350,021 A | 9/1982 | Lundstrom |
| 4,350,023 A | 9/1982 | Kuwabara et al. |
| 4,351,163 A | 9/1982 | Johannsen |
| 4,356,703 A | 11/1982 | Vogel |
| 4,361,273 A | 11/1982 | Levine et al. |
| 4,365,983 A | 12/1982 | Abraham et al. |

(56) References Cited

U.S. PATENT DOCUMENTS

| | | |
|---|---|---|
| 4,370,098 A | 1/1983 | McClain et al. |
| 4,372,119 A | 2/1983 | Gillbrand et al. |
| 4,381,549 A | 4/1983 | Stamp, Jr. et al. |
| 4,382,367 A | 5/1983 | Roberts |
| 4,384,462 A | 5/1983 | Overman et al. |
| 4,387,368 A | 6/1983 | Day, III et al. |
| 4,387,578 A | 6/1983 | Paddock |
| 4,390,058 A | 6/1983 | Otake et al. |
| 4,390,321 A | 6/1983 | Langlois et al. |
| 4,390,922 A | 6/1983 | Pelliccia |
| 4,395,886 A | 8/1983 | Mayer |
| 4,395,887 A | 8/1983 | Sweetman |
| 4,399,548 A | 8/1983 | Castleberry |
| 4,402,054 A | 8/1983 | Osborne et al. |
| 4,406,133 A | 9/1983 | Saunders et al. |
| 4,407,138 A | 10/1983 | Mueller |
| 4,408,660 A | 10/1983 | Sutoh et al. |
| 4,412,788 A | 11/1983 | Shaw et al. |
| 4,415,896 A | 11/1983 | Allgood |
| 4,418,388 A | 11/1983 | Allgor et al. |
| 4,420,947 A | 12/1983 | Yoshino |
| 4,425,010 A | 1/1984 | Bryant et al. |
| 4,429,578 A | 2/1984 | Darrel et al. |
| 4,432,232 A | 2/1984 | Brantley et al. |
| 4,434,390 A | 2/1984 | Elms |
| 4,441,329 A | 4/1984 | Dawley |
| 4,448,038 A | 5/1984 | Barbier |
| 4,449,375 A | 5/1984 | Briccetti |
| 4,451,929 A | 5/1984 | Yoshida |
| 4,460,123 A | 7/1984 | Beverly |
| 4,463,571 A | 8/1984 | Wiggs |
| 4,463,574 A | 8/1984 | Spethmann et al. |
| 4,463,576 A | 8/1984 | Burnett et al. |
| 4,465,229 A | 8/1984 | Kompelien |
| 4,467,230 A | 8/1984 | Rovinsky |
| 4,467,385 A | 8/1984 | Bandoli et al. |
| 4,467,613 A | 8/1984 | Behr et al. |
| 4,470,092 A | 9/1984 | Lombardi |
| 4,470,266 A | 9/1984 | Briccetti et al. |
| 4,474,024 A | 10/1984 | Eplett et al. |
| 4,474,542 A | 10/1984 | Kato et al. |
| 4,479,389 A | 10/1984 | Anderson, III et al. |
| 4,489,551 A | 12/1984 | Watanabe et al. |
| 4,490,986 A | 1/1985 | Paddock |
| 4,494,383 A | 1/1985 | Nagatomo et al. |
| 4,495,779 A | 1/1985 | Tanaka et al. |
| 4,496,296 A | 1/1985 | Arai et al. |
| 4,497,031 A | 1/1985 | Froehling et al. |
| 4,498,310 A | 2/1985 | Imanishi et al. |
| 4,499,739 A | 2/1985 | Matsuoka et al. |
| 4,502,084 A | 2/1985 | Hannett |
| 4,502,833 A | 3/1985 | Hibino et al. |
| 4,502,842 A | 3/1985 | Currier et al. |
| 4,502,843 A | 3/1985 | Martin |
| 4,505,125 A | 3/1985 | Baglione |
| 4,506,518 A | 3/1985 | Yoshikawa et al. |
| 4,507,934 A | 4/1985 | Tanaka et al. |
| 4,510,547 A | 4/1985 | Rudich, Jr. |
| 4,510,576 A | 4/1985 | MacArthur et al. |
| 4,512,161 A | 4/1985 | Logan et al. |
| 4,516,407 A | 5/1985 | Watabe |
| 4,517,468 A | 5/1985 | Kemper et al. |
| 4,520,674 A | 6/1985 | Canada et al. |
| 4,523,435 A | 6/1985 | Lord |
| 4,523,436 A | 6/1985 | Schedel et al. |
| 4,527,247 A | 7/1985 | Kaiser et al. |
| 4,527,399 A | 7/1985 | Lord |
| 4,535,607 A | 8/1985 | Mount |
| 4,538,420 A | 9/1985 | Nelson |
| 4,538,422 A | 9/1985 | Mount et al. |
| 4,539,820 A | 9/1985 | Zinsmeyer |
| 4,540,040 A | 9/1985 | Fukumoto et al. |
| 4,545,210 A | 10/1985 | Lord |
| 4,545,214 A | 10/1985 | Kinoshita |
| 4,548,549 A | 10/1985 | Murphy et al. |
| 4,549,403 A | 10/1985 | Lord et al. |
| 4,549,404 A | 10/1985 | Lord |
| 4,550,770 A | 11/1985 | Nussdorfer et al. |
| 4,553,400 A | 11/1985 | Branz |
| 4,555,057 A | 11/1985 | Foster |
| 4,555,910 A | 12/1985 | Sturges |
| 4,557,317 A | 12/1985 | Harmon, Jr. |
| 4,558,181 A | 12/1985 | Blanchard et al. |
| 4,561,260 A | 12/1985 | Nishi et al. |
| 4,563,624 A | 1/1986 | Yu |
| 4,563,877 A | 1/1986 | Harnish |
| 4,563,878 A | 1/1986 | Baglione |
| 4,567,733 A | 2/1986 | Mecozzi |
| 4,568,909 A | 2/1986 | Whynacht |
| 4,574,871 A | 3/1986 | Parkinson et al. |
| 4,575,318 A | 3/1986 | Blain |
| 4,577,977 A | 3/1986 | Pejsa |
| 4,580,947 A | 4/1986 | Shibata et al. |
| 4,583,373 A | 4/1986 | Shaw |
| 4,589,060 A | 5/1986 | Zinsmeyer |
| 4,593,367 A | 6/1986 | Slack et al. |
| 4,598,764 A | 7/1986 | Beckey |
| 4,602,484 A | 7/1986 | Bendikson |
| 4,604,036 A | 8/1986 | Sutou et al. |
| 4,611,470 A | 9/1986 | Enstrom |
| 4,612,775 A | 9/1986 | Branz et al. |
| 4,614,089 A | 9/1986 | Dorsey |
| 4,617,804 A | 10/1986 | Fukushima et al. |
| 4,620,286 A | 10/1986 | Smith et al. |
| 4,620,424 A | 11/1986 | Tanaka et al. |
| 4,621,502 A | 11/1986 | Ibrahim et al. |
| 4,627,245 A | 12/1986 | Levine |
| 4,627,483 A | 12/1986 | Harshbarger, III et al. |
| 4,627,484 A | 12/1986 | Harshbarger, Jr. et al. |
| 4,630,572 A | 12/1986 | Evans |
| 4,630,670 A | 12/1986 | Wellman et al. |
| 4,642,034 A | 2/1987 | Terauchi |
| 4,642,782 A | 2/1987 | Kemper et al. |
| 4,644,479 A | 2/1987 | Kemper et al. |
| 4,646,532 A | 3/1987 | Nose |
| 4,648,044 A | 3/1987 | Hardy et al. |
| 4,649,515 A | 3/1987 | Thompson et al. |
| 4,649,710 A | 3/1987 | Inoue et al. |
| 4,653,280 A | 3/1987 | Hansen et al. |
| 4,653,285 A | 3/1987 | Pohl |
| 4,655,688 A | 4/1987 | Bohn et al. |
| 4,660,386 A | 4/1987 | Hansen et al. |
| 4,662,184 A | 5/1987 | Pohl et al. |
| 4,674,292 A | 6/1987 | Ohya et al. |
| 4,677,830 A | 7/1987 | Sumikawa et al. |
| 4,680,940 A | 7/1987 | Vaughn |
| 4,682,473 A | 7/1987 | Rogers, III |
| 4,684,060 A | 8/1987 | Adams et al. |
| 4,685,615 A | 8/1987 | Hart |
| 4,686,835 A | 8/1987 | Alsenz |
| 4,689,967 A | 9/1987 | Han et al. |
| 4,697,431 A | 10/1987 | Alsenz |
| 4,698,978 A | 10/1987 | Jones |
| 4,698,981 A | 10/1987 | Kaneko et al. |
| 4,701,824 A | 10/1987 | Beggs et al. |
| 4,703,325 A | 10/1987 | Chamberlin et al. |
| 4,706,152 A | 11/1987 | DeFilippis et al. |
| 4,706,469 A | 11/1987 | Oguni et al. |
| 4,712,648 A | 12/1987 | Mattes et al. |
| 4,713,717 A | 12/1987 | Pejouhy et al. |
| 4,715,190 A | 12/1987 | Han et al. |
| 4,715,792 A | 12/1987 | Nishizawa et al. |
| 4,716,582 A | 12/1987 | Blanchard et al. |
| 4,716,957 A | 1/1988 | Thompson et al. |
| 4,720,980 A | 1/1988 | Howland |
| 4,722,018 A | 1/1988 | Pohl |
| 4,722,019 A | 1/1988 | Pohl |
| 4,724,678 A | 2/1988 | Pohl |
| 4,735,054 A | 4/1988 | Beckey |
| 4,735,060 A | 4/1988 | Alsenz |
| 4,744,223 A | 5/1988 | Umezu |
| 4,745,765 A | 5/1988 | Pettitt |
| 4,745,766 A | 5/1988 | Bahr |
| 4,745,767 A | 5/1988 | Ohya et al. |

(56) References Cited

U.S. PATENT DOCUMENTS

| | | |
|---|---|---|
| 4,750,332 A | 6/1988 | Jenski et al. |
| 4,750,672 A | 6/1988 | Beckey et al. |
| 4,751,501 A | 6/1988 | Gut |
| 4,751,825 A | 6/1988 | Voorhis et al. |
| 4,754,410 A | 6/1988 | Leech et al. |
| 4,755,957 A | 7/1988 | White et al. |
| 4,765,150 A | 8/1988 | Persem |
| 4,768,346 A | 9/1988 | Mathur |
| 4,768,348 A | 9/1988 | Noguchi |
| 4,783,752 A | 11/1988 | Kaplan et al. |
| 4,787,213 A | 11/1988 | Gras et al. |
| 4,790,142 A | 12/1988 | Beckey |
| 4,796,142 A | 1/1989 | Libert |
| 4,796,466 A | 1/1989 | Farmer |
| 4,798,055 A | 1/1989 | Murray et al. |
| 4,805,118 A | 2/1989 | Rishel |
| 4,807,445 A | 2/1989 | Matsuoka et al. |
| 4,829,779 A | 5/1989 | Munson et al. |
| 4,831,560 A | 5/1989 | Zaleski |
| 4,831,832 A | 5/1989 | Alsenz |
| 4,831,833 A | 5/1989 | Duenes et al. |
| 4,835,706 A | 5/1989 | Asahi |
| 4,835,980 A | 6/1989 | Oyanagi et al. |
| 4,838,037 A | 6/1989 | Wood |
| 4,841,734 A | 6/1989 | Torrence |
| 4,843,575 A | 6/1989 | Crane |
| 4,845,956 A | 7/1989 | Berntsen et al. |
| 4,848,099 A | 7/1989 | Beckey et al. |
| 4,848,100 A | 7/1989 | Barthel et al. |
| 4,850,198 A | 7/1989 | Helt et al. |
| 4,850,204 A | 7/1989 | Bos et al. |
| 4,852,363 A | 8/1989 | Kampf et al. |
| 4,853,693 A | 8/1989 | Eaton-Williams |
| 4,856,286 A | 8/1989 | Sulfstede et al. |
| 4,858,676 A | 8/1989 | Bolfik et al. |
| 4,866,635 A | 9/1989 | Kahn et al. |
| 4,866,944 A | 9/1989 | Yamazaki |
| 4,869,073 A | 9/1989 | Kawai et al. |
| 4,873,836 A | 10/1989 | Thompson |
| 4,875,589 A | 10/1989 | Lacey et al. |
| 4,878,355 A | 11/1989 | Beckey et al. |
| 4,881,184 A | 11/1989 | Abegg, III et al. |
| 4,882,747 A | 11/1989 | Williams |
| 4,882,908 A | 11/1989 | White |
| 4,884,412 A | 12/1989 | Sellers et al. |
| 4,885,707 A | 12/1989 | Nichol et al. |
| 4,885,914 A | 12/1989 | Pearman |
| 4,887,436 A | 12/1989 | Enomoto et al. |
| 4,887,857 A | 12/1989 | VanOmmeren |
| 4,889,280 A | 12/1989 | Grald et al. |
| 4,893,480 A | 1/1990 | Matsui et al. |
| 4,899,551 A | 2/1990 | Weintraub |
| 4,903,500 A | 2/1990 | Hanson |
| 4,903,759 A | 2/1990 | Lapeyrouse |
| 4,904,993 A | 2/1990 | Sato |
| 4,909,041 A | 3/1990 | Jones |
| 4,909,076 A | 3/1990 | Busch et al. |
| 4,910,966 A | 3/1990 | Levine et al. |
| 4,913,625 A | 4/1990 | Gerlowski |
| 4,916,633 A | 4/1990 | Tychonievich et al. |
| 4,916,909 A | 4/1990 | Mathur et al. |
| 4,916,912 A | 4/1990 | Levine et al. |
| 4,918,690 A | 4/1990 | Markkula, Jr. et al. |
| 4,918,932 A | 4/1990 | Gustafson et al. |
| 4,924,404 A | 5/1990 | Reinke, Jr. |
| 4,924,418 A | 5/1990 | Bachman et al. |
| 4,928,750 A | 5/1990 | Nurczyk |
| 4,932,588 A | 6/1990 | Fedter et al. |
| 4,939,909 A | 7/1990 | Tsuchiyama et al. |
| 4,943,003 A | 7/1990 | Shimizu et al. |
| 4,944,160 A | 7/1990 | Malone et al. |
| 4,945,491 A | 7/1990 | Rishel |
| 4,948,040 A | 8/1990 | Kobayashi et al. |
| 4,949,550 A | 8/1990 | Hanson |
| 4,953,784 A | 9/1990 | Yasufuku et al. |
| 4,959,970 A | 10/1990 | Meckler |
| 4,964,060 A | 10/1990 | Hartsog |
| 4,964,125 A | 10/1990 | Kim |
| 4,966,006 A | 10/1990 | Thuesen et al. |
| 4,967,567 A | 11/1990 | Proctor et al. |
| 4,970,496 A | 11/1990 | Kirkpatrick |
| 4,974,427 A | 12/1990 | Diab |
| 4,974,665 A | 12/1990 | Zillner, Jr. |
| 4,975,024 A | 12/1990 | Heckel |
| 4,977,751 A | 12/1990 | Hanson |
| 4,985,857 A | 1/1991 | Bajpai et al. |
| 4,987,748 A | 1/1991 | Meckler |
| 4,990,057 A | 2/1991 | Rollins |
| 4,990,893 A | 2/1991 | Kiluk |
| 4,991,770 A | 2/1991 | Bird et al. |
| 5,000,009 A | 3/1991 | Clanin |
| 5,005,365 A | 4/1991 | Lynch |
| 5,009,074 A | 4/1991 | Goubeaux et al. |
| 5,009,075 A | 4/1991 | Okoren |
| 5,009,076 A | 4/1991 | Winslow |
| 5,018,357 A | 5/1991 | Livingstone et al. |
| 5,018,665 A | 5/1991 | Sulmone |
| RE33,620 E | 6/1991 | Persem |
| 5,022,234 A | 6/1991 | Goubeaux et al. |
| 5,039,009 A | 8/1991 | Baldwin et al. |
| 5,042,264 A | 8/1991 | Dudley |
| 5,051,720 A | 9/1991 | Kittirutsunetorn |
| 5,056,036 A | 10/1991 | Van Bork |
| 5,056,329 A | 10/1991 | Wilkinson |
| 5,058,388 A | 10/1991 | Shaw et al. |
| 5,062,278 A | 11/1991 | Sugiyama |
| 5,065,593 A | 11/1991 | Dudley et al. |
| 5,067,099 A | 11/1991 | McCown et al. |
| RE33,775 E | 12/1991 | Behr et al. |
| 5,070,468 A | 12/1991 | Niinomi et al. |
| 5,071,065 A | 12/1991 | Aalto et al. |
| 5,073,091 A | 12/1991 | Burgess et al. |
| 5,073,862 A | 12/1991 | Carlson |
| 5,076,067 A | 12/1991 | Prenger et al. |
| 5,076,494 A | 12/1991 | Ripka |
| 5,077,983 A | 1/1992 | Dudley |
| 5,083,438 A | 1/1992 | McMullin |
| 5,086,385 A | 2/1992 | Launey et al. |
| 5,088,297 A | 2/1992 | Maruyama et al. |
| 5,094,086 A | 3/1992 | Shyu |
| 5,095,712 A | 3/1992 | Narreau |
| 5,095,715 A | 3/1992 | Dudley |
| 5,099,654 A | 3/1992 | Baruschke et al. |
| 5,103,391 A | 4/1992 | Barrett |
| 5,107,500 A | 4/1992 | Wakamoto et al. |
| 5,109,222 A | 4/1992 | Welty |
| 5,109,676 A | 5/1992 | Waters et al. |
| 5,109,700 A | 5/1992 | Hicho |
| 5,109,916 A | 5/1992 | Thompson |
| 5,115,406 A | 5/1992 | Zatezalo et al. |
| 5,115,643 A | 5/1992 | Hayata et al. |
| 5,115,644 A | 5/1992 | Alsenz |
| 5,115,967 A | 5/1992 | Wedekind |
| 5,118,260 A | 6/1992 | Fraser, Jr. |
| 5,119,466 A | 6/1992 | Suzuki |
| 5,119,637 A | 6/1992 | Bard et al. |
| 5,121,610 A | 6/1992 | Atkinson et al. |
| 5,123,017 A | 6/1992 | Simpkins et al. |
| 5,123,252 A | 6/1992 | Hanson |
| 5,123,253 A | 6/1992 | Hanson et al. |
| 5,123,255 A | 6/1992 | Ohizumi |
| 5,125,067 A | 6/1992 | Erdman |
| 5,127,232 A | 7/1992 | Paige et al. |
| 5,131,237 A | 7/1992 | Valbjorn |
| 5,136,855 A | 8/1992 | Lenarduzzi |
| 5,140,394 A * | 8/1992 | Cobb, III ............... H02H 3/085 |
| | | 257/467 |
| 5,141,407 A | 8/1992 | Ramsey et al. |
| 5,142,877 A | 9/1992 | Shimizu |
| 5,150,584 A | 9/1992 | Tomasov et al. |
| 5,156,539 A | 10/1992 | Anderson et al. |
| 5,167,494 A | 12/1992 | Inagaki et al. |
| 5,170,935 A | 12/1992 | Federspiel et al. |
| 5,170,936 A | 12/1992 | Kubo et al. |

(56) References Cited

U.S. PATENT DOCUMENTS

| | | |
|---|---|---|
| 5,181,389 A | 1/1993 | Hanson et al. |
| 5,186,014 A | 2/1993 | Runk |
| 5,197,666 A | 3/1993 | Wedekind |
| 5,199,855 A | 4/1993 | Nakajima et al. |
| 5,200,872 A | 4/1993 | D'Entremont et al. |
| 5,200,987 A | 4/1993 | Gray |
| 5,201,862 A | 4/1993 | Pettitt |
| 5,203,178 A | 4/1993 | Shyu |
| 5,203,179 A | 4/1993 | Powell |
| 5,209,076 A | 5/1993 | Kauffman et al. |
| 5,209,400 A | 5/1993 | Winslow et al. |
| 5,219,041 A | 6/1993 | Greve |
| 5,224,354 A | 7/1993 | Ito et al. |
| 5,224,835 A | 7/1993 | Oltman |
| 5,226,472 A | 7/1993 | Benevelli et al. |
| 5,228,300 A | 7/1993 | Shim |
| 5,228,304 A | 7/1993 | Ryan |
| 5,228,307 A | 7/1993 | Koce |
| 5,230,223 A | 7/1993 | Hullar et al. |
| 5,231,844 A | 8/1993 | Park |
| 5,233,841 A | 8/1993 | Jyrek |
| 5,235,526 A | 8/1993 | Saffell |
| 5,237,830 A | 8/1993 | Grant |
| 5,241,664 A | 8/1993 | Ohba et al. |
| 5,241,833 A | 9/1993 | Ohkoshi |
| 5,243,827 A | 9/1993 | Hagita et al. |
| 5,243,829 A | 9/1993 | Bessler |
| 5,245,833 A | 9/1993 | Mei et al. |
| 5,248,244 A | 9/1993 | Ho et al. |
| 5,251,453 A | 10/1993 | Stanke et al. |
| 5,251,454 A | 10/1993 | Yoon |
| 5,255,977 A | 10/1993 | Eimer et al. |
| 5,257,506 A | 11/1993 | DeWolf et al. |
| 5,262,704 A | 11/1993 | Farr |
| 5,265,434 A | 11/1993 | Alsenz |
| 5,269,458 A | 12/1993 | Sol |
| 5,271,556 A | 12/1993 | Helt et al. |
| 5,274,571 A | 12/1993 | Hesse et al. |
| 5,276,630 A | 1/1994 | Baldwin et al. |
| 5,279,458 A | 1/1994 | DeWolf et al. |
| 5,282,728 A | 2/1994 | Swain |
| 5,284,026 A | 2/1994 | Powell |
| 5,289,362 A | 2/1994 | Liebl et al. |
| 5,290,154 A | 3/1994 | Kotlarek et al. |
| 5,291,752 A | 3/1994 | Alvarez et al. |
| 5,299,504 A | 4/1994 | Abele |
| 5,303,112 A | 4/1994 | Zulaski et al. |
| 5,303,560 A | 4/1994 | Hanson et al. |
| 5,311,451 A | 5/1994 | Barrett |
| 5,311,562 A | 5/1994 | Palusamy et al. |
| 5,316,448 A | 5/1994 | Ziegler et al. |
| 5,320,506 A | 6/1994 | Fogt |
| 5,333,460 A | 8/1994 | Lewis et al. |
| 5,335,507 A | 8/1994 | Powell |
| 5,336,058 A | 8/1994 | Yokoyama |
| 5,337,576 A * | 8/1994 | Dorfman ............... F25B 49/005 340/607 |
| 5,347,476 A | 9/1994 | McBean, Sr. |
| 5,351,037 A | 9/1994 | Martell et al. |
| 5,362,206 A | 11/1994 | Westerman et al. |
| 5,362,211 A | 11/1994 | Iizuka et al. |
| 5,368,446 A | 11/1994 | Rode |
| 5,369,958 A | 12/1994 | Kasai et al. |
| 5,381,669 A | 1/1995 | Bahel et al. |
| 5,381,692 A | 1/1995 | Winslow et al. |
| 5,388,176 A | 2/1995 | Dykstra et al. |
| 5,395,042 A | 3/1995 | Riley et al. |
| 5,410,230 A | 4/1995 | Bessler et al. |
| 5,414,792 A | 5/1995 | Shorey |
| 5,415,008 A | 5/1995 | Bessler |
| 5,416,781 A | 5/1995 | Ruiz |
| 5,423,190 A | 6/1995 | Friedland |
| 5,423,192 A | 6/1995 | Young et al. |
| 5,426,952 A | 6/1995 | Bessler |
| 5,431,026 A | 7/1995 | Jaster |
| 5,432,500 A | 7/1995 | Scripps |
| 5,435,145 A | 7/1995 | Jaster |
| 5,440,890 A | 8/1995 | Bahel et al. |
| 5,440,891 A | 8/1995 | Hindmon, Jr. et al. |
| 5,440,895 A | 8/1995 | Bahel et al. |
| 5,446,677 A | 8/1995 | Jensen et al. |
| 5,450,359 A | 9/1995 | Sharma et al. |
| 5,452,291 A | 9/1995 | Eisenhandler et al. |
| 5,454,229 A | 10/1995 | Hanson et al. |
| 5,457,965 A | 10/1995 | Blair et al. |
| 5,460,006 A | 10/1995 | Torimitsu |
| 5,467,011 A | 11/1995 | Hunt |
| 5,467,264 A | 11/1995 | Rauch et al. |
| 5,469,045 A | 11/1995 | Dove et al. |
| 5,475,986 A | 12/1995 | Bahel et al. |
| 5,478,212 A | 12/1995 | Sakai et al. |
| 5,481,481 A | 1/1996 | Frey et al. |
| 5,481,884 A | 1/1996 | Scoccia |
| 5,483,141 A | 1/1996 | Uesugi |
| 5,491,978 A | 2/1996 | Young et al. |
| 5,495,722 A | 3/1996 | Manson et al. |
| 5,499,512 A | 3/1996 | Jurewicz et al. |
| 5,509,786 A | 4/1996 | Mizutani et al. |
| 5,511,387 A | 4/1996 | Tinsler |
| 5,512,883 A | 4/1996 | Lane, Jr. |
| 5,515,267 A | 5/1996 | Alsenz |
| 5,515,692 A | 5/1996 | Sterber et al. |
| 5,519,301 A | 5/1996 | Yoshida et al. |
| 5,519,337 A | 5/1996 | Casada |
| 5,528,908 A | 6/1996 | Bahel et al. |
| 5,533,347 A | 7/1996 | Ott et al. |
| 5,535,136 A | 7/1996 | Standifer |
| 5,535,597 A | 7/1996 | An |
| 5,546,015 A | 8/1996 | Okabe |
| 5,546,073 A | 8/1996 | Duff et al. |
| 5,546,756 A | 8/1996 | Ali |
| 5,546,757 A | 8/1996 | Whipple, III |
| 5,548,966 A | 8/1996 | Tinsler |
| 5,555,195 A | 9/1996 | Jensen et al. |
| 5,562,426 A | 10/1996 | Watanabe et al. |
| 5,563,490 A | 10/1996 | Kawaguchi et al. |
| 5,564,280 A | 10/1996 | Schilling et al. |
| 5,566,084 A | 10/1996 | Cmar |
| 5,570,085 A | 10/1996 | Bertsch |
| 5,570,258 A | 10/1996 | Manning |
| 5,572,643 A | 11/1996 | Judson |
| 5,577,905 A | 11/1996 | Momber et al. |
| 5,579,648 A | 12/1996 | Hanson et al. |
| 5,581,229 A | 12/1996 | Hunt |
| 5,586,445 A | 12/1996 | Bessler |
| 5,586,446 A | 12/1996 | Torimitsu |
| 5,590,830 A | 1/1997 | Kettler et al. |
| 5,592,058 A | 1/1997 | Archer et al. |
| 5,592,824 A | 1/1997 | Sogabe et al. |
| 5,596,507 A | 1/1997 | Jones et al. |
| 5,600,960 A | 2/1997 | Schwedler et al. |
| 5,602,749 A | 2/1997 | Vosburgh |
| 5,602,757 A | 2/1997 | Haseley et al. |
| 5,602,761 A | 2/1997 | Spoerre et al. |
| 5,610,339 A | 3/1997 | Haseley et al. |
| 5,611,674 A | 3/1997 | Bass et al. |
| 5,613,841 A | 3/1997 | Bass et al. |
| 5,616,829 A | 4/1997 | Balaschak et al. |
| 5,623,834 A | 4/1997 | Bahel et al. |
| 5,628,201 A | 5/1997 | Bahel et al. |
| 5,630,325 A | 5/1997 | Bahel et al. |
| 5,635,896 A | 6/1997 | Tinsley et al. |
| 5,641,270 A | 6/1997 | Sgourakes et al. |
| 5,643,482 A | 7/1997 | Sandelman et al. |
| 5,650,936 A | 7/1997 | Loucks et al. |
| 5,651,263 A | 7/1997 | Nonaka et al. |
| 5,655,379 A | 8/1997 | Jaster et al. |
| 5,655,380 A | 8/1997 | Calton |
| 5,656,765 A | 8/1997 | Gray |
| 5,666,815 A | 9/1997 | Aloise |
| 5,682,949 A | 11/1997 | Ratcliffe et al. |
| 5,684,463 A | 11/1997 | Diercks et al. |
| 5,689,963 A | 11/1997 | Bahel et al. |
| 5,691,692 A | 11/1997 | Herbstritt |

(56) References Cited

U.S. PATENT DOCUMENTS

| | | |
|---|---|---|
| 5,694,010 A | 12/1997 | Oomura et al. |
| 5,696,501 A | 12/1997 | Ouellette et al. |
| 5,699,670 A | 12/1997 | Jurewicz et al. |
| 5,706,007 A | 1/1998 | Fragnito et al. |
| 5,707,210 A | 1/1998 | Ramsey et al. |
| 5,711,785 A | 1/1998 | Maxwell |
| 5,713,724 A | 2/1998 | Centers et al. |
| 5,714,931 A | 2/1998 | Petite et al. |
| 5,715,704 A | 2/1998 | Cholkeri et al. |
| 5,718,822 A | 2/1998 | Richter |
| 5,724,571 A | 3/1998 | Woods |
| 5,729,474 A | 3/1998 | Hildebrand et al. |
| 5,737,931 A | 4/1998 | Ueno et al. |
| 5,741,120 A | 4/1998 | Bass et al. |
| 5,743,109 A | 4/1998 | Schulak |
| 5,745,114 A | 4/1998 | King et al. |
| 5,749,238 A | 5/1998 | Schmidt |
| 5,751,916 A | 5/1998 | Kon et al. |
| 5,752,385 A | 5/1998 | Nelson |
| 5,754,450 A | 5/1998 | Solomon et al. |
| 5,754,732 A | 5/1998 | Vlahu |
| 5,757,664 A | 5/1998 | Rogers et al. |
| 5,757,892 A | 5/1998 | Blanchard et al. |
| 5,761,083 A | 6/1998 | Brown, Jr. et al. |
| 5,764,509 A | 6/1998 | Gross et al. |
| 5,772,214 A | 6/1998 | Stark |
| 5,772,403 A | 6/1998 | Allison et al. |
| 5,782,101 A | 7/1998 | Dennis |
| 5,784,232 A * | 7/1998 | Farr .................. F25B 49/025 361/103 |
| 5,790,898 A | 8/1998 | Kishima et al. |
| 5,795,381 A | 8/1998 | Holder |
| 5,798,941 A | 8/1998 | McLeister |
| 5,802,860 A | 9/1998 | Barrows |
| 5,805,856 A | 9/1998 | Hanson |
| 5,807,336 A | 9/1998 | Russo et al. |
| 5,808,441 A | 9/1998 | Nehring |
| 5,810,908 A | 9/1998 | Gray et al. |
| 5,812,061 A | 9/1998 | Simons |
| 5,825,597 A | 10/1998 | Young |
| 5,827,963 A | 10/1998 | Selegatto et al. |
| 5,839,094 A | 11/1998 | French |
| 5,839,291 A | 11/1998 | Chang et al. |
| 5,841,654 A | 11/1998 | Verissimo et al. |
| 5,860,286 A | 1/1999 | Tulpule |
| 5,861,807 A | 1/1999 | Leyden et al. |
| 5,867,998 A | 2/1999 | Guertin |
| 5,869,960 A | 2/1999 | Brand |
| 5,873,257 A | 2/1999 | Peterson |
| 5,875,430 A | 2/1999 | Koether |
| 5,875,638 A | 3/1999 | Tinsler |
| 5,884,494 A | 3/1999 | Okoren et al. |
| 5,887,786 A | 3/1999 | Sandelman |
| 5,900,801 A | 5/1999 | Heagle et al. |
| 5,904,049 A | 5/1999 | Jaster et al. |
| 5,918,200 A | 6/1999 | Tsutsui et al. |
| 5,924,295 A | 7/1999 | Park |
| 5,924,486 A | 7/1999 | Ehlers et al. |
| 5,926,103 A | 7/1999 | Petite |
| 5,926,531 A | 7/1999 | Petite |
| 5,930,773 A | 7/1999 | Crooks et al. |
| 5,934,087 A | 8/1999 | Watanabe et al. |
| 5,939,974 A | 8/1999 | Heagle et al. |
| 5,946,922 A | 9/1999 | Viard et al. |
| 5,947,693 A | 9/1999 | Yang |
| 5,947,701 A | 9/1999 | Hugenroth |
| 5,949,677 A | 9/1999 | Ho |
| 5,953,490 A | 9/1999 | Wiklund et al. |
| 5,956,658 A | 9/1999 | McMahon |
| 5,971,712 A | 10/1999 | Kann |
| 5,975,854 A | 11/1999 | Culp, III et al. |
| 5,984,645 A | 11/1999 | Cummings |
| 5,986,571 A | 11/1999 | Flick |
| 5,987,903 A | 11/1999 | Bathla |
| 5,988,986 A | 11/1999 | Brinken et al. |
| 5,995,347 A | 11/1999 | Rudd et al. |
| 5,995,351 A | 11/1999 | Katsumata et al. |
| 6,006,142 A | 12/1999 | Seem et al. |
| 6,006,171 A | 12/1999 | Vines et al. |
| 6,011,368 A | 1/2000 | Kalpathi et al. |
| 6,013,108 A | 1/2000 | Karolys et al. |
| 6,017,192 A | 1/2000 | Clack et al. |
| 6,020,702 A | 2/2000 | Farr |
| 6,023,420 A | 2/2000 | McCormick et al. |
| 6,026,651 A | 2/2000 | Sandelman |
| 6,028,522 A | 2/2000 | Petite |
| 6,035,661 A | 3/2000 | Sunaga et al. |
| 6,038,871 A | 3/2000 | Gutierrez et al. |
| 6,041,605 A | 3/2000 | Heinrichs |
| 6,041,609 A | 3/2000 | Hornsleth et al. |
| 6,041,856 A | 3/2000 | Thrasher et al. |
| 6,042,344 A | 3/2000 | Lifson |
| 6,044,062 A | 3/2000 | Brownrigg et al. |
| 6,047,557 A | 4/2000 | Pham et al. |
| 6,050,098 A | 4/2000 | Meyer et al. |
| 6,050,780 A | 4/2000 | Hasegawa et al. |
| 6,052,731 A | 4/2000 | Holdsworth et al. |
| 6,057,771 A | 5/2000 | Lakra |
| 6,065,946 A | 5/2000 | Lathrop |
| 6,068,447 A | 5/2000 | Foege |
| 6,070,110 A | 5/2000 | Shah et al. |
| 6,075,530 A | 6/2000 | Lucas et al. |
| 6,077,051 A | 6/2000 | Centers et al. |
| 6,081,750 A | 6/2000 | Hoffberg et al. |
| 6,082,495 A | 7/2000 | Steinbarger et al. |
| 6,082,971 A | 7/2000 | Gunn et al. |
| 6,085,530 A | 7/2000 | Barito |
| 6,088,659 A | 7/2000 | Kelley et al. |
| 6,088,688 A | 7/2000 | Crooks et al. |
| 6,092,370 A | 7/2000 | Tremoulet, Jr. et al. |
| 6,092,378 A | 7/2000 | Das et al. |
| 6,092,992 A | 7/2000 | Imblum et al. |
| 6,095,674 A | 8/2000 | Verissimo et al. |
| 6,098,893 A | 8/2000 | Berglund et al. |
| 6,102,665 A | 8/2000 | Centers et al. |
| 6,110,260 A | 8/2000 | Kubokawa |
| 6,119,949 A | 9/2000 | Lindstrom |
| 6,122,603 A | 9/2000 | Budike, Jr. |
| 6,125,642 A | 10/2000 | Seener et al. |
| 6,128,583 A | 10/2000 | Dowling |
| 6,128,953 A | 10/2000 | Mizukoshi |
| 6,129,527 A | 10/2000 | Donahoe et al. |
| 6,138,461 A | 10/2000 | Park et al. |
| 6,142,741 A | 11/2000 | Nishihata et al. |
| 6,144,888 A | 11/2000 | Lucas et al. |
| 6,145,328 A | 11/2000 | Choi |
| 6,147,601 A | 11/2000 | Sandelman et al. |
| 6,152,375 A | 11/2000 | Robison |
| 6,152,376 A | 11/2000 | Sandelman et al. |
| 6,153,942 A | 11/2000 | Roseman et al. |
| 6,153,993 A | 11/2000 | Oomura et al. |
| 6,154,488 A | 11/2000 | Hunt |
| 6,157,310 A | 12/2000 | Milne et al. |
| 6,158,230 A | 12/2000 | Katsuki |
| 6,160,477 A | 12/2000 | Sandelman et al. |
| 6,169,979 B1 | 1/2001 | Johnson |
| 6,172,476 B1 | 1/2001 | Tolbert, Jr. et al. |
| 6,174,136 B1 | 1/2001 | Kilayko et al. |
| 6,176,686 B1 | 1/2001 | Wallis et al. |
| 6,177,884 B1 | 1/2001 | Hunt et al. |
| 6,178,362 B1 | 1/2001 | Woolard et al. |
| 6,179,214 B1 | 1/2001 | Key et al. |
| 6,190,442 B1 | 2/2001 | Redner |
| 6,191,545 B1 | 2/2001 | Kawabata et al. |
| 6,192,282 B1 | 2/2001 | Smith et al. |
| 6,199,018 B1 | 3/2001 | Quist et al. |
| 6,211,782 B1 | 4/2001 | Sandelman et al. |
| 6,213,731 B1 | 4/2001 | Doepker et al. |
| 6,215,405 B1 | 4/2001 | Handley et al. |
| 6,216,956 B1 | 4/2001 | Ehlers et al. |
| 6,218,953 B1 | 4/2001 | Petite |
| 6,223,543 B1 | 5/2001 | Sandelman |
| 6,223,544 B1 | 5/2001 | Seem |
| 6,228,155 B1 | 5/2001 | Tai |

(56) References Cited

U.S. PATENT DOCUMENTS

| | | |
|---|---|---|
| 6,230,501 B1 | 5/2001 | Bailey, Sr. et al. |
| 6,233,327 B1 | 5/2001 | Petite |
| 6,234,019 B1 | 5/2001 | Caldeira |
| 6,240,733 B1 | 6/2001 | Brandon et al. |
| 6,240,736 B1 | 6/2001 | Fujita et al. |
| 6,244,061 B1 | 6/2001 | Takagi et al. |
| 6,249,516 B1 | 6/2001 | Brownrigg et al. |
| 6,260,004 B1 | 7/2001 | Hays et al. |
| 6,266,968 B1 | 7/2001 | Redlich |
| 6,268,664 B1 | 7/2001 | Rolls et al. |
| 6,272,868 B1 | 8/2001 | Grabon et al. |
| 6,276,901 B1 | 8/2001 | Farr et al. |
| 6,279,332 B1 | 8/2001 | Yeo et al. |
| 6,290,043 B1 | 9/2001 | Ginder et al. |
| 6,293,114 B1 | 9/2001 | Kamemoto |
| 6,293,767 B1 | 9/2001 | Bass |
| 6,302,654 B1 | 10/2001 | Millet et al. |
| 6,304,934 B1 | 10/2001 | Pimenta et al. |
| 6,320,275 B1 * | 11/2001 | Okamoto .................. B60L 3/04 307/10.1 |
| 6,324,854 B1 | 12/2001 | Jayanth |
| 6,327,541 B1 | 12/2001 | Pitchford et al. |
| 6,332,327 B1 | 12/2001 | Street et al. |
| 6,334,093 B1 | 12/2001 | More |
| 6,349,883 B1 | 2/2002 | Simmons et al. |
| 6,359,410 B1 | 3/2002 | Randolph |
| 6,360,551 B1 | 3/2002 | Renders |
| 6,366,889 B1 | 4/2002 | Zaloom |
| 6,375,439 B1 | 4/2002 | Missio |
| 6,378,315 B1 | 4/2002 | Gelber et al. |
| 6,381,971 B2 | 5/2002 | Honda |
| 6,385,510 B1 | 5/2002 | Hoog et al. |
| 6,389,823 B1 | 5/2002 | Loprete et al. |
| 6,390,779 B1 | 5/2002 | Cunkelman |
| 6,391,102 B1 | 5/2002 | Bodden et al. |
| 6,393,848 B2 | 5/2002 | Roh et al. |
| 6,397,606 B1 | 6/2002 | Roh et al. |
| 6,397,612 B1 | 6/2002 | Kernkamp et al. |
| 6,406,265 B1 | 6/2002 | Hahn et al. |
| 6,406,266 B1 | 6/2002 | Hugenroth et al. |
| 6,408,228 B1 | 6/2002 | Seem et al. |
| 6,408,258 B1 | 6/2002 | Richer |
| 6,412,293 B1 | 7/2002 | Pham et al. |
| 6,414,594 B1 | 7/2002 | Guerlain |
| 6,430,268 B1 | 8/2002 | Petite |
| 6,433,791 B2 | 8/2002 | Selli et al. |
| 6,437,691 B1 | 8/2002 | Sandelman et al. |
| 6,437,692 B1 | 8/2002 | Petite et al. |
| 6,438,981 B1 | 8/2002 | Whiteside |
| 6,442,953 B1 | 9/2002 | Trigiani et al. |
| 6,449,972 B2 | 9/2002 | Pham et al. |
| 6,450,771 B1 | 9/2002 | Centers et al. |
| 6,451,210 B1 | 9/2002 | Sivavec et al. |
| 6,453,687 B2 | 9/2002 | Sharood et al. |
| 6,454,177 B1 | 9/2002 | Sasao et al. |
| 6,454,538 B1 | 9/2002 | Witham et al. |
| 6,456,928 B1 | 9/2002 | Johnson |
| 6,457,319 B1 | 10/2002 | Ota et al. |
| 6,457,948 B1 | 10/2002 | Pham |
| 6,460,731 B2 | 10/2002 | Estelle et al. |
| 6,462,654 B1 | 10/2002 | Sandelman et al. |
| 6,463,747 B1 | 10/2002 | Temple |
| 6,466,971 B1 | 10/2002 | Humpleman et al. |
| 6,467,280 B2 | 10/2002 | Pham et al. |
| 6,471,486 B1 | 10/2002 | Centers et al. |
| 6,474,084 B2 | 11/2002 | Gauthier et al. |
| 6,484,520 B2 | 11/2002 | Kawaguchi et al. |
| 6,487,457 B1 | 11/2002 | Hull et al. |
| 6,490,506 B1 | 12/2002 | March |
| 6,492,923 B1 | 12/2002 | Inoue et al. |
| 6,497,554 B2 | 12/2002 | Yang et al. |
| 6,501,240 B2 | 12/2002 | Ueda et al. |
| 6,501,629 B1 | 12/2002 | Marriott |
| 6,502,409 B1 | 1/2003 | Gatling et al. |
| 6,505,087 B1 | 1/2003 | Lucas et al. |
| 6,505,475 B1 | 1/2003 | Zugibe et al. |
| 6,510,350 B1 | 1/2003 | Steen, III et al. |
| 6,522,974 B2 | 2/2003 | Sitton |
| 6,523,130 B1 | 2/2003 | Hickman et al. |
| 6,526,766 B1 | 3/2003 | Hiraoka et al. |
| 6,529,590 B1 | 3/2003 | Centers |
| 6,529,839 B1 | 3/2003 | Uggerud et al. |
| 6,533,552 B2 | 3/2003 | Centers et al. |
| 6,535,123 B2 | 3/2003 | Sandelman et al. |
| 6,535,270 B1 | 3/2003 | Murayama |
| 6,535,859 B1 | 3/2003 | Yablonowski et al. |
| 6,537,034 B2 | 3/2003 | Park et al. |
| 6,542,062 B1 | 4/2003 | Herrick |
| 6,549,135 B2 | 4/2003 | Singh et al. |
| 6,551,069 B2 | 4/2003 | Narney, II et al. |
| 6,553,774 B1 | 4/2003 | Ishio et al. |
| 6,558,126 B1 | 5/2003 | Hahn et al. |
| 6,560,976 B2 | 5/2003 | Jayanth |
| 6,571,280 B1 | 5/2003 | Hubacher |
| 6,571,566 B1 | 6/2003 | Temple et al. |
| 6,571,586 B1 | 6/2003 | Ritson et al. |
| 6,574,561 B2 | 6/2003 | Alexander et al. |
| 6,577,959 B1 | 6/2003 | Chajec et al. |
| 6,577,962 B1 | 6/2003 | Afshari |
| 6,578,373 B1 | 6/2003 | Barbier |
| 6,583,720 B1 | 6/2003 | Quigley |
| 6,591,620 B2 | 7/2003 | Kikuchi et al. |
| 6,595,475 B2 | 7/2003 | Svabek et al. |
| 6,595,757 B2 | 7/2003 | Shen |
| 6,598,056 B1 | 7/2003 | Hull et al. |
| 6,601,397 B2 | 8/2003 | Pham et al. |
| 6,604,093 B1 | 8/2003 | Etzion et al. |
| 6,609,070 B1 | 8/2003 | Lueck |
| 6,609,078 B2 | 8/2003 | Starling et al. |
| 6,615,594 B2 | 9/2003 | Jayanth et al. |
| 6,616,415 B1 | 9/2003 | Renken et al. |
| 6,618,578 B1 | 9/2003 | Petite |
| 6,618,709 B1 | 9/2003 | Sneeringer |
| 6,621,443 B1 | 9/2003 | Selli et al. |
| 6,622,925 B2 | 9/2003 | Carner et al. |
| 6,622,926 B1 | 9/2003 | Sartain et al. |
| 6,628,764 B1 | 9/2003 | Petite |
| 6,629,420 B2 | 10/2003 | Renders |
| 6,630,749 B1 * | 10/2003 | Takagi .................. H02J 7/0031 307/10.7 |
| 6,631,298 B1 | 10/2003 | Pagnano et al. |
| 6,636,893 B1 | 10/2003 | Fong |
| 6,643,567 B2 | 11/2003 | Kolk et al. |
| 6,644,848 B1 | 11/2003 | Clayton et al. |
| 6,647,735 B2 | 11/2003 | Street et al. |
| 6,658,373 B2 | 12/2003 | Rossi et al. |
| 6,662,584 B1 | 12/2003 | Whiteside |
| 6,662,653 B1 | 12/2003 | Scaliante et al. |
| 6,671,586 B2 | 12/2003 | Davis et al. |
| 6,675,591 B2 | 1/2004 | Singh et al. |
| 6,679,072 B2 | 1/2004 | Pham et al. |
| 6,684,349 B2 | 1/2004 | Gullo et al. |
| 6,685,438 B2 | 2/2004 | Yoo et al. |
| 6,698,218 B2 | 3/2004 | Goth et al. |
| 6,701,725 B2 | 3/2004 | Rossi et al. |
| 6,708,083 B2 | 3/2004 | Orthlieb et al. |
| 6,708,508 B2 | 3/2004 | Demuth et al. |
| 6,709,244 B2 | 3/2004 | Pham |
| 6,711,470 B1 | 3/2004 | Hartenstein et al. |
| 6,711,911 B1 | 3/2004 | Grabon et al. |
| 6,717,513 B1 | 4/2004 | Sandelman et al. |
| 6,721,770 B1 | 4/2004 | Morton et al. |
| 6,725,182 B2 | 4/2004 | Pagnano et al. |
| 6,732,538 B2 | 5/2004 | Trigiani et al. |
| 6,745,107 B1 | 6/2004 | Miller |
| 6,747,557 B1 | 6/2004 | Petite et al. |
| 6,757,665 B1 | 6/2004 | Unsworth et al. |
| 6,758,050 B2 | 7/2004 | Jayanth et al. |
| 6,758,051 B2 | 7/2004 | Jayanth et al. |
| 6,760,207 B2 | 7/2004 | Wyatt et al. |
| 6,772,096 B2 | 8/2004 | Murakami et al. |
| 6,772,598 B1 | 8/2004 | Rinehart |
| 6,775,995 B1 | 8/2004 | Bahel et al. |
| 6,784,807 B2 | 8/2004 | Petite et al. |

(56) References Cited

U.S. PATENT DOCUMENTS

| | | | |
|---|---|---|---|
| 6,785,592 B1 | 8/2004 | Smith et al. |
| 6,786,473 B1 | 9/2004 | Alles |
| 6,799,951 B2 | 10/2004 | Lifson et al. |
| 6,804,993 B2 | 10/2004 | Selli |
| 6,811,380 B2 | 11/2004 | Kim |
| 6,813,897 B1 * | 11/2004 | Bash .................. F25B 27/00 |
| | | | 307/64 |
| 6,816,811 B2 | 11/2004 | Seem |
| 6,823,680 B2 | 11/2004 | Jayanth |
| 6,829,542 B1 | 12/2004 | Reynolds et al. |
| 6,832,120 B1 | 12/2004 | Frank et al. |
| 6,832,898 B2 | 12/2004 | Yoshida et al. |
| 6,836,737 B2 | 12/2004 | Petite et al. |
| 6,837,922 B2 | 1/2005 | Gorin |
| 6,839,790 B2 | 1/2005 | Barros De Almeida et al. |
| 6,854,345 B2 | 2/2005 | Alves et al. |
| 6,862,498 B2 | 3/2005 | Davis et al. |
| 6,868,678 B2 | 3/2005 | Mei et al. |
| 6,868,686 B2 | 3/2005 | Ueda et al. |
| 6,869,272 B2 | 3/2005 | Odachi et al. |
| 6,870,486 B2 | 3/2005 | Souza et al. |
| 6,885,949 B2 | 4/2005 | Selli |
| 6,889,173 B2 | 5/2005 | Singh |
| 6,891,838 B1 | 5/2005 | Petite et al. |
| 6,892,546 B2 | 5/2005 | Singh et al. |
| 6,897,772 B1 | 5/2005 | Scheffler et al. |
| 6,900,738 B2 | 5/2005 | Crichlow |
| 6,901,066 B1 | 5/2005 | Helgeson |
| 6,904,385 B1 | 6/2005 | Budike, Jr. |
| 6,914,533 B2 | 7/2005 | Petite |
| 6,914,893 B2 | 7/2005 | Petite |
| 6,922,155 B1 | 7/2005 | Evans et al. |
| 6,931,445 B2 | 8/2005 | Davis |
| 6,934,862 B2 | 8/2005 | Sharood et al. |
| 6,952,658 B2 | 10/2005 | Greulich et al. |
| 6,956,344 B2 | 10/2005 | Robertson et al. |
| 6,964,558 B2 | 11/2005 | Hahn et al. |
| 6,966,759 B2 | 11/2005 | Hahn et al. |
| 6,968,295 B1 | 11/2005 | Carr |
| 6,973,410 B2 | 12/2005 | Seigel |
| 6,973,793 B2 | 12/2005 | Douglas et al. |
| 6,973,794 B2 | 12/2005 | Street et al. |
| 6,976,366 B2 | 12/2005 | Starling et al. |
| 6,978,225 B2 | 12/2005 | Retlich et al. |
| 6,981,384 B2 | 1/2006 | Dobmeier et al. |
| 6,983,321 B2 | 1/2006 | Trinon et al. |
| 6,983,889 B2 | 1/2006 | Alles |
| 6,986,469 B2 | 1/2006 | Gauthier et al. |
| 6,987,450 B2 | 1/2006 | Marino et al. |
| 6,990,821 B2 | 1/2006 | Singh et al. |
| 6,992,452 B1 | 1/2006 | Sachs et al. |
| 6,996,441 B1 | 2/2006 | Tobias |
| 6,997,390 B2 | 2/2006 | Alles |
| 6,998,807 B2 * | 2/2006 | Phillips .................. F04B 17/03 |
| | | | 318/455 |
| 6,998,963 B2 | 2/2006 | Flen et al. |
| 6,999,996 B2 | 2/2006 | Sunderland |
| 7,000,422 B2 | 2/2006 | Street et al. |
| 7,003,378 B2 | 2/2006 | Poth |
| 7,009,510 B1 | 3/2006 | Douglass et al. |
| 7,010,925 B2 | 3/2006 | Sienel et al. |
| 7,019,667 B2 | 3/2006 | Petite et al. |
| 7,024,665 B2 | 4/2006 | Ferraz et al. |
| 7,024,870 B2 | 4/2006 | Singh et al. |
| 7,030,752 B2 | 4/2006 | Tyroler |
| 7,031,880 B1 | 4/2006 | Seem et al. |
| 7,035,693 B2 | 4/2006 | Cassiolato et al. |
| 7,039,532 B2 | 5/2006 | Hunter |
| 7,042,180 B2 | 5/2006 | Terry et al. |
| 7,042,350 B2 | 5/2006 | Patrick et al. |
| 7,043,339 B2 | 5/2006 | Maeda et al. |
| 7,043,459 B2 | 5/2006 | Peevey |
| 7,047,753 B2 | 5/2006 | Street et al. |
| 7,053,766 B2 | 5/2006 | Fisler et al. |
| 7,053,767 B2 | 5/2006 | Petite et al. |
| 7,054,271 B2 | 5/2006 | Brownrigg et al. |
| 7,062,580 B2 | 6/2006 | Donaires |
| 7,062,830 B2 | 6/2006 | Alles |
| 7,063,537 B2 | 6/2006 | Selli et al. |
| 7,072,797 B2 | 7/2006 | Gorinevsky |
| 7,075,327 B2 | 7/2006 | Dimino et al. |
| 7,079,810 B2 | 7/2006 | Petite et al. |
| 7,079,967 B2 | 7/2006 | Rossi et al. |
| 7,082,380 B2 | 7/2006 | Wiebe et al. |
| 7,089,125 B2 | 8/2006 | Sonderegger |
| 7,091,847 B2 | 8/2006 | Capowski et al. |
| 7,092,767 B2 | 8/2006 | Pagnano et al. |
| 7,092,794 B1 | 8/2006 | Hill et al. |
| 7,096,153 B2 | 8/2006 | Guralnik et al. |
| 7,102,490 B2 | 9/2006 | Flen et al. |
| 7,103,511 B2 | 9/2006 | Petite |
| 7,110,843 B2 | 9/2006 | Pagnano et al. |
| 7,110,898 B2 | 9/2006 | Montijo et al. |
| 7,113,376 B2 | 9/2006 | Nomura et al. |
| 7,114,343 B2 | 10/2006 | Kates |
| 7,123,020 B2 | 10/2006 | Hill et al. |
| 7,123,458 B2 | 10/2006 | Mohr et al. |
| 7,124,728 B2 | 10/2006 | Carey et al. |
| 7,126,465 B2 | 10/2006 | Faltesek |
| 7,130,170 B2 | 10/2006 | Wakefield et al. |
| 7,130,832 B2 | 10/2006 | Bannai et al. |
| 7,134,295 B2 | 11/2006 | Maekawa |
| 7,137,550 B1 | 11/2006 | Petite |
| 7,142,125 B2 | 11/2006 | Larson et al. |
| 7,145,438 B2 | 12/2006 | Flen et al. |
| 7,145,462 B2 | 12/2006 | Dewing et al. |
| 7,159,408 B2 | 1/2007 | Sadegh et al. |
| 7,162,884 B2 | 1/2007 | Alles |
| 7,163,158 B2 | 1/2007 | Rossi et al. |
| 7,171,372 B2 | 1/2007 | Daniel et al. |
| 7,174,728 B2 | 2/2007 | Jayanth |
| 7,180,412 B2 | 2/2007 | Bonicatto et al. |
| 7,184,861 B2 | 2/2007 | Petite |
| 7,188,482 B2 | 3/2007 | Sadegh et al. |
| 7,188,779 B2 | 3/2007 | Alles |
| 7,201,006 B2 | 4/2007 | Kates |
| 7,207,496 B2 | 4/2007 | Alles |
| 7,209,840 B2 | 4/2007 | Petite et al. |
| 7,212,887 B2 | 5/2007 | Shah et al |
| 7,222,493 B2 | 5/2007 | Jayanth et al. |
| 7,224,740 B2 | 5/2007 | Hunt |
| 7,225,193 B2 | 5/2007 | Mets et al. |
| 7,227,450 B2 | 6/2007 | Garvy et al. |
| 7,228,691 B2 | 6/2007 | Street et al. |
| 7,230,528 B2 | 6/2007 | Kates |
| 7,234,313 B2 | 6/2007 | Bell et al. |
| 7,236,765 B2 | 6/2007 | Bonicatto et al. |
| 7,244,294 B2 | 7/2007 | Kates |
| 7,246,014 B2 | 7/2007 | Forth et al. |
| 7,255,285 B2 | 8/2007 | Troost et al. |
| 7,257,501 B2 | 8/2007 | Zhan et al. |
| 7,260,505 B2 | 8/2007 | Felke et al. |
| 7,261,762 B2 | 8/2007 | Kang et al. |
| 7,263,073 B2 | 8/2007 | Petite et al. |
| 7,263,446 B2 | 8/2007 | Morin et al. |
| 7,266,812 B2 | 9/2007 | Pagnano |
| 7,270,278 B2 | 9/2007 | Street et al. |
| 7,274,995 B2 | 9/2007 | Zhan et al. |
| 7,275,377 B2 | 10/2007 | Kates |
| 7,286,945 B2 | 10/2007 | Zhan et al. |
| 7,290,398 B2 | 11/2007 | Wallace et al. |
| 7,290,989 B2 | 11/2007 | Jayanth |
| 7,295,128 B2 | 11/2007 | Petite |
| 7,295,896 B2 | 11/2007 | Norbeck |
| 7,317,952 B2 | 1/2008 | Bhandiwad et al. |
| 7,328,192 B1 | 2/2008 | Stengard et al. |
| 7,330,886 B2 | 2/2008 | Childers et al. |
| 7,331,187 B2 | 2/2008 | Kates |
| 7,336,168 B2 | 2/2008 | Kates |
| 7,337,191 B2 | 2/2008 | Haeberle et al. |
| 7,343,750 B2 | 3/2008 | Lifson et al. |
| 7,343,751 B2 | 3/2008 | Kates |
| 7,346,463 B2 | 3/2008 | Petite et al. |
| 7,346,472 B1 | 3/2008 | Moskowitz et al. |

(56) References Cited

U.S. PATENT DOCUMENTS

| | | |
|---|---|---|
| 7,349,824 B2 | 3/2008 | Seigel |
| 7,350,112 B2 | 3/2008 | Fox et al. |
| 7,351,274 B2 | 4/2008 | Helt et al. |
| 7,352,545 B2 | 4/2008 | Wyatt et al. |
| 7,363,200 B2 | 4/2008 | Lu |
| 7,376,712 B1 | 5/2008 | Granatelli et al. |
| 7,377,118 B2 | 5/2008 | Esslinger |
| 7,383,030 B2 | 6/2008 | Brown et al. |
| 7,383,158 B2 | 6/2008 | Krocker et al. |
| 7,392,661 B2 | 7/2008 | Alles |
| 7,397,907 B2 | 7/2008 | Petite |
| 7,400,240 B2 | 7/2008 | Shrode et al. |
| 7,412,842 B2 | 8/2008 | Pham |
| 7,414,525 B2 | 8/2008 | Costea et al. |
| 7,421,351 B2 | 9/2008 | Navratil |
| 7,421,374 B2 | 9/2008 | Zhan et al. |
| 7,421,850 B2 | 9/2008 | Street et al. |
| 7,424,343 B2 | 9/2008 | Kates |
| 7,424,345 B2 | 9/2008 | Norbeck |
| 7,424,527 B2 | 9/2008 | Petite |
| 7,432,824 B2 | 10/2008 | Flen et al. |
| 7,433,854 B2 | 10/2008 | Joseph et al. |
| 7,434,742 B2 | 10/2008 | Mueller et al. |
| 7,437,150 B1 | 10/2008 | Morelli et al. |
| 7,440,560 B1 | 10/2008 | Barry |
| 7,440,767 B2 | 10/2008 | Ballay et al. |
| 7,443,313 B2 | 10/2008 | Davis et al. |
| 7,444,251 B2 | 10/2008 | Nikovski et al. |
| 7,445,665 B2 | 11/2008 | Hsieh et al. |
| 7,447,603 B2 | 11/2008 | Bruno |
| 7,447,609 B2 | 11/2008 | Guralnik et al. |
| 7,451,606 B2 | 11/2008 | Harrod |
| 7,454,439 B1 | 11/2008 | Gansner et al. |
| 7,458,223 B2 | 12/2008 | Pham |
| 7,468,661 B2 | 12/2008 | Petite et al. |
| 7,469,546 B2 | 12/2008 | Kates |
| 7,474,992 B2 | 1/2009 | Ariyur |
| 7,480,501 B2 | 1/2009 | Petite |
| 7,483,810 B2 | 1/2009 | Jackson et al. |
| 7,484,376 B2 | 2/2009 | Pham |
| 7,490,477 B2 | 2/2009 | Singh et al. |
| 7,491,034 B2 | 2/2009 | Jayanth |
| 7,503,182 B2 | 3/2009 | Bahel et al. |
| 7,510,126 B2 | 3/2009 | Rossi et al. |
| 7,523,619 B2 | 4/2009 | Kojima et al. |
| 7,528,711 B2 | 5/2009 | Kates |
| 7,533,070 B2 | 5/2009 | Guralnik et al. |
| 7,537,172 B2 | 5/2009 | Rossi et al. |
| 7,552,030 B2 | 6/2009 | Guralnik et al. |
| 7,552,596 B2 | 6/2009 | Galante et al. |
| 7,555,364 B2 | 6/2009 | Poth et al. |
| 7,574,333 B2 | 8/2009 | Lu |
| 7,580,812 B2 | 8/2009 | Ariyur et al. |
| 7,594,407 B2 | 9/2009 | Singh et al. |
| 7,596,959 B2 | 10/2009 | Singh et al. |
| 7,606,683 B2 | 10/2009 | Bahel et al. |
| 7,631,508 B2 | 12/2009 | Braun et al. |
| 7,636,901 B2 | 12/2009 | Munson et al. |
| 7,644,591 B2 | 1/2010 | Singh et al. |
| 7,648,077 B2 | 1/2010 | Rossi et al. |
| 7,650,425 B2 | 1/2010 | Davis et al. |
| 7,660,700 B2 | 2/2010 | Moskowitz et al. |
| 7,660,774 B2 | 2/2010 | Mukherjee et al. |
| 7,664,613 B2 | 2/2010 | Hansen |
| 7,665,315 B2 | 2/2010 | Singh et al. |
| 7,686,872 B2 | 3/2010 | Kang |
| 7,693,809 B2 | 4/2010 | Gray |
| 7,697,492 B2 | 4/2010 | Petite |
| 7,703,694 B2 | 4/2010 | Mueller et al. |
| 7,704,052 B2 | 4/2010 | Iimura et al. |
| 7,706,320 B2 | 4/2010 | Davis et al. |
| 7,724,131 B2 | 5/2010 | Chen |
| 7,726,583 B2 | 6/2010 | Maekawa |
| 7,734,451 B2 | 6/2010 | MacArthur et al. |
| 7,738,999 B2 | 6/2010 | Petite |
| 7,739,378 B2 | 6/2010 | Petite |
| 7,742,393 B2 | 6/2010 | Bonicatto et al. |
| 7,752,853 B2 | 7/2010 | Singh et al. |
| 7,752,854 B2 | 7/2010 | Singh et al. |
| 7,756,086 B2 | 7/2010 | Petite et al. |
| 7,791,468 B2 | 9/2010 | Bonicatto et al. |
| 7,844,366 B2 | 11/2010 | Singh |
| 7,845,179 B2 | 12/2010 | Singh et al. |
| 7,848,827 B2 | 12/2010 | Chen |
| 7,848,900 B2 | 12/2010 | Steinberg et al. |
| 7,877,218 B2 | 1/2011 | Bonicatto et al. |
| 7,885,959 B2 | 2/2011 | Horowitz et al. |
| 7,885,961 B2 | 2/2011 | Horowitz et al. |
| 7,905,098 B2 | 3/2011 | Pham |
| 7,908,116 B2 | 3/2011 | Steinberg et al. |
| 7,908,117 B2 | 3/2011 | Steinberg et al. |
| 7,922,914 B1 | 4/2011 | Verdegan et al. |
| 7,937,623 B2 | 5/2011 | Ramacher et al. |
| 7,941,294 B2 | 5/2011 | Shahi et al. |
| 7,949,494 B2 | 5/2011 | Moskowitz et al. |
| 7,949,615 B2 | 5/2011 | Ehlers et al. |
| 7,963,454 B2 | 6/2011 | Sullivan et al. |
| 7,966,152 B2 | 6/2011 | Stluka et al. |
| 7,967,218 B2 | 6/2011 | Alles |
| 7,978,059 B2 | 7/2011 | Petite et al. |
| 7,987,679 B2 | 8/2011 | Tanaka et al. |
| 7,996,045 B1 | 8/2011 | Bauer et al. |
| 7,999,668 B2 | 8/2011 | Cawthorne et al. |
| 8,000,314 B2 | 8/2011 | Brownrigg et al. |
| 8,002,199 B2 | 8/2011 | Habegger |
| 8,005,640 B2 | 8/2011 | Chiefetz et al. |
| 8,010,237 B2 | 8/2011 | Cheung et al. |
| 8,013,732 B2 | 9/2011 | Petite et al. |
| 8,018,182 B2 * | 9/2011 | Roehm ............ B25F 5/001 318/139 |
| 8,019,567 B2 | 9/2011 | Steinberg et al. |
| 8,029,608 B1 | 10/2011 | Breslin |
| 8,031,455 B2 * | 10/2011 | Paik ............... H03M 1/129 361/104 |
| 8,031,650 B2 | 10/2011 | Petite et al. |
| 8,034,170 B2 | 10/2011 | Kates |
| 8,036,844 B2 | 10/2011 | Ling et al. |
| 8,040,231 B2 | 10/2011 | Kuruvila et al. |
| 8,041,539 B2 | 10/2011 | Guralnik et al. |
| 8,046,107 B2 | 10/2011 | Zugibe et al. |
| 8,061,417 B2 | 11/2011 | Gray |
| 8,064,412 B2 | 11/2011 | Petite |
| 8,065,886 B2 | 11/2011 | Singh et al. |
| 8,068,997 B2 | 11/2011 | Ling et al. |
| 8,090,477 B1 | 1/2012 | Steinberg |
| 8,090,559 B2 | 1/2012 | Parthasarathy et al. |
| 8,090,824 B2 | 1/2012 | Tran et al. |
| 8,095,337 B2 | 1/2012 | Kolbet et al. |
| 8,108,200 B2 | 1/2012 | Anne et al. |
| 8,125,230 B2 | 2/2012 | Bharadwaj et al. |
| 8,131,497 B2 | 3/2012 | Steinberg et al. |
| 8,131,506 B2 | 3/2012 | Steinberg et al. |
| 8,134,330 B2 | 3/2012 | Alles |
| 8,150,720 B2 | 4/2012 | Singh et al. |
| 8,156,208 B2 | 4/2012 | Bornhoevd et al. |
| 8,170,968 B2 | 5/2012 | Colclough et al. |
| 8,171,136 B2 | 5/2012 | Petite |
| 8,175,846 B2 | 5/2012 | Khalak et al. |
| 8,180,492 B2 | 5/2012 | Steinberg |
| 8,182,579 B2 | 5/2012 | Woo et al. |
| 8,214,175 B2 | 7/2012 | Moskowitz et al. |
| 8,228,648 B2 | 7/2012 | Jayanth et al. |
| 8,239,922 B2 | 8/2012 | Sullivan et al. |
| 8,258,763 B2 | 9/2012 | Nakamura et al. |
| 8,279,565 B2 | 10/2012 | Hall et al. |
| 8,280,536 B1 | 10/2012 | Fadell et al. |
| 8,328,524 B2 | 12/2012 | Iimura et al. |
| 8,380,556 B2 | 2/2013 | Singh et al. |
| 8,393,169 B2 | 3/2013 | Pham |
| 8,625,244 B2 * | 1/2014 | Paik ............... H03M 1/129 361/104 |
| 9,168,315 B1 | 10/2015 | Scaringe et al. |
| 2001/0005320 A1 | 6/2001 | Ueda et al. |
| 2001/0054293 A1 | 12/2001 | Gustafson et al. |

(56) References Cited

U.S. PATENT DOCUMENTS

| | | |
|---|---|---|
| 2002/0013679 A1 | 1/2002 | Petite |
| 2002/0016639 A1 | 2/2002 | Smith et al. |
| 2002/0017057 A1 | 2/2002 | Weder |
| 2002/0018724 A1 | 2/2002 | Millet et al. |
| 2002/0020175 A1 | 2/2002 | Street et al. |
| 2002/0029575 A1 | 3/2002 | Okamoto |
| 2002/0031101 A1 | 3/2002 | Petite et al. |
| 2002/0035495 A1 | 3/2002 | Spira et al. |
| 2002/0040280 A1 | 4/2002 | Morgan |
| 2002/0064463 A1 | 5/2002 | Park et al. |
| 2002/0067999 A1 | 6/2002 | Suitou et al. |
| 2002/0082747 A1 | 6/2002 | Kramer |
| 2002/0082924 A1 | 6/2002 | Koether |
| 2002/0095269 A1 | 7/2002 | Natalini et al. |
| 2002/0103655 A1 | 8/2002 | Boies et al. |
| 2002/0113877 A1 | 8/2002 | Welch |
| 2002/0117992 A1 | 8/2002 | Hirono et al. |
| 2002/0118106 A1 | 8/2002 | Brenn |
| 2002/0127120 A1 | 9/2002 | Hahn et al. |
| 2002/0138217 A1 | 9/2002 | Shen et al. |
| 2002/0143482 A1 | 10/2002 | Karanam et al. |
| 2002/0152298 A1 | 10/2002 | Kikta et al. |
| 2002/0157408 A1 | 10/2002 | Egawa et al. |
| 2002/0157409 A1 | 10/2002 | Pham et al. |
| 2002/0161545 A1 | 10/2002 | Starling et al. |
| 2002/0163436 A1 | 11/2002 | Singh et al. |
| 2002/0170299 A1 | 11/2002 | Jayanth et al. |
| 2002/0173929 A1 | 11/2002 | Seigel |
| 2002/0187057 A1 | 12/2002 | Loprete et al. |
| 2002/0189267 A1 | 12/2002 | Singh et al. |
| 2002/0193890 A1 | 12/2002 | Pouchak |
| 2002/0198629 A1 | 12/2002 | Ellis |
| 2003/0004660 A1 | 1/2003 | Hunter |
| 2003/0004765 A1 | 1/2003 | Wiegand |
| 2003/0005710 A1 | 1/2003 | Singh et al. |
| 2003/0006884 A1 | 1/2003 | Hunt |
| 2003/0014218 A1 | 1/2003 | Trigiani et al. |
| 2003/0019221 A1 | 1/2003 | Rossi et al. |
| 2003/0036810 A1 | 2/2003 | Petite |
| 2003/0037555 A1 | 2/2003 | Street et al. |
| 2003/0050737 A1 | 3/2003 | Osann |
| 2003/0050824 A1 | 3/2003 | Suermondt et al. |
| 2003/0051490 A1 | 3/2003 | Jayanth |
| 2003/0055603 A1 | 3/2003 | Rossi et al. |
| 2003/0055663 A1 | 3/2003 | Struble |
| 2003/0063983 A1 | 4/2003 | Ancel et al. |
| 2003/0070438 A1 | 4/2003 | Kikuchi et al. |
| 2003/0070544 A1 | 4/2003 | Mulvaney et al. |
| 2003/0074285 A1 | 4/2003 | Hoffman et al. |
| 2003/0077179 A1 | 4/2003 | Collins et al. |
| 2003/0078677 A1 | 4/2003 | Hull et al. |
| 2003/0078742 A1 | 4/2003 | VanderZee et al. |
| 2003/0089493 A1 | 5/2003 | Takano et al. |
| 2003/0094004 A1 | 5/2003 | Pham et al. |
| 2003/0108430 A1 | 6/2003 | Yoshida et al. |
| 2003/0115890 A1 | 6/2003 | Jayanth et al. |
| 2003/0135786 A1 | 7/2003 | Vollmar et al. |
| 2003/0137396 A1 | 7/2003 | Durej et al. |
| 2003/0150924 A1 | 8/2003 | Peter |
| 2003/0150926 A1 | 8/2003 | Rosen |
| 2003/0150927 A1 | 8/2003 | Rosen |
| 2003/0171851 A1 | 9/2003 | Brickfield et al. |
| 2003/0183085 A1 | 10/2003 | Alexander |
| 2003/0191606 A1 | 10/2003 | Fujiyama et al. |
| 2003/0199247 A1 | 10/2003 | Striemer |
| 2003/0205143 A1 | 11/2003 | Cheng |
| 2003/0213851 A1 | 11/2003 | Burd et al. |
| 2003/0216837 A1 | 11/2003 | Reich et al. |
| 2003/0216888 A1 | 11/2003 | Ridolfo |
| 2003/0233172 A1 | 12/2003 | Granqvist et al. |
| 2004/0016241 A1 | 1/2004 | Street et al. |
| 2004/0016244 A1 | 1/2004 | Street et al. |
| 2004/0016251 A1 | 1/2004 | Street et al. |
| 2004/0016253 A1 | 1/2004 | Street et al. |
| 2004/0019584 A1 | 1/2004 | Greening et al. |
| 2004/0024495 A1 | 2/2004 | Sunderland |
| 2004/0037706 A1 | 2/2004 | Hahn et al. |
| 2004/0042904 A1 | 3/2004 | Kim |
| 2004/0047406 A1 | 3/2004 | Hunt |
| 2004/0049715 A1 | 3/2004 | Jaw |
| 2004/0059691 A1 | 3/2004 | Higgins |
| 2004/0068390 A1 | 4/2004 | Saunders |
| 2004/0078695 A1 | 4/2004 | Bowers et al. |
| 2004/0079093 A1 | 4/2004 | Gauthier et al. |
| 2004/0093879 A1 | 5/2004 | Street et al. |
| 2004/0095237 A1 | 5/2004 | Chen et al. |
| 2004/0111186 A1 | 6/2004 | Rossi et al. |
| 2004/0117166 A1 | 6/2004 | Cassiolato |
| 2004/0133314 A1 | 7/2004 | Ehlers et al. |
| 2004/0133367 A1 | 7/2004 | Hart |
| 2004/0140772 A1 | 7/2004 | Gullo et al. |
| 2004/0140812 A1 | 7/2004 | Scallante et al. |
| 2004/0144106 A1 | 7/2004 | Douglas et al. |
| 2004/0153437 A1 | 8/2004 | Buchan |
| 2004/0159113 A1 | 8/2004 | Singh et al. |
| 2004/0159114 A1 | 8/2004 | Demuth et al. |
| 2004/0183687 A1 | 9/2004 | Petite et al. |
| 2004/0184627 A1 | 9/2004 | Kost et al. |
| 2004/0184928 A1 | 9/2004 | Millet et al. |
| 2004/0184929 A1 | 9/2004 | Millet et al. |
| 2004/0184930 A1 | 9/2004 | Millet et al. |
| 2004/0184931 A1 | 9/2004 | Millet et al. |
| 2004/0187502 A1 | 9/2004 | Jayanth et al. |
| 2004/0191073 A1 | 9/2004 | Iimura et al. |
| 2004/0199480 A1 * | 10/2004 | Unsworth ........... F04D 15/0077 706/16 |
| 2004/0210419 A1 | 10/2004 | Wiebe et al. |
| 2004/0213384 A1 | 10/2004 | Alles et al. |
| 2004/0230582 A1 | 11/2004 | Pagnano et al. |
| 2004/0230899 A1 | 11/2004 | Pagnano et al. |
| 2004/0239266 A1 | 12/2004 | Lee et al. |
| 2004/0261431 A1 | 12/2004 | Singh et al. |
| 2005/0043923 A1 | 2/2005 | Forster et al. |
| 2005/0053471 A1 | 3/2005 | Hong et al. |
| 2005/0056031 A1 | 3/2005 | Jeong |
| 2005/0066675 A1 | 3/2005 | Manole et al. |
| 2005/0073532 A1 | 4/2005 | Scott et al. |
| 2005/0086341 A1 | 4/2005 | Enga et al. |
| 2005/0100449 A1 | 5/2005 | Hahn et al. |
| 2005/0103036 A1 | 5/2005 | Maekawa |
| 2005/0125439 A1 | 6/2005 | Nourbakhsh et al. |
| 2005/0126190 A1 | 6/2005 | Lifson et al. |
| 2005/0131624 A1 | 6/2005 | Gaessler et al. |
| 2005/0149570 A1 | 7/2005 | Sasaki et al. |
| 2005/0154495 A1 | 7/2005 | Shah |
| 2005/0166610 A1 | 8/2005 | Jayanth |
| 2005/0169636 A1 | 8/2005 | Aronson et al. |
| 2005/0172647 A1 | 8/2005 | Thybo et al. |
| 2005/0195775 A1 | 9/2005 | Petite et al. |
| 2005/0198063 A1 | 9/2005 | Thomas et al. |
| 2005/0201397 A1 | 9/2005 | Petite |
| 2005/0204756 A1 | 9/2005 | Dobmeier et al. |
| 2005/0207741 A1 | 9/2005 | Shah et al. |
| 2005/0214148 A1 | 9/2005 | Ogawa et al. |
| 2005/0222715 A1 | 10/2005 | Ruhnke et al. |
| 2005/0228607 A1 | 10/2005 | Simons |
| 2005/0229612 A1 | 10/2005 | Hrejsa et al. |
| 2005/0229777 A1 | 10/2005 | Brown et al. |
| 2005/0232781 A1 | 10/2005 | Herbert et al. |
| 2005/0235660 A1 | 10/2005 | Pham |
| 2005/0235661 A1 | 10/2005 | Pham |
| 2005/0235662 A1 | 10/2005 | Pham |
| 2005/0235663 A1 | 10/2005 | Pham |
| 2005/0235664 A1 | 10/2005 | Pham |
| 2005/0247194 A1 | 11/2005 | Kang et al. |
| 2005/0251293 A1 | 11/2005 | Seigel |
| 2005/0252220 A1 | 11/2005 | Street et al. |
| 2005/0262856 A1 | 12/2005 | Street et al. |
| 2005/0262923 A1 | 12/2005 | Kates |
| 2006/0010898 A1 | 1/2006 | Suharno et al. |
| 2006/0015777 A1 | 1/2006 | Loda |
| 2006/0020426 A1 | 1/2006 | Singh |
| 2006/0021362 A1 | 2/2006 | Sadegh et al. |
| 2006/0032245 A1 | 2/2006 | Kates |

(56) References Cited

U.S. PATENT DOCUMENTS

| | | |
|---|---|---|
| 2006/0032246 A1 | 2/2006 | Kates |
| 2006/0032247 A1 | 2/2006 | Kates |
| 2006/0032248 A1 | 2/2006 | Kates |
| 2006/0032379 A1 | 2/2006 | Kates |
| 2006/0036349 A1 | 2/2006 | Kates |
| 2006/0041335 A9 | 2/2006 | Rossi et al. |
| 2006/0042276 A1 | 3/2006 | Doll et al. |
| 2006/0071089 A1 | 4/2006 | Kates |
| 2006/0071666 A1* | 4/2006 | Unsworth ........... F04D 15/0077 324/522 |
| 2006/0074917 A1 | 4/2006 | Chand et al. |
| 2006/0097063 A1 | 5/2006 | Zeevi |
| 2006/0098576 A1 | 5/2006 | Brownrigg et al. |
| 2006/0117773 A1 | 6/2006 | Street et al. |
| 2006/0123807 A1 | 6/2006 | Sullivan et al. |
| 2006/0129339 A1 | 6/2006 | Bruno |
| 2006/0130500 A1 | 6/2006 | Gauthier et al. |
| 2006/0137364 A1 | 6/2006 | Braun et al. |
| 2006/0137368 A1 | 6/2006 | Kang et al. |
| 2006/0138866 A1 | 6/2006 | Bergmann et al. |
| 2006/0140209 A1 | 6/2006 | Cassiolato et al. |
| 2006/0151037 A1 | 7/2006 | Lepola et al. |
| 2006/0179854 A1 | 8/2006 | Esslinger |
| 2006/0182635 A1 | 8/2006 | Jayanth |
| 2006/0185373 A1 | 8/2006 | Butler et al. |
| 2006/0196196 A1 | 9/2006 | Kates |
| 2006/0196197 A1 | 9/2006 | Kates |
| 2006/0201168 A1 | 9/2006 | Kates |
| 2006/0222507 A1 | 10/2006 | Jayanth |
| 2006/0229739 A1 | 10/2006 | Morikawa |
| 2006/0235650 A1 | 10/2006 | Vinberg et al. |
| 2006/0238388 A1 | 10/2006 | Jayanth |
| 2006/0242200 A1 | 10/2006 | Horowitz et al. |
| 2006/0244641 A1 | 11/2006 | Jayanth et al. |
| 2006/0256488 A1 | 11/2006 | Benzing et al. |
| 2006/0259276 A1 | 11/2006 | Rossi et al. |
| 2006/0271589 A1 | 11/2006 | Horowitz et al. |
| 2006/0271623 A1 | 11/2006 | Horowitz et al. |
| 2006/0280627 A1 | 12/2006 | Jayanth |
| 2007/0002505 A1 | 1/2007 | Watanabe et al. |
| 2007/0006124 A1 | 1/2007 | Ahmed et al. |
| 2007/0027735 A1 | 2/2007 | Rokos |
| 2007/0067512 A1 | 3/2007 | Donaires et al. |
| 2007/0089434 A1 | 4/2007 | Singh et al. |
| 2007/0089435 A1 | 4/2007 | Singh et al. |
| 2007/0089438 A1 | 4/2007 | Singh et al. |
| 2007/0089439 A1 | 4/2007 | Singh et al. |
| 2007/0089440 A1 | 4/2007 | Singh et al. |
| 2007/0101750 A1 | 5/2007 | Pham et al. |
| 2007/0159978 A1 | 7/2007 | Anglin et al. |
| 2007/0186569 A1 | 8/2007 | Street et al. |
| 2007/0204635 A1 | 9/2007 | Tanaka et al. |
| 2007/0204921 A1 | 9/2007 | Alles |
| 2007/0205296 A1 | 9/2007 | Bell et al. |
| 2007/0229305 A1 | 10/2007 | Bonicatto et al. |
| 2007/0239894 A1 | 10/2007 | Thind et al. |
| 2008/0000241 A1 | 1/2008 | Larsen et al. |
| 2008/0015797 A1 | 1/2008 | Kates |
| 2008/0016888 A1 | 1/2008 | Kates |
| 2008/0051945 A1 | 2/2008 | Kates |
| 2008/0058970 A1 | 3/2008 | Perumalsamy et al. |
| 2008/0078289 A1 | 4/2008 | Sergi et al. |
| 2008/0109185 A1 | 5/2008 | Cheung et al. |
| 2008/0114569 A1 | 5/2008 | Seigel |
| 2008/0121729 A1 | 5/2008 | Gray |
| 2008/0186898 A1 | 8/2008 | Petite |
| 2008/0209925 A1 | 9/2008 | Pham |
| 2008/0216494 A1 | 9/2008 | Pham et al. |
| 2008/0216495 A1 | 9/2008 | Kates |
| 2008/0223051 A1 | 9/2008 | Kates |
| 2008/0234869 A1 | 9/2008 | Yonezawa et al. |
| 2008/0315000 A1 | 12/2008 | Gorthala et al. |
| 2008/0319688 A1 | 12/2008 | Kim |
| 2009/0007777 A1 | 1/2009 | Cohen et al. |
| 2009/0030555 A1 | 1/2009 | Gray |
| 2009/0037142 A1 | 2/2009 | Kates |
| 2009/0038010 A1 | 2/2009 | Ma et al. |
| 2009/0055465 A1 | 2/2009 | DePue et al. |
| 2009/0057424 A1 | 3/2009 | Sullivan et al. |
| 2009/0057428 A1 | 3/2009 | Geadelmann et al. |
| 2009/0068947 A1 | 3/2009 | Petite |
| 2009/0071175 A1 | 3/2009 | Pham |
| 2009/0072985 A1 | 3/2009 | Patel et al. |
| 2009/0093916 A1 | 4/2009 | Parsonnet et al. |
| 2009/0094998 A1 | 4/2009 | McSweeney et al. |
| 2009/0096605 A1 | 4/2009 | Petite et al. |
| 2009/0099699 A1 | 4/2009 | Steinberg et al. |
| 2009/0106601 A1 | 4/2009 | Ngai et al. |
| 2009/0112672 A1 | 4/2009 | Flamig et al. |
| 2009/0119036 A1 | 5/2009 | Jayanth et al. |
| 2009/0125151 A1 | 5/2009 | Steinberg et al. |
| 2009/0140880 A1 | 6/2009 | Flen et al. |
| 2009/0151374 A1 | 6/2009 | Kasahara |
| 2009/0187281 A1 | 7/2009 | Kates |
| 2009/0215424 A1 | 8/2009 | Petite |
| 2009/0229469 A1 | 9/2009 | Campbell et al. |
| 2009/0241570 A1 | 10/2009 | Kuribayashi et al. |
| 2009/0296832 A1 | 12/2009 | Hunt |
| 2009/0324428 A1 | 12/2009 | Tolbert, Jr. et al. |
| 2010/0006042 A1 | 1/2010 | Pitonyak et al. |
| 2010/0011962 A1 | 1/2010 | Totsugi |
| 2010/0017465 A1 | 1/2010 | Brownrigg et al. |
| 2010/0039984 A1 | 2/2010 | Brownrigg |
| 2010/0044449 A1 | 2/2010 | Tessier |
| 2010/0070084 A1 | 3/2010 | Steinberg et al. |
| 2010/0070234 A1 | 3/2010 | Steinberg et al. |
| 2010/0070666 A1 | 3/2010 | Brindle |
| 2010/0078493 A1 | 4/2010 | Alles |
| 2010/0081357 A1 | 4/2010 | Alles |
| 2010/0081372 A1 | 4/2010 | Alles |
| 2010/0102136 A1 | 4/2010 | Hadzidedic et al. |
| 2010/0168924 A1 | 7/2010 | Tessier et al. |
| 2010/0169030 A1 | 7/2010 | Parlos |
| 2010/0179703 A1 | 7/2010 | Singh et al. |
| 2010/0191487 A1 | 7/2010 | Rada et al. |
| 2010/0194582 A1 | 8/2010 | Petite |
| 2010/0214709 A1 | 8/2010 | Hall et al. |
| 2010/0250054 A1 | 9/2010 | Petite |
| 2010/0257410 A1 | 10/2010 | Cottrell et al. |
| 2010/0262299 A1 | 10/2010 | Cheung et al. |
| 2010/0265909 A1 | 10/2010 | Petite et al. |
| 2010/0280667 A1 | 11/2010 | Steinberg |
| 2010/0282857 A1 | 11/2010 | Steinberg |
| 2010/0287489 A1 | 11/2010 | Alles |
| 2010/0305718 A1 | 12/2010 | Clark et al. |
| 2010/0308119 A1 | 12/2010 | Steinberg et al. |
| 2010/0312881 A1 | 12/2010 | Davis et al. |
| 2010/0318227 A1 | 12/2010 | Steinberg et al. |
| 2010/0330985 A1 | 12/2010 | Addy |
| 2011/0004350 A1 | 1/2011 | Cheifetz et al. |
| 2011/0022429 A1 | 1/2011 | Yates et al. |
| 2011/0023045 A1 | 1/2011 | Yates et al. |
| 2011/0023945 A1 | 2/2011 | Hayashi et al. |
| 2011/0040785 A1 | 2/2011 | Steenberg et al. |
| 2011/0042541 A1 | 2/2011 | Spencer et al. |
| 2011/0045454 A1 | 2/2011 | McManus et al. |
| 2011/0054842 A1 | 3/2011 | Kates |
| 2011/0071960 A1 | 3/2011 | Singh |
| 2011/0077896 A1 | 3/2011 | Steinberg et al. |
| 2011/0102159 A1 | 5/2011 | Olson et al. |
| 2011/0103460 A1 | 5/2011 | Bonicatto |
| 2011/0106471 A1 | 5/2011 | Curtis et al. |
| 2011/0118905 A1 | 5/2011 | Mylaraswamy et al. |
| 2011/0121952 A1 | 5/2011 | Bonicatto et al. |
| 2011/0144932 A1 | 6/2011 | Alles |
| 2011/0166828 A1 | 7/2011 | Steinberg et al. |
| 2011/0181438 A1 | 7/2011 | Millstein et al. |
| 2011/0184563 A1 | 7/2011 | Foslien et al. |
| 2011/0185895 A1 | 8/2011 | Freen |
| 2011/0190910 A1 | 8/2011 | Lombard et al. |
| 2011/0212700 A1 | 9/2011 | Petite |
| 2011/0218957 A1 | 9/2011 | Coon et al. |
| 2011/0264324 A1 | 10/2011 | Petite et al. |
| 2011/0264409 A1 | 10/2011 | Jayanth et al. |

(56) References Cited

U.S. PATENT DOCUMENTS

| | | |
|---|---|---|
| 2011/0290893 A1 | 12/2011 | Steinberg |
| 2011/0307103 A1 | 12/2011 | Cheung et al. |
| 2011/0309953 A1 | 12/2011 | Petite et al. |
| 2011/0310929 A1 | 12/2011 | Petite et al. |
| 2011/0315019 A1 | 12/2011 | Lyon et al. |
| 2011/0320050 A1 | 12/2011 | Petite et al. |
| 2012/0005590 A1 | 1/2012 | Lombard et al. |
| 2012/0054242 A1 | 3/2012 | Ferrara et al. |
| 2012/0065783 A1 | 3/2012 | Fadell et al. |
| 2012/0065935 A1 | 3/2012 | Steinberg et al. |
| 2012/0066168 A1 | 3/2012 | Fadell et al. |
| 2012/0075092 A1 | 3/2012 | Petite et al. |
| 2012/0092154 A1 | 4/2012 | Petite |
| 2012/0125559 A1 | 5/2012 | Fadell et al. |
| 2012/0125592 A1 | 5/2012 | Fadell et al. |
| 2012/0126019 A1 | 5/2012 | Warren et al. |
| 2012/0126020 A1 | 5/2012 | Filson et al. |
| 2012/0126021 A1 | 5/2012 | Warren et al. |
| 2012/0128025 A1 | 5/2012 | Huppi et al. |
| 2012/0130546 A1 | 5/2012 | Matas et al. |
| 2012/0130547 A1 | 5/2012 | Fadell et al. |
| 2012/0130548 A1 | 5/2012 | Fadell et al. |
| 2012/0130679 A1 | 5/2012 | Fadell et al. |
| 2012/0131504 A1 | 5/2012 | Fadell et al. |
| 2012/0143528 A1 | 6/2012 | Kates |
| 2012/0179300 A1 | 7/2012 | Warren et al. |
| 2012/0186774 A1 | 7/2012 | Matsuoka et al. |
| 2012/0191257 A1 | 7/2012 | Corcoran et al. |
| 2012/0199660 A1 | 8/2012 | Warren et al. |
| 2012/0203379 A1 | 8/2012 | Sloo et al. |
| 2012/0221150 A1 | 8/2012 | Arensmeier |
| 2012/0229521 A1 | 9/2012 | Hales, IV et al. |
| 2012/0232969 A1 | 9/2012 | Fadell et al. |
| 2012/0233478 A1 | 9/2012 | Mucignat et al. |
| 2012/0239207 A1 | 9/2012 | Fadell et al. |
| 2012/0239221 A1 | 9/2012 | Mighdoll et al. |
| 2012/0245968 A1 | 9/2012 | Beaulieu et al. |
| 2012/0248210 A1 | 10/2012 | Warren et al. |
| 2012/0248211 A1 | 10/2012 | Warren et al. |
| 2012/0260804 A1 | 10/2012 | Kates |
| 2012/0265491 A1 | 10/2012 | Drummy |
| 2012/0265586 A1 | 10/2012 | Mammone |
| 2012/0271673 A1 | 10/2012 | Riley |
| 2012/0291629 A1 | 11/2012 | Tylutki et al. |
| 2012/0318135 A1 | 12/2012 | Hoglund et al. |
| 2012/0318137 A1 | 12/2012 | Ragland et al. |
| 2013/0066479 A1 | 3/2013 | Shetty et al. |
| 2013/0182285 A1 | 7/2013 | Matsuhara et al. |
| 2013/0287063 A1 | 10/2013 | Kates |
| 2014/0000290 A1 | 1/2014 | Kates |
| 2014/0000291 A1 | 1/2014 | Kates |
| 2014/0000292 A1 | 1/2014 | Kates |
| 2014/0000293 A1 | 1/2014 | Kates |
| 2014/0000294 A1 | 1/2014 | Kates |
| 2014/0012422 A1 | 1/2014 | Kates |
| 2014/0074730 A1 | 3/2014 | Arensmeier et al. |
| 2014/0262134 A1 | 9/2014 | Arensmeier et al. |
| 2014/0266755 A1 | 9/2014 | Arensmeier et al. |

FOREIGN PATENT DOCUMENTS

| | | |
|---|---|---|
| CA | 2567264 A1 | 7/2007 |
| CH | 173493 A | 11/1934 |
| CN | 1169619 | 1/1998 |
| CN | 1742427 A | 3/2006 |
| CN | 1922445 A | 2/2007 |
| CN | 101048713 A | 10/2007 |
| CN | 101156033 A | 4/2008 |
| CN | 101270908 A | 9/2008 |
| CN | 101361244 A | 2/2009 |
| CN | 101506600 A | 8/2009 |
| CN | 101802521 A | 8/2010 |
| CN | 101821693 A | 9/2010 |
| DE | 842351 C | 6/1952 |
| DE | 764179 C | 4/1953 |
| DE | 1144461 B | 2/1963 |
| DE | 1403516 A1 | 10/1968 |
| DE | 1403467 A1 | 10/1969 |
| DE | 3118638 A1 | 5/1982 |
| DE | 3133502 A1 | 6/1982 |
| DE | 3422398 A1 | 12/1985 |
| DE | 29723145 U1 | 4/1998 |
| EP | 0060172 A1 | 9/1982 |
| EP | 0085246 A1 | 8/1983 |
| EP | 0124603 A1 | 11/1984 |
| EP | 0254253 A2 | 1/1988 |
| EP | 0346152 A2 | 12/1989 |
| EP | 0351272 A1 | 1/1990 |
| EP | 0351833 A2 | 1/1990 |
| EP | 0355255 A2 | 2/1990 |
| EP | 0398436 A1 | 11/1990 |
| EP | 0410330 A2 | 1/1991 |
| EP | 0419857 A2 | 4/1991 |
| EP | 0432085 A2 | 6/1991 |
| EP | 0453302 A1 | 10/1991 |
| EP | 0479421 A1 | 4/1992 |
| EP | 0557023 A1 | 8/1993 |
| EP | 0579374 A1 | 1/1994 |
| EP | 0660213 A2 | 6/1995 |
| EP | 0747598 A2 | 12/1996 |
| EP | 0877462 A2 | 11/1998 |
| EP | 0982497 A1 | 3/2000 |
| EP | 1008816 A2 | 6/2000 |
| EP | 1087142 A2 | 3/2001 |
| EP | 1087184 A2 | 3/2001 |
| EP | 1138949 A2 | 10/2001 |
| EP | 1139037 A1 | 10/2001 |
| EP | 1187021 A2 | 3/2002 |
| EP | 1209427 A1 | 5/2002 |
| EP | 1241417 A1 | 9/2002 |
| EP | 1245912 A2 | 10/2002 |
| EP | 1245913 A1 | 10/2002 |
| EP | 1435002 A1 | 7/2004 |
| EP | 1487077 A2 | 12/2004 |
| EP | 2180270 A1 | 4/2010 |
| FR | 2472862 A1 | 7/1981 |
| FR | 2582430 A1 | 11/1986 |
| FR | 2589561 A1 | 5/1987 |
| FR | 2628558 A1 | 9/1989 |
| FR | 2660739 A1 | 10/1991 |
| GB | 2062919 A | 5/1981 |
| GB | 2064818 A | 6/1981 |
| GB | 2075774 A | 11/1981 |
| GB | 2116635 A | 9/1983 |
| GB | 2347217 A | 8/2000 |
| JP | 56010639 A | 2/1981 |
| JP | 59145392 A | 8/1984 |
| JP | 61046485 A | 3/1986 |
| JP | 62116844 A | 5/1987 |
| JP | 63061783 A | 3/1988 |
| JP | 63302238 A | 12/1988 |
| JP | 01014554 A | 1/1989 |
| JP | 02110242 A | 4/1990 |
| JP | 02294580 A | 12/1990 |
| JP | 04080578 A | 3/1992 |
| JP | 06058273 A | 3/1994 |
| JP | 08087229 A | 4/1996 |
| JP | 08284842 A | 10/1996 |
| JP | 2000350490 A | 12/2000 |
| JP | 2002155868 A | 5/2002 |
| JP | 2003018883 A | 1/2003 |
| JP | 2003176788 A | 6/2003 |
| JP | 2004316504 A | 11/2004 |
| JP | 2005241089 A | 9/2005 |
| JP | 2005345096 A | 12/2005 |
| JP | 2006046219 A | 2/2006 |
| JP | 2006046519 A | 2/2006 |
| JP | 2009002651 A | 1/2009 |
| JP | 2010048433 A | 3/2010 |
| KR | 10-1998-0036844 A | 8/1998 |
| KR | 1020000000261 | 1/2000 |
| KR | 1020000025265 | 5/2000 |
| KR | 1020020041977 | 6/2002 |
| KR | 20030042857 A | 6/2003 |

(56) References Cited

FOREIGN PATENT DOCUMENTS

| | | |
|---|---|---|
| KR | 1020040021281 | 3/2004 |
| KR | 1020060020353 | 3/2006 |
| RU | 30009 U1 | 6/2003 |
| RU | 55218 U1 | 7/2006 |
| WO | WO-8601262 A1 | 2/1986 |
| WO | WO-8703988 A1 | 7/1987 |
| WO | WO-8705097 A1 | 8/1987 |
| WO | WO-8802527 A1 | 4/1988 |
| WO | WO-8806703 A1 | 9/1988 |
| WO | WO-9718636 A2 | 5/1997 |
| WO | WO-9748161 A1 | 12/1997 |
| WO | WO-9917066 A1 | 4/1999 |
| WO | WO-9965681 A1 | 12/1999 |
| WO | WO-0021047 A1 | 4/2000 |
| WO | WO-0169147 A1 | 9/2001 |
| WO | WO-0214968 A1 | 2/2002 |
| WO | WO-0249178 A2 | 6/2002 |
| WO | WO-02075227 A1 | 9/2002 |
| WO | WO-02/090840 A2 | 11/2002 |
| WO | WO-02/090913 A1 | 11/2002 |
| WO | WO-02090914 A1 | 11/2002 |
| WO | WO-03031996 A1 | 4/2003 |
| WO | WO-03090000 A1 | 10/2003 |
| WO | WO-2004049088 A1 | 6/2004 |
| WO | WO-2005022049 A2 | 3/2005 |
| WO | WO-2005073686 A1 | 8/2005 |
| WO | WO-2005108882 A2 | 11/2005 |
| WO | WO-2006023075 A2 | 3/2006 |
| WO | WO-2006025880 A1 | 3/2006 |
| WO | WO-2006091521 A2 | 8/2006 |
| WO | WO-2008010988 A1 | 1/2008 |
| WO | WO-2008079108 A1 | 7/2008 |
| WO | WO-2008144864 A1 | 12/2008 |
| WO | WO-2009058356 A1 | 5/2009 |
| WO | WO-2010138831 A2 | 12/2010 |
| WO | WO-2011069170 A1 | 6/2011 |
| WO | WO-2012092625 A2 | 7/2012 |

OTHER PUBLICATIONS

Advisory Action and Interview Summary regarding U.S. Appl. No. 13/407,180, dated May 27, 2015.
Final Office Action and Interview Summary regarding U.S. Appl. No. 13/407,180, mailed Mar. 13, 2015.
Final Office Action for U.S. Appl. No. 13/770,123 dated Dec. 22, 2014.
First Chinese Office Action regarding Application No. 201380005300.2, dated Apr. 30, 2015. Translation provided by Unitalen Attorneys at Law.
Haiad et al., "EER & SEER as Predictors of Seasonal Energy Performance", Oct. 2004, Southern California Edison, http://www.doe2.com/download/DEER/SEER%2BProgThermostats/EER-SEER_CASE_ProjectSummary_Oct2004_V6a.pdf.
Interview Summary regarding U.S. Appl. No. 13/269,188, mailed Mar. 18, 2015.
Non-Final Office Action regarding U.S. Appl. No. 13/932,611, dated Jan. 30, 2015.
Notice of Allowance for U.S. Appl. No. 13/836,043 dated Feb. 4, 2015.
Notice of Allowance for related U.S. Appl. No. 13/836,043, dated Oct. 9, 2014.
Notice of Allowance regarding U.S. Appl. No. 13/767,479, dated Mar. 31, 2015.
Notice of Allowance regarding U.S. Appl. No. 13/835,621, dated Mar. 10, 2015.
Notice of Allowance regarding U.S. Appl. No. 13/836,453, mailed Apr. 15, 2015.
Notice of Allowance regarding U.S. Appl. No. 13/835,742, mailed Apr. 17, 2015.
Office Action for U.S. Appl. No. 13/269,188 dated Feb. 10, 2015.
Office Action for U.S. Appl. No. 13/767,479 dated Feb. 6, 2015.
Office Action for Canadian Application No. 2,828,740 dated Jan. 12, 2015.
Office Action for related U.S. Appl. No. 13/269,188, dated Oct. 6, 2014.
Office Action for related U.S. Appl. No. 13/767,479, dated Oct. 21, 2014.
Office Action from U.S. Appl. No. 13/369,067 dated Apr. 3, 2015.
Office Action regarding U.S. Appl. No. 13/770,479, mailed Mar. 16, 2015.
Office Action regarding U.S. Appl. No. 13/770,123, mailed Apr. 2, 2015.
Patent Examination Report for Australian Application No. 2012223466 dated Jan. 6, 2015.
Third Chinese Office Action regarding Application No. 201110349785.X, dated Jan. 30, 2015. Translation provided by Unitalen Attorneys at Law.
U.S. Office Action regarding U.S. Appl. No. 13/269,188, dated May 8, 2015.
U.S. Office Action regarding U.S. Appl. No. 14/212,632, dated May 15, 2015.
U.S. Appl. No. 13/770,123, filed Feb. 19, 2013.
Extended European Search Report regarding European Application No. 08845689.2-1608/2207964, dated Jun. 19, 2015.
Extended European Search Report regarding European Application No. 08848538.8-1608 /2220372, dated Jun. 19, 2015.
Interview Summary regarding U.S. Appl. No. 13/407,180, dated Jun. 11, 2015.
Interview Summary regarding U.S. Appl. No. 13/770,479, dated Jun. 16, 2015.
Notice of Allowance regarding U.S. Appl. No. 13/932,611, dated Jul. 6, 2015.
Applicant-Initiated Interview Summary and Advisory Action regarding U.S. Appl. No. 13/369,067, dated Jul. 23, 2015.
Faramarzi et al., "Performance Evaluation of Rooftop Air Conditioning Units at High Ambient Temperatures," 2004 ACEEE Summer Study on Energy Efficiency in Buildings—http://aceee.org/files/proceedings/2004/data/papers/SSO4_Panel3_Paper05.pdf.
Interview Summary regarding U.S. Appl. No. 13/369,067, dated Jul. 16, 2015.
Restriction Requirement regarding U.S. Appl. No. 14/244,967, dated Jul. 14, 2015.
Notice of Allowance regarding U.S. Appl. No. 12/261,643, mailed Jul. 29, 2015.
Applicant-Initiated Interview Summary regarding U.S. Appl. No. 14/212,632, dated Sep. 2, 2015.
Final Office Action regarding U.S. Appl. No. 13/770,479, dated Sep. 4, 2015.
Notice of Allowance and Interview Summary regarding U.S. Appl. No. 13/269,188, dated Aug. 26, 2015.
Notice of Allowance regarding U.S. Appl. No. 13/369,067, dated Sep. 2, 2015.
Notice of Allowance regarding U.S. Appl. No. 13/407,180, dated Sep. 4, 2015.
Notice of Allowance regarding U.S. Appl. No. 13/770,123, dated Aug. 13, 2015.
Office Action regarding Indian Patent Application No. 733/KOLNP/2009, dated Aug. 12, 2015.
Office Action regarding U.S. Appl. No. 14/209,415, dated Sep. 10, 2015.
Search Report regarding European Patent Application No. 13736303.2-1806, dated Sep. 17, 2015.
First Office Action regarding Chinese Patent Application No. 201280010796.8, dated Sep. 14, 2015. Translation provided by Unitalen Attorneys At Law.
Notice of Allowance regarding U.S. Appl. No. 13/770,123, dated Oct. 1, 2015.
Interview Summary regarding U.S. Appl. No. 13/770,479, dated Nov. 25, 2015.
Office Action and Interview Summary regarding U.S. Appl. No. 14/244,967, dated Oct. 7, 2015.
Office Action regarding Australian Patent Application No. 2013323760, dated Sep. 25, 2015.

(56) References Cited

OTHER PUBLICATIONS

Office Action regarding Chinese Patent Application No. 201380049458.X, dated Nov. 13, 2015. Translation provided by Unitalen Attorneys at Law.
Office Action regarding U.S. Appl. No. 14/212,632, dated Nov. 19, 2015.
Office Action regarding U.S. Appl. No. 14/255,519, dated Nov. 9, 2015.
Search Report regarding European Patent Application No. 08251185.8-1605 / 2040016, dated Dec. 4, 2015.
Interview Summary regarding U.S. Appl. No. 12/054,011, dated Jan. 30, 2013.
Office Action regarding U.S. Appl. No. 14/193,568, dated Nov. 3, 2015.
Office Action regarding Australian Patent Application No. 2015207920, dated Dec. 4, 2013.
Office Action regarding Chinese Patent Application No. 201380005300.2, dated Jan. 4, 2016. Translation provided by Unitalen Attorneys at Law.
Advisory Action regarding U.S. Appl. No. 14/212,632, dated Feb. 9, 2016.
Advisory Action regarding U.S. Appl. No. 14/212,632, dated Mar. 8, 2016.
Office Action regarding European Patent Application No. 08848538.8-1608, dated Feb. 3, 2016.
Office Action regarding U.S. Appl. No. 14/209,415, dated Mar. 10, 2016.
Office Action regarding U.S. Appl. No. 14/244,967, dated Feb. 12, 2016.
Office Action regarding U.S. Appl. No. 14/212,632, dated Apr. 7, 2016.
Office Action regarding U.S. Appl. No. 12/943,626, dated May 4, 2016.
Office Action regarding Australian Patent Application No. 2014229103, dated Apr. 28, 2016.
U.S. Appl. No. 12/261,643, filed Oct. 30, 2008.
U.S. Appl. No. 13/269,188, filed Oct. 7, 2011.
U.S. Appl. No. 13/369,067, filed Feb. 8, 2012.
U.S. Appl. No. 13/407,180, filed Feb. 28, 2012.
U.S. Appl. No. 13/835,742, filed Mar. 15, 2013.
U.S. Appl. No. 13/836,453, filed Mar. 15, 2013.
U.S. Appl. No. 13/932,611, filed Jul. 1, 2013.
U.S. Appl. No. 14/033,604, filed Sep. 23, 2013.
Interview Summary regarding U.S. Appl. No. 14/209,415, dated Jun. 20, 2016.
Office Action regarding U.S. Appl. No. 14/193,568, dated Jun. 1, 2016.
Office Action regarding U.S. Appl. No. 14/080,473, dated Jun. 6, 2016.
Search Report regarding European Patent Application No. 13841699.5, dated Jun. 30, 2016.
Office Action regarding Chinese Patent Application No. 201480016023.X, dated Jun. 22, 2016. Translation provided by Unitalen Attorneys at Law.
Office Action regarding U.S. Appl. No. 14/727,756, dated Aug. 22, 2016.
Advisory Action regarding U.S. Appl. No. 14/193,568, dated Aug. 10, 2016.
Office Action regarding U.S. Appl. No. 14/208,636, dated Aug. 4, 2016.
Office Action regarding U.S. Appl. No. 14/244,967, dated Aug. 29, 2016.
"A Practical Example of a Building's Automatic Control," cited in First Office Action from the Patent Office of the People's Republic of China dated Jun. 29, 2007, regarding Application No. 200510005907.8, including translation by CCPIT Patent and Trademark Law Office.
"Air Conditioning Equipment and Diagnostic Primer," Field Diagnostic Services, Inc., Sep. 9, 2002.
"Manual for Freezing and Air Conditioning Technology," Fan Jili, Liaoning Science and Technology Press, Sep. 1995 (cited in First Office Action issued by the Chinese Patent Office regarding Application No. 200780030810.X dated Dec. 25, 2009).
"Product Performance Introduction of York Company," cited in First Office Action from the Patent Office of the People's Republic of China dated Jun. 29, 2007 regarding Application No. 200510005907.8, including translation by CCPIT Patent and Trademark Law Office.
"Small-type Freezing and Air Conditioning Operation," Chinese State Economy and Trading Committee, China Meteorological Press, Mar. 2003 (cited in First Office Action issued by the Chinese Patent Office regarding Application No. 200780030810.X dated Dec. 25, 2009).
About CABA: CABA eBulletin, http://www.caba.org/aboutus/ebulletin/issue17/domosys.html, 2 pages.
Advanced Utility Metering: Period of Performance, Subcontractor Report, National Renewable Energy Laboratory, Sep. 2003, 59 pages.
Advisory Action Before the Filing of an Appeal Brief regarding U.S. Appl. No. 11/098,575, dated Nov. 16, 2009.
Advisory Action Before the Filing of an Appeal Brief regarding U.S. Appl. No. 11/098,575, dated Sep. 28, 2009.
Advisory Action Before the Filing of an Appeal Brief regarding U.S. Appl. No. 09/977,552, dated Nov. 10, 2005.
Advisory Action from related U.S. Appl. No. 13/784,890 dated Mar. 14, 2014.
Advisory Action regarding U.S. Appl. No. 12/261,643, dated Nov. 22, 2013.
Advisory Action regarding U.S. Appl. No. 11/214,179, dated Aug. 28, 2009.
BChydro, "Power Factor" Guides to Energy Management: The GEM Series, Oct. 1999.
Building Control Unit (BCU) Installation and Operation Manual, Computer Process Controls, Jan. 28, 1998, 141 pages.
Building Environmental Control (BEC) Installation and Operation Manual, Computer Process Controls, Jan. 5, 1998.
Case Studies: Automated Meter Reading and Load Shed System, http://groupalpha.com/CaseStudies2.html, Aug. 23, 2004, 1 page.
Communication from European Patent Office concerning Substantive Examination regarding European Patent Application No. 06790063.9, dated Jun. 6, 2011.
Cost Cutting Techniques Used by the Unscrupulous, http://www.kellyshvac.com/howto.html, Oct. 7, 2004, 3 pages.
Einstein RX-300 Refrigeration Controller Installation and Operation Manual, Computer Process Controls, Apr. 1, 1998, 329 pages.
Election/Restriction Requirement regarding U.S. Appl. No. 09/977,552, dated Jan. 25, 2007.
European Search Report for Application No. EP 12 182 243.1, dated Oct. 29, 2012.
European Search Report for EP 01 30 7547; Feb. 20, 2002; 1 Page.
European Search Report for EP 02 25 0266; May 17, 2002; 3 Pages.
European Search Report for EP 02 72 9050, Jun. 17, 2004, 2 pages.
European Search Report for EP 82306809.3; Apr. 28, 1983; 1 Page.
European Search Report for EP 91 30 3518; Jul. 22, 1991; 1 Page.
European Search Report for EP 93 30 4470; Oct. 26, 1993; 1 Page.
European Search Report for EP 94 30 3484; Apr. 3, 1997; 1 Page.
European Search Report for EP 96 30 4219; Dec. 1, 1998; 2 Pages.
European Search Report for EP 98 30 3525; May 28, 1999; 2 Pages.
European Search Report for EP 99 30 6052; Dec. 28, 1999; 3 Pages.
European Search Report regarding Application No. 04022784.5-2315 / 1500821, dated Aug. 14, 2012.
European Search Report regarding Application No. 07811712.4-1608 / 2069638 PCT/US2007019563, dated Jan. 7, 2014.
European Search Report regarding Application No. EP02729051, dated Feb. 17, 2005.
Examination Report received from Australian Government IP Australia dated Oct. 29, 2009 regarding patent application No. 2008202088.
Examiner Interview regarding U.S. Appl. No. 11/256,641, dated Sep. 16, 2008.
Examiner Interview Summary regarding U.S. Appl. No. 11/394,380, dated Jul. 29, 2010.

(56) References Cited

OTHER PUBLICATIONS

Examiner Interview Summary regarding U.S. Appl. No. 10/940,877, dated Dec. 8, 2008.
Examiner Interview Summary regarding U.S. Appl. No. 10/940,877, dated Mar. 2, 2007.
Examiner Interview Summary regarding U.S. Appl. No. 10/940,877, dated Mar. 25, 2008.
Examiner's Answer from related U.S. Appl. No. 13/784,890 dated Jul. 3, 2014.
Examiner's Answer regarding U.S. Appl. No. 09/977,552, dated Dec. 17, 2009.
Examiner's First Report on Australian Patent Application No. 2002259066, dated Mar. 1, 2006.
Examiner's First Report on Australian Patent Application No. 2007292917 dated Jan. 10, 2012.
Examiner's First Report on Australian Patent Application No. 2008319275, dated Jan. 31, 2011.
Examiner's Report No. 2 regarding Australian Patent Application No. 2008325240, dated Mar. 5, 2012.
Examiner-Initiated Interview Summary regarding U.S. Appl. No. 11/214,179, dated Dec. 11, 2009.
Extended European Search Report regarding Application No. 07796879.0-1602 / 2041501 PCT/US2007016135, dated Jul. 14, 2014.
Final Office Action for U.S. Appl. No. 11/850,846, mailed Aug. 13, 2012.
Final Office Action from related U.S. Appl. No. 13/269,188 dated May 23, 2013; 11 pages.
Final Office Action from related U.S. Appl. No. 13/369,067 dated May 1, 2014; 19 pages.
Final Office Action from related U.S. Appl. No. 13/767,479 dated Mar. 14, 2014; 6 pages.
Final Office Action from related U.S. Appl. No. 13/836,043 dated Mar. 12, 2014; 5 pages.
Final Office Action regarding U.S. Appl. No. 11/497,579, dated May 14, 2010.
Final Office Action regarding U.S. Appl. No. 11/497,644, dated Dec. 22, 2010.
Final Office Action regarding U.S. Appl. No. 11/850,846, mailed Jan. 17, 2014.
Final Office Action regarding U.S. Appl. No. 13/770,123, dated Nov. 15, 2013.
Final Office Action regarding U.S. Appl. No. 13/932,611, mailed May 28, 2014.
Final Office Action regarding U.S. Appl. No. 11/214,179, dated Jul. 21, 2011.
Final Office Action regarding U.S. Appl. No. 09/977,552, dated Oct. 22, 2008.
Final Office Action regarding U.S. Appl. No. 09/977,552, dated Apr. 26, 2004.
Final Office Action regarding U.S. Appl. No. 09/977,552, dated May 13, 2005.
Final Office Action regarding U.S. Appl. No. 09/977,552, dated Jun. 18, 2003.
Final Office Action regarding U.S. Appl. No. 09/977,552, dated Jul. 23, 2007.
Final Office Action regarding U.S. Appl. No. 10/061,964, dated Mar. 8, 2004.
Final Office Action regarding U.S. Appl. No. 10/940,877, dated Nov. 13, 2007.
Final Office Action regarding U.S. Appl. No. 10/940,877, dated Apr. 27, 2009.
Final Office Action regarding U.S. Appl. No. 10/940,877, dated May 2, 2006.
Final Office Action regarding U.S. Appl. No. 11/098,575, dated Jun. 17, 2010.
Final Office Action regarding U.S. Appl. No. 11/214,179, dated May 29, 2009.
Final Office Action regarding U.S. Appl. No. 11/256,641, dated Feb. 2, 2009.
Final Office Action regarding U.S. Appl. No. 11/337,918, dated Feb. 17, 2011.
Final Office action regarding U.S. Appl. No. 11/337,918, dated Feb. 4, 2010.
Final Office Action regarding U.S. Appl. No. 12/261,643, dated Jun. 27, 2012.
Final Office Action regarding U.S. Appl. No. 12/261,643, dated Sep. 16, 2013.
Final Office Action regarding U.S. Appl. No. 12/261,643, dated Jul. 7, 2011.
First Examination Communication regarding European Application No. EP02729051.9, dated Dec. 23, 2005.
First Examination Report regarding Australian Patent Application No. 2010319488, dated Jan. 10, 2013.
First Examination Report regarding Australian Patent Application No. 2012241185, dated Sep. 27, 2013.
First Office Action from the Patent Office of the People's Republic of China dated Jun. 8, 2007, Application No. 200480027753.6 and Translation provided by CCPIT.
First Office Action from the Patent Office of the People's Republic of China regarding Application No. 200510005907.8, dated Jun. 29, 2007.
First Office Action from the State Intellectual Property Office of the People's Republic of China regarding Chinese Patent Application No. 200890100287.3, issued Oct. 25, 2010. Translation provided by Unitalen Attorneys at Law.
First Office Action issued by the Chinese Patent Office on May 30, 2008 regarding Application No. 200580013451.8, 8 Pages.
First Office Action issued by the Chinese Patent Office regarding Application No. 200780030810.X dated Dec. 25, 2009.
First Office Action received from the Chinese Patent Office dated Feb. 2, 2007 regarding Application No. 200480011463.2, translated by CCPIT Patent and Trademark Law Office.
First Office Action regarding Canadian Patent Application No. 2,777,349, dated Jul. 19, 2013.
First Office Action regarding Chinese Patent Application No. 200780032977.X, dated Sep. 27, 2010. English translation provided by Unitalen Attorneys at Law.
First Office Action regarding Chinese Patent Application No. 200910211779.0, dated May 3, 2012. English translation provided by Unitalen Attorneys at Law.
First Office Action regarding Chinese Patent Application No. 201010117657.8, dated Dec. 29, 2010. English translation provided by Unitalen Attorneys at Law.
First Office Action regarding Chinese Patent Application No. 201110349785.X, dated Nov. 21, 2013, and Search Report. English translation provided by Unitalen Attorneys at Law.
First Official Report regarding Australian Patent Application No. 2007214381, dated Dec. 12, 2008.
Flow & Level Measurement: Mass Flowmeters, http://www.omega.com/literature/transactions/volume4/T9904-10-MASS.html, 2001, 19 pages.
Fourth Office Action from the State Intellectual Property Office of People's Republic of China regarding Chinese Patent Applicaiton No. 200510005907.8, dated Dec. 8, 2011. Translation provided by Unitalen Attorneys at Law.
Fourth Office Action regarding Chinese Patent Application No. 200910211779.0, dated Jan. 6, 2014. English translation provided by Unitalen Attorneys at Law.
Frequently Asked Questions, http://www.lipaedge.com/faq.asp, Copyright © 2001, 5 pages.
Home Comfort Zones, MyTemp Room-by-Room Zone Control, Nov. 2009.
Home Comfort Zones, MyTemp User Manual v4.3, May 2008.
Home Comfort Zones, Save Energy with MyTemp™ Zone Control, Dec. 2009.
Home Comfort Zones, Smart Controller™ MyTemp™ Room by Room Temperature Control and Energy Management, User Manual, Aug. 2007.
Honeywell, A7075A1000 HVAC Service Assistant, 2001.
Honeywell, Advanced Portable A/C Diagnostics, The HVAC Service Assistant, 2003.

(56) References Cited

OTHER PUBLICATIONS

Honeywell, Alerts and Delta T Diagnostics with Prestige® 2.0 IAQ Thermostat, 69-2678-02, Sep. 2011.
Honeywell, Excel 5000® System, Excel Building Supervisor—Integrated, 74-2034, Copyright © 1994, Rev. Nov. 1994, 12 pages.
Honeywell, Excel 5000® System, Excel Building Supervisor, 74-2033-1, Copyright © 1996, Rev. Jun. 1996, 12 pages.
Honeywell, HVAC Service Assistant, TRGpro Palm™ OS Interface and HVAC Service Assistant A7075A1000, 2002.
Honeywell, Prestige System Installation Guide, THX9321/9421 Prestige® IAQ and RF EIM, 64-2490-03, Jul. 2011.
Honeywell, RedLINK™ Wireless Comfort Systems brochure, 50-1194, Sep. 2011.
HVAC Service Assistant, ACRx Efficiency and Capacity Estimating Technology, Field Diagnostics, 2004.
International Preliminary Examination Report regarding PCT/US02/13456, dated Sep. 15, 2003.
International Preliminary Report on Patentability for International Application No. PCT/US2008/009618, dated Mar. 24, 2010.
International Preliminary Report on Patentability for International Application No. PCT/US2008/012362, dated May 4, 2010.
International Preliminary Report on Patentability for International Application No. PCT/US2008/012364, dated May 4, 2010.
International Preliminary Report on Patentability regarding Application No. PCT/US2010/056315, mailed May 24, 2012.
International Preliminary Report on Patentability regarding International Application No. PCT/US2007/019563 dated Mar. 10, 2009.
International Search Report and Written Opinion of the International Searching Authority regarding International Application No. PCT/US06/33702, dated Sep. 26, 2007.
International Search Report for International Application No. PCT/US07/019563, dated Jan. 15, 2008, 3 Pages.
International Search Report for International Application No. PCT/US2005/11154, dated Oct. 19, 2005.
International Search Report for International Application No. PCT/US2007/016135 dated Oct. 22, 2007.
International Search Report for International Application No. PCT/US2008/012362, dated Feb. 12, 2009.
International Search Report for International Application No. PCT/US2008/012364 dated Mar. 13, 2009.
International Search Report for PCT/US02/13459; ISA/US; date mailed Sep. 19, 2002.
International Search Report for PCT/US2012/026973, Sep. 3, 2012, 5 pages.
International Search Report for PCT/US2013/061389, Jan. 22, 2014, 7 pages.
International Search Report from PCT /US2008/060900, Aug. 4, 2008, 6 pages.
International Search Report from related PCT Application No. PCT/US2014/028074 mailed Jun. 19, 2014.
International Search Report regarding Application No. PCT/US2010/036601, mailed Dec. 29, 2010.
International Search Report regarding Application No. PCT/US2010/056315, mailed Jun. 28, 2011.
International Search Report regarding Application No. PCT/US2013/021161, mailed May 8, 2013.
International Search Report, Int'l. App. No. PCT/US 06/05917, dated Sep. 26, 2007.
International Search Report, International Application No. PCT/US02/13456, dated Aug. 22, 2002, 2 Pages.
International Search Report, International Application No. PCT/US04/13384; Dated Aug. 1, 2004; 1 Page.
International Search Report, International Application No. PCT/US2004/027654, dated Aug. 25, 2004, 4 Pages.
International Search Report, International Application No. PCT/US2006/040964, dated Feb. 15, 2007, 2 Pages.
International Search Report; International Application No. PCT/IB96/01435; May 23, 1997; 1 Page.
International Search Report; International Application No. PCT/US98/18710; Jan. 26, 1999; 1 Page.
Interview Summary from related U.S. Appl. No. 12/054,011 dated Jan. 30, 2012.
Interview Summary regarding U.S. Appl. No. 11/497,644, dated May 4, 2010.
Interview Summary regarding U.S. Appl. No. 11/098,582, dated Apr. 27, 2010.
Interview Summary regarding U.S. Appl. No. 11/214,179, dated Jan. 30, 2009.
Interview Summary regarding U.S. Appl. No. 11/497,579, dated Jul. 15, 2010.
Issue Notification regarding U.S. Appl. No. 11/214,179, dated Mar. 14, 2012.
Jeffus, Larry, "Refrigeration and Air Conditioning: An Introduction to HVAC/R," Appendix C, pp. 1060-1063, Copyright 2004.
Jeffus, Larry, "Refrigeration and Air Conditioning: An Introduction to HVAC/R," Section II, Chapter 4, pp. 176-201, Copyright 2004.
Jeffus, Larry, "Refrigeration and Air Conditioning: An Introduction to HVAC/R," Section II, Chapter 5, pp. 239-245, Copyright 2004.
Jeffus, Larry, "Refrigeration and Air Conditioning: An Introduction to HVAC/R," Section II, Chapter 6, p. 322, Copyright 2004.
Jeffus, Larry, "Refrigeration and Air Conditioning: An Introduction to HVAC/R," Section IV, Chapter 9, pp. 494-504, Copyright 2004.
K. A. Manske et al.; Evaporative Condenser Control in Industrial Refrigeration Systems; University of Wisconsin—Madison, Mechanical Engineering Department; International Journal of Refrigeration, vol. 24, No. 7; pp. 676-691; 2001, 21 pages.
Li et al., "Development, Evaluation, and Demonstration of a Virtual Refrigerant Charge Sensor," Jan. 2009, HVAC&R Research, Oct. 27, 2008, 21 pages.
Liao et al., A Correlation of Optimal Heat Rejection Pressures in Transcritical Carbon Dioxide Cycles, Applied Thermal Engineering 20 (2000), Jul. 25, 1999, 831-841.
LIPA Launches Free, First-in-Nation Internet-Based Air Conditioner Control Program to Help LIPA and Its Customers Conserve Electricity & Save Money, Apr. 19, 2001, http://www.lipower.org/newscmter/pr/2001/april19_01.html, 3 pages.
Low-Cost Multi-Service Home Gateway Creates New Business Opportunities, Coactive Networks, Copyright 1998-1999, 7 pages.
Nickles, Donald, "Broadband Communications Over Power Transmission Lines," A Guest Lecture From the Dr. Shreekanth Mandaynam Engineering Frontiers Lecture Series, May 5, 2004, 21 pages.
Non Final Office Action for related U.S. Appl. No. 13/369,067 dated Aug. 12, 2014.
Non Final Office Action for related U.S. Appl. No. 13/835,621 dated Aug. 8, 2014.
Non Final Office Action from related U.S. Appl. No. 13/269,188 dated Aug. 14, 2012; 9 pages.
Non Final Office Action from related U.S. Appl. No. 13/269,188 dated Oct. 4, 2013; 11 pages.
Non Final Office Action from related U.S. Appl. No. 13/269,188 dated Feb. 20, 2014; 9 pages.
Non Final Office Action from related U.S. Appl. No. 13/269,188 dated Jul. 17, 2014; 10 pages.
Non Final Office Action from related U.S. Appl. No. 13/369,067 dated Jan. 16, 2014; 16 pages.
Non Final Office Action from related U.S. Appl. No. 13/767,479 dated Oct. 24, 2013; 8 pages.
Non Final Office Action from related U.S. Appl. No. 13/767,479 dated Jul. 23, 2014; 9 pages.
Non Final Office Action from related U.S. Appl. No. 13/835,621 dated Oct. 30, 2013; 8 pages.
Non Final Office Action from related U.S. Appl. No. 13/835,621 dated Apr. 2, 2014; 11 pages.
Non Final Office Action from related U.S. Appl. No. 13/835,742 dated Oct. 7, 2013; 9 pages.
Non Final Office Action from related U.S. Appl. No. 13/835,810 dated Nov. 15, 2013; 9 pages.
Non Final Office Action from related U.S. Appl. No. 13/836,043 dated Oct. 23, 2013; 8 pages.
Non Final Office Action from related U.S. Appl. No. 13/836,043 dated Jul. 11, 2014; 5 pages.

(56) References Cited

OTHER PUBLICATIONS

Non Final Office Action from related U.S. Appl. No. 13/836,244 dated Oct. 15, 2013; 11 pages.
Non Final Office Action from related U.S. Appl. No. 13/836,244 dated Feb. 20, 2014; 10 pages.
Non Final Office Action from related U.S. Appl. No. 13/836,453 dated Aug. 20, 2013; 8 pages.
Non-Final Office Action for U.S. Appl. No. 11/098,575 dated Jan. 27, 2010.
Non-Final Office Action for U.S. Appl. No. 11/776,879, dated Mar. 16, 2012.
Non-Final Office Action for U.S. Appl. No. 12/685,375, mailed Aug. 6, 2012.
Non-Final Office Action for U.S. Appl. No. 13/030,549, dated Nov. 5, 2012.
Non-Final Office Action in U.S. Appl. No. 11/850,846, mailed May 24, 2013.
Non-Final Office Action in U.S. Appl. No. 13/784,890, mailed Jun. 11, 2013.
Non-Final Office Action in U.S. Appl. No. 12/685,375, mailed Jan. 19, 2012.
Non-Final office Action regarding U.S. Appl. No. 11/850,846, dated Apr. 24, 2012.
Non-Final Office Action regarding U.S. Appl. No. 13/770,123, dated Jul. 3, 2013.
Non-Final Office Action regarding U.S. Appl. No. 13/932,611, mailed Nov. 25, 2013.
Non-Final Office Action regarding U.S. Appl. No. 11/214,179, dated Jan. 24, 2011.
Non-Final Office Action regarding U.S. Appl. No. 11/214,179, dated Nov. 5, 2008.
Non-Final Office Action regarding U.S. Appl. No. 11/214,179, dated Jun. 8, 2010.
Non-Final Office Action regarding U.S. Appl. No. 12/261,643, dated Jan. 27, 2011.
Non-Final Office Action regarding U.S. Appl. No. 12/261,643, dated Mar. 12, 2013.
Non-Final Office Action regarding U.S. Appl. No. 12/943,626, dated Dec. 20, 2012.
Non-Final Office Action regarding U.S. Appl. No. 12/955,355, dated Sep. 11, 2012.
Non-Final Office Action regarding U.S. Appl. No. 13/176,021, dated May 8, 2012.
Non-Final Office Action regarding U.S. Appl. No. 13/435,543, dated Jun. 21, 2012.
Non-Final Office Action regarding U.S. Appl. No. 13/770,123, dated Jun. 11, 2014.
Non-Final Office Action regarding U.S. Appl. No. 13/770,479, dated Jan. 16, 2014.
Notice of Allowance and Fee(s) Due regarding U.S. Appl. No. 12/789,562, dated Oct. 26, 2012.
Notice of Allowance and Fees Due and Notice of Allowability regarding U.S. Appl. No. 11/098,582, dated Feb. 24, 2009.
Notice of Allowance and Fees Due and Notice of Allowability regarding U.S. Appl. No. 11/098,582, dated Sep. 24, 2010.
Notice of Allowance and Fees Due and Notice of Allowability regarding U.S. Appl. No. 11/256,641, dated May 19, 2009.
Notice of Allowance and Fees Due regarding U.S. Appl. No. 12/261,643, dated Jun. 23, 2014.
Notice of Allowance and Fees Due regarding U.S. Appl. No. 12/943,626, dated Jun. 19, 2014.
Notice of Allowance and Fees Due regarding U.S. Appl. No. 13/737,566, dated Jun. 18, 2014.
Notice of Allowance and Fees Due regarding U.S. Appl. No. 13/737,566, dated Sep. 24, 2014.
Notice of Allowance and Fees Due, Interview Summary and Notice of Allowability regarding U.S. Appl. No. 11/214,179, dated Nov. 23, 2011.
Notice of Allowance and Notice of Allowability regarding U.S. Appl. No. 10/286,419, dated Dec. 2, 2004.
Notice of Allowance and Notice of Allowability regarding U.S. Appl. No. 10/675,137, dated Dec. 16, 2005.
Notice of Allowance dated Dec. 21, 2007 from Related U.S. Appl. No. 11/417,609.
Notice of Allowance dated Dec. 3, 2007 from Related U.S. Appl. No. 11/130,562.
Notice of Allowance dated Feb. 12, 2007 from Related U.S. Appl. No. 11/130,871 (Kates).
Notice of Allowance dated Jul. 13, 2006 from Related U.S. Appl. No. 11/130,601 (Kates).
Notice of Allowance dated Jul. 25, 2007 from Related U.S. Appl. No. 10/916,223 (Kates).
Notice of Allowance dated Jun. 11, 2007 from Related U.S. Appl. No. 10/916,222.
Notice of Allowance dated May 29, 2007 from Related U.S. Appl. No. 11/130,569 (Kates).
Notice of Allowance dated Nov. 3, 2008 from Related U.S. Appl. No. 11/417,701.
Notice of Allowance dated Oct. 26, 2007 from Related U.S. Appl. No. 10/916,223.
Notice of Allowance for U.S. Appl. No. 13/835,742 dated Dec. 24, 2014.
Notice of Allowance for U.S. Appl. No. 13/835,810 date Jan. 2, 2015.
Notice of Allowance for U.S. Appl. No. 13/836,453 dated Dec. 24, 2014.
Notice of Allowance for related U.S. Appl. No. 13/835,810 dated Aug. 5, 2014.
Notice of Allowance for U.S. Appl. No. 10/698,048, dated Sep. 1, 2005.
Notice of Allowance from related U.S. Appl. No. 13/835,742 dated Jan. 31, 2014; 7 pages.
Notice of Allowance from related U.S. Appl. No. 13/835,742 dated Jun. 2, 2014; 8 pages.
Notice of Allowance from related U.S. Appl. No. 13/835,810 dated Mar. 20, 2014; 9 pages.
Notice of Allowance from related U.S. Appl. No. 13/836,453 dated Jan. 14, 2014; 8 pages.
Notice of Allowance from related U.S. Appl. No. 13/836,453 dated Apr. 21, 2014; 8 pages.
Notice of Allowance from related U.S. Appl. No. 13/836,453 dated Aug. 4, 2014.
Notice of Allowance from related U.S. Appl. No. 13/836,244 dated Jul. 2, 2014; 8 pages.
Notice of Allowance regarding U.S. Appl. No. 10/061,964, dated Jul. 19, 2004.
Notice of Allowance regarding U.S. Appl. No. 10/940,877, dated Sep. 4, 2009.
Notice of Allowance regarding U.S. Appl. No. 11/776,879, dated Jul. 9, 2012.
Notice of Allowance regarding U.S. Appl. No. 12/261,677, dated Dec. 15, 2011.
Notice of Allowance regarding U.S. Appl. No. 12/685,424, dated Apr. 25, 2011.
Notice of Allowance regarding U.S. Appl. No. 13/303,286, dated Jul. 19, 2012.
Notice of Panel Decision from Pre-Appeal Brief Review regarding U.S. Appl. No. 09/977,552, dated Aug. 4, 2009.
Notification of First Office Action from the State Intellectual Property Office of People's Republic of China regarding Chinese Patent Application No. 200880122964.6, dated Nov. 5, 2012. Translation provided by Unitalen Attorneys at Law.
Office Action Communication regarding U.S. Appl. No. 09/977,552, dated Apr. 18, 2007.
Office Action dated Apr. 19, 2006 from Related U.S. Appl. No. 10/916,223 (Kates).
Office Action dated Aug. 17, 2007 from Related U.S. Appl. No. 11/417,609.
Office Action dated Aug. 17, 2007 from Related U.S. Appl. No. 11/417,701.
Office Action dated Aug. 21, 2007 from Related U.S. Appl. No. 11/417,557.

(56) References Cited

OTHER PUBLICATIONS

Office Action dated Feb. 1, 2007 from Related U.S. Appl. No. 11/130,562 (Kates).
Office Action dated Feb. 13, 2009 from Related U.S. Appl. No. 12/033,765.
Office Action dated Feb. 13, 2009 from Related U.S. Appl. No. 12/050,821.
Office Action dated Feb. 15, 2008 from Related U.S. Appl. No. 11/417,557.
Office Action dated Feb. 3, 2009 from Related U.S. Appl. No. 11/866,295.
Office Action dated Jan. 18, 2006 from Related U.S. Appl. No. 11/130,601 (Kates).
Office Action dated Jan. 18, 2006 from Related U.S. Appl. No. 11/130,871 (Kates).
Office Action dated Jan. 23, 2007 from Related U.S. Appl. No. 10/916,222.
Office Action dated Jan. 6, 2006 from Related U.S. Appl. No. 11/130,562 (Kates).
Office Action dated Jan. 6, 2006 from Related U.S. Appl. No. 10/916,222.
Office Action dated Jul. 1, 2008 from Related U.S. Appl. No. 11/927,425.
Office Action dated Jul. 11, 2006 from Related U.S. Appl. No. 11/130,562 (Kates).
Office Action dated Jul. 11, 2006 from Related U.S. Appl. No. 10/916,222.
Office Action dated Jul. 11, 2007 from Related U.S. Appl. No. 11/417,609 (Kates).
Office Action dated Jul. 11, 2007 from Related U.S. Appl. No. 11/417,701 (Kates).
Office Action dated Jul. 16, 2008 from Related U.S. Appl. No. 11/417,701.
Office Action dated Jul. 24, 2008 from Related U.S. Appl. No. 11/417,557.
Office Action dated Jul. 27, 2006 from Related U.S. Appl. No. 11/130,871 (Kates).
Office Action dated Jun. 17, 2009 from Related U.S. Appl. No. 12/033,765.
Office Action dated Jun. 19, 2009 from Related U.S. Appl. No. 11/866,295.
Office Action dated Jun. 22, 2009 from Related U.S. Appl. No. 12/050,821.
Office Action dated Jun. 27, 2007 from Related U.S. Appl. No. 11/417,557 (Kates).
Office Action dated Mar. 30, 2006 from Related U.S. Appl. No. 11/130,569 (Kates).
Office Action dated May 4, 2005 from Related U.S. Appl. No. 10/916,223 (Kates).
Office Action dated May 6, 2009 from Related U.S. Appl. No. 11/830,729.
Office Action dated Nov. 14, 2006 from Related U.S. Appl. No. 11/130,569 (Kates).
Office Action dated Nov. 16, 2006 from Related U.S. Appl. No. 10/916,223 (Kates).
Office Action dated Nov. 8, 2005 from Related U.S. Appl. No. 10/916,222.
Office Action dated Nov. 9, 2005 from Related U.S. Appl. No. 11/130,562 (Kates).
Office Action dated Nov. 9, 2005 from Related U.S. Appl. No. 11/130,601 (Kates).
Office Action dated Nov. 9, 2005 from Related U.S. Appl. No. 11/130,871 (Kates).
Office Action dated Oct. 27, 2005 from Related U.S. Appl. No. 10/916,223 (Kates).
Office Action dated Sep. 18, 2007 from Related U.S. Appl. No. 11/130,562.
Office Action for U.S. Appl. No. 13/835,621 dated Dec. 29, 2014.
Office Action for U.S. Appl. No. 11/394,380, dated Jan. 6, 2009.
Office Action for U.S. Appl. No. 11/497,579, dated Oct. 27, 2009.
Office Action for U.S. Appl. No. 11/497,644, dated Dec. 19, 2008.
Office Action for U.S. Appl. No. 11/497,644, dated Jul. 10, 2009.
Office Action regarding U.S. Appl. No. 10/286,419, dated Jun. 10, 2004.
Office Action regarding U.S. Appl. No. 11/098,575, dated Jan. 29, 2009.
Office Action regarding U.S. Appl. No. 11/098,575, dated Mar. 26, 2008.
Office Action regarding U.S. Appl. No. 11/098,575, dated Jul. 13, 2009.
Office Action regarding U.S. Appl. No. 11/098,575, dated Sep. 9, 2008.
Office Action regarding U.S. Appl. No. 11/120,166, dated Oct. 2, 2006.
Office Action regarding U.S. Appl. No. 11/120,166, dated Oct. 2, 2007.
Office Action regarding U.S. Appl. No. 11/120,166, dated Dec. 15, 2008.
Office Action regarding U.S. Appl. No. 11/120,166, dated Feb. 17, 2010.
Office Action regarding U.S. Appl. No. 11/120,166, dated Apr. 12, 2007.
Office Action regarding U.S. Appl. No. 11/120,166, dated Jun. 5, 2008.
Office Action regarding U.S. Appl. No. 11/120,166, dated Jul. 20, 2009.
Office Action regarding U.S. Appl. No. 11/394,380, dated Sep. 25, 2009.
Office Action regarding U.S. Appl. No. 11/497,644, dated Jan. 29, 2010.
Office Action regarding U.S. Appl. No. 11/497,644, dated Jun. 14, 2010.
Office Action regarding U.S. Appl. No. 09/977,552, dated Jan. 11, 2008.
Office Action regarding U.S. Appl. No. 09/977,552, dated Jan. 14, 2003.
Office Action regarding U.S. Appl. No. 09/977,552, dated Oct. 18, 2004.
Office Action regarding U.S. Appl. No. 09/977,552, dated Dec. 3, 2003.
Office Action regarding U.S. Appl. No. 09/977,552, dated Jul. 12, 2006.
Office Action regarding U.S. Appl. No. 10/061,964, dated Oct. 3, 2003.
Office Action regarding U.S. Appl. No. 10/675,137, dated Feb. 4, 2005.
Office Action regarding U.S. Appl. No. 10/675,137, dated Jun. 29, 2005.
Office Action regarding U.S. Appl. No. 10/675,137, dated Sep. 7, 2004.
Office Action regarding U.S. Appl. No. 10/698,048, dated Mar. 21, 2005.
Office Action regarding U.S. Appl. No. 10/940,877, dated Oct. 27, 2006.
Office Action regarding U.S. Appl. No. 10/940,877, dated Nov. 14, 2005.
Office Action regarding U.S. Appl. No. 10/940,877, dated Dec. 8, 2008.
Office Action regarding U.S. Appl. No. 10/940,877, dated May 21, 2007.
Office Action regarding U.S. Appl. No. 10/940,877, dated Jun. 5, 2008.
Office Action regarding U.S. Appl. No. 11/098,582 dated Mar. 3, 2010.
Office Action regarding U.S. Appl. No. 11/098,582, dated Jul. 7, 2008.
Office Action regarding U.S. Appl. No. 11/098,582, dated Aug. 4, 2009.
Office Action regarding U.S. Appl. No. 11/098,582, dated Sep. 21, 2007.
Office Action regarding U.S. Appl. No. 11/256,641, dated Apr. 29, 2008.

(56) References Cited

OTHER PUBLICATIONS

Office Action regarding U.S. Appl. No. 11/337,918, dated Mar. 25, 2008.
Office Action regarding U.S. Appl. No. 11/337,918, dated Aug. 17, 2009.
Office Action regarding U.S. Appl. No. 11/337,918, dated Oct. 28, 2008.
Office Action regarding U.S. Appl. No. 11/776,879, dated Sep. 17, 2010.
Office Action regarding U.S. Appl. No. 11/850,846, dated Aug. 13, 2010.
Office Action regarding U.S. Appl. No. 12/261,643, dated Nov. 2, 2011.
Office Action regarding U.S. Appl. No. 12/261,643, dated Feb. 15, 2012.
Office Action regarding U.S. Appl. No. 12/261,677, dated Aug. 4, 2011.
Office Action regarding U.S. Appl. No. 13/303,286, dated Mar. 26, 2012.
Office Action regarding U.S. Appl. No. 13/737,566, dated Dec. 20, 2013.
Official Action regarding Australian Patent Application No. 2008325240, dated Jan. 19, 2011.
Palani, M. et al, Monitoring the Performance of a Residential Central Air Conditioner under Degraded Conditions on a Test Bench, ESL-TR-92/05-05, May 1992.
Palani, M. et al, The Effect of Reducted Evaporator Air Flow on the Performance of a Residential Central Air Conditioner, ESL-HH-92-05-04, Energy Systems Laboratory, Mechanical Engineering Department, Texas A&M University, Eighth Symposium on Improving Building System in Hot and Humid Climates, May 13-14, 1992.
Patent Examination Report for Austrialian Application No. 2012223466 dated Jan. 6, 2015.
Patent Examination Report No. 3 regarding Australian Patent Application No. 2008325240, dated Jul. 19, 2012.
Pin, C. et al., "Predictive Models as Means to Quantify the Interactions of Spoilage Organisms," International Journal of Food Microbiology, vol. 41, No. 1, 1998, pp. 59-72, XP-002285119.
Record of Oral Hearing regarding U.S. Appl. No. 09/977,552, dated Nov. 29, 2012.
Refrigeration Monitor and Case Control Installation and Operation Manual, Computer Process Controls, Aug. 12, 1999.
Reh, F. John, "Cost Benefit Analysis", http://management.about.com/cs/money/a/CostBenefit.htm, Dec. 8, 2003.
Response to Rule 312 Communication regarding U.S. Appl. No. 09/977,552, dated Oct. 31, 2003.
Restriction from related U.S. Appl. No. 13/269,188 dated Apr. 9, 2013; 5 pages.
Restriction Requirement regarding U.S. Appl. No. 10/940,877, dated Jul. 25, 2005.
Restriction Requirement regarding U.S. Appl. No. 11/214,179, dated Feb. 2, 2010.
Second Examination Communication regarding European Application No. EP02729051.9, dated Jul. 3, 2006.
Second Office action issued by the Chinese Patent Office dated Jun. 19, 2009 regarding Application No. 200510005907.8, translation provided by CCPIT Patent and Trademark Law Office.
Second Office Action issued by the Chinese Patent Office on Mar. 6, 2009 regarding Application No. 200580013451.8, 7 Pages.
Second Office Action received from the Chinese Patent Office dated Jun. 26, 2009 regarding Application No. 200480011463.2, translated by CCPIT Patent and Trademark Law Office.
Second Office Action regarding Chinese Patent Application No. 200780030810X, dated Aug. 4, 2010. English translation provided by Unitalen Attorneys at Law.
Second Office Action regarding Chinese Patent Application No. 200890100287.3, dated Jan. 27, 2011. English translation provided by Unitalen Attorneys at Law.
Second Office Action regarding Chinese Patent Application No. 200910211779.0, dated Feb. 4, 2013. English translation provided by Unitalen Attorneys at Law.
Second Official Report regarding Australian Patent Application No. 2007214381, dated Oct. 30, 2009.
Supplementary European Search Report for EP 02 73 1544, Jun. 18, 2004, 2 Pages.
Supplementary European Search Report regarding Application No. EP 07 81 1712, dated Jan. 7, 2014.
Supplementary European Search Report regarding Application No. PCT/US2006/005917, dated Nov. 23, 2009.
Supplementary European Search Report regarding European Application No. EP06790063, dated Jun. 15, 2010.
Tamarkin, Tom D., "Automatic Meter Reading," Public Power magazine, vol. 50, No. 5, Sep.-Oct. 1992, http://www.energycite.com/news/amr.html, 6 pages.
Texas Instruments, Inc. Mechanical Data for "PT (S-PQFP-G48) Plastic Quad Flatpack," Revised Dec. 1996, 2 pages.
Texas Instruments, Inc., Product catalog for "TRF690 1 Single-Chip RF Transceiver," Copyright 2001-2003, Revised Oct. 2003, 27 pages.
The Honeywell HVAC Service Assistant, A Tool for Reducing Electrical Power Demand and Energy Consumption, Field Diagnostics, 2003.
The International Search Report regarding International Application No. PCT/US2007/019563, dated Jan. 15, 2008.
The LS2000 Energy Management System, User Guide, http://www.surfnetworks.com/htmlmanuals/IonWorksEnergyManagement-LS2000-Load-Shed -System-by-Surf-Networks,Inc.html, Sep. 2004, 20 pages.
Third Office Action issued by the Chinese Patent Office on Jun. 19, 2009 regarding Application No. 200580013451.8, translated by CCPIT Patent and Trademark Law Office.
Third Office Action regarding Chinese Application No. 2005100059078 from the State Intellectual Property Office of People's Republic of China, dated Sep. 24, 2011. Translation provided by Unitalen Attorneys at Law.
Third Office Action regarding Chinese Patent Application No. 200910211779.0, dated Sep. 4, 2013. English translation provided by Unitalen Attorneys at Law.
Torcellini, P., et al., "Evaluation of the Energy Performance and Design Process of the Thermal Test Facility at the National Renewable Energy Laboratory", dated Feb. 2005.
Trane EarthWise™ CenTra Vac™ Water-Cooled Liquid Chillers 165-3950 Tons 50 and 60 Hz; CTV PRC007—EN; Oct. 2002; 56 pages.
Translation of claims and Abstract of KR Patent Laying-Open No. 2000-0000261.
Udelhoven, Darrell, "Air Conditioner EER, SEER Ratings, BTUH Capacity Ratings, & Evaporator Heat Load," http://www.udarrell.com/air-conditioner-capacity-seer.html, Apr. 3, 2003, 15 pages.
Udelhoven, Darrell, "Air Conditioning System Sizing for Optimal Efficiency," http://www.udarrell.com/ airconditioning-sizing.html, Oct. 6, 2003, 7 pages.
Udelhoven, Darrell, "Optimizing Air Conditioning Efficiency TuneUp Optimizing the Condensor Output, Seer, Air, HVAC Industry," http://www.udarrell.com/air-conditioning-efficiency.html, Jul. 19, 2002, 13 pages.
Ultrasite 32 User's Guide, Computer Process Controls, Sep. 28, 1999.
Ultrasite User's Guide BCU Supplement, Computer Process Controls, Sep. 4, 1997.
Ultrasite User's Guide BEC Supplement, Computer Process Controls, Oct. 6, 1997.
Ultrasite User's Guide RMCC Supplement, Computer Process Controls, Jun. 9, 1997.
UltraSite User's Guide, Computer Process Controls, Apr. 1, 1996.
Vandenbrink et al.,"Design of a Refrigeration Cycle Evaporator Unit," Apr. 18, 2003.
Watt, James; Development of Empirical Temperature and Humidity-Based Degraded-Condition Indicators for Low-Tonnage Air Conditioners; ESL-TH-97/12-03; Dec. 1997.

(56) References Cited

OTHER PUBLICATIONS

Written Opinion from related PCT Application No. PCT/US2014/028074 mailed Jun. 19, 2014.
Written Opinion of the International Searching Authority for International Application No. PCT/US2008/012364 dated Mar. 12, 2009.
Written Opinion of the International Searching Authority regarding Application No. PCT/US2010/036601, mailed Dec. 29, 2010.
Written Opinion of the International Searching Authority regarding Application No. PCT/US2013/021161, mailed May 8, 2013.
Written Opinion of the International Searching Authority regarding International Application No. PCT/US2007/019563, dated Jan. 15, 2008.
Written Opinion of the International Searching Authority, Int'l. App. No. PCT/US 06/05917, dated Sep. 26, 2007.
Written Opinion regarding PCT/US02/13459, dated Apr. 23, 2003.
Office Action regarding Australian Patent Application No. 2015255255, dated Sep. 8, 2016.
Office Action regarding Canadian Patent Application No. 2,908,362, dated Sep. 21, 2016.
Search Report regarding European Patent Application No. 14763232.7, dated Oct. 27, 2016.
Search Report regarding European Patent Application No. 14764311.8, dated Oct. 27, 2016.
U.S. Appl. No. 12/943,626, filed Nov. 10, 2010.
U.S. Appl. No. 13/770,479, filed Feb. 19, 2013.
U.S. Appl. No. 13/784,890, filed Mar. 5, 2013.
U.S. Appl. No. 14/080,473, filed Nov. 14, 2013.
U.S. Appl. No. 14/209,415, filed Mar. 13, 2014.
U.S. Appl. No. 14/212,632, filed Mar. 14, 2014.
U.S. Appl. No. 14/244,967, filed Apr. 4, 2014.
U.S. Appl. No. 14/255,519, filed Apr. 17, 2014.
U.S. Appl. No. 14/300,782, filed Jun. 10, 2014.
U.S. Appl. No. 14/607,782, filed Jan. 28, 2015.
U.S. Appl. No. 14/727,756, filed Jun. 1, 2015.
U.S. Appl. No. 14/841,058, filed Aug. 31, 2015.
U.S. Appl. No. 14/949,090, filed Nov. 23, 2015.
U.S. Appl. No. 15/096,186, filed Apr. 11, 2016.
U.S. Appl. No. 15/096,196, filed Apr. 11, 2016.

* cited by examiner

SYSTEM AND METHOD FOR COMPRESSOR MOTOR PROTECTION

CROSS-REFERENCE TO RELATED APPLICATIONS

This application is a continuation of U.S. application Ser. No. 13/737,566, filed on Jan. 9, 2013, which claims the benefit of U.S. Provisional Application No. 61/585,382, filed on Jan. 11, 2012. The entire disclosures of the above applications are incorporated herein by reference in their entirety.

FIELD

The present application relates to electric motor control systems and methods and more particularly to maximum continuous current (MCC) systems and methods.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A power source such as an electrical utility may supply alternating current (AC) power to a refrigerant compressor. The refrigerant compressor includes an electric motor that drives the refrigerant compressor. A system including the refrigerant compressor may also include one or more devices that prevent current flow to the electric motor from exceeding a predetermined value.

For example, a line break protector may be implemented such that current flows through the line break protector before flowing to the electric motor. The line break protector may include an electric heater that generates heat as current flows through the line break protector. The line break protector trips and disables current flow to the electric motor when the current flowing through the line break protector is greater than the predetermined value.

For another example, a positive temperature coefficient (PTC) device and/or a negative temperature coefficient (NTC) device may be implemented in thermal contact with a motor winding to achieve a temperature relative to the temperature of the motor. Resistances of the PTC and/or NTC devices may then be used to determine motor temperature, both directly and indirectly. One or more remedial actions, such as shutting off the motor, can be taken if the motor temperature measured or determined using the PTC and/or NTC devices is greater than a predetermined temperature.

SUMMARY

In a feature, a system is described. A refrigerant compressor includes an electric motor. A current sensor measures current flow to the electric motor. A switching device is configured to close and open to allow and prevent current flow to the electric motor, respectively. A maximum continuous current (MCC) device includes a stored digital value corresponding to a maximum continuous current for the electric motor. A motor protection module: communicates with the MCC device, the current sensor, and the switching device; determines a first MCC for the electric motor as a function of the stored digital value received from the MCC device; selectively sets a predetermined MCC to the first MCC; and controls the switching device based on a comparison of the current flow to the electric motor and the predetermined MCC.

In further features, the motor protection module opens the switching device when the current flow to the electric motor is greater than the predetermined MCC.

In further features, the motor protection module receives the stored digital value wirelessly from the MCC device using near field communication.

In further features, the motor protection module receives the stored digital value wirelessly from the MCC device using radio frequency identification (RFID).

In further features, the motor protection module receives the stored digital value wirelessly from the MCC device using a Bluetooth communication protocol.

In further features, the motor protection module determines the first MCC for the electric motor using a lookup table that relates digital values to respective first MCCs.

In further features, the MCC device is integrated with the motor protection module.

In further features, the system further includes a second MCC device. The motor protection module: determines a second MCC for the electric motor as a function of an output of the second MCC device; and selectively sets the predetermined MCC to the second MCC.

In further features, the motor protection module sets the predetermined MCC equal to a lesser one of the first and second MCCs.

In further features, the second MCC device is integrated with the refrigerant compressor and remote from the motor protection module.

In a feature, a method is described. The method includes: measuring, using a current sensor, current flow to an electric motor of a refrigerant compressor; selectively opening and closing a switching device to allow and prevent current flow to the electric motor, respectively; communicating with the current sensor, the switching device, and a maximum continuous current (MCC) device, the MCC device including a stored digital value corresponding to a maximum continuous current for the electric motor; receiving the stored digital value from the MCC device; determining a first MCC for the electric motor as a function of the stored digital value received from the MCC device; selectively setting a predetermined MCC to the first MCC; and controlling the switching device based on a comparison of the current flow to the electric motor and the predetermined MCC.

In further features, the method further includes opening the switching device when the current flow to the electric motor is greater than the predetermined MCC.

In further features, receiving the stored digital value from the MCC device includes receiving the stored digital value wirelessly from the MCC device using near field communication.

In further features, receiving the stored digital value from the MCC device includes receiving the stored digital value wirelessly from the MCC device using radio frequency identification (RFID).

In further features, receiving the stored digital value from the MCC device includes receiving the stored digital value wirelessly from the MCC device using a Bluetooth communication protocol.

In further features, determining the first MCC includes determining the first MCC for the electric motor using a lookup table that relates digital values to respective first MCCs.

In further features, the method further includes: determining a second MCC for the electric motor as a function of an output of 1 second MCC device; and selectively setting the predetermined MCC to the second MCC.

In further features, the method further includes setting the predetermined MCC equal to a lesser one of the first and second MCCs.

In further features, the second MCC device is integrated with the refrigerant compressor.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
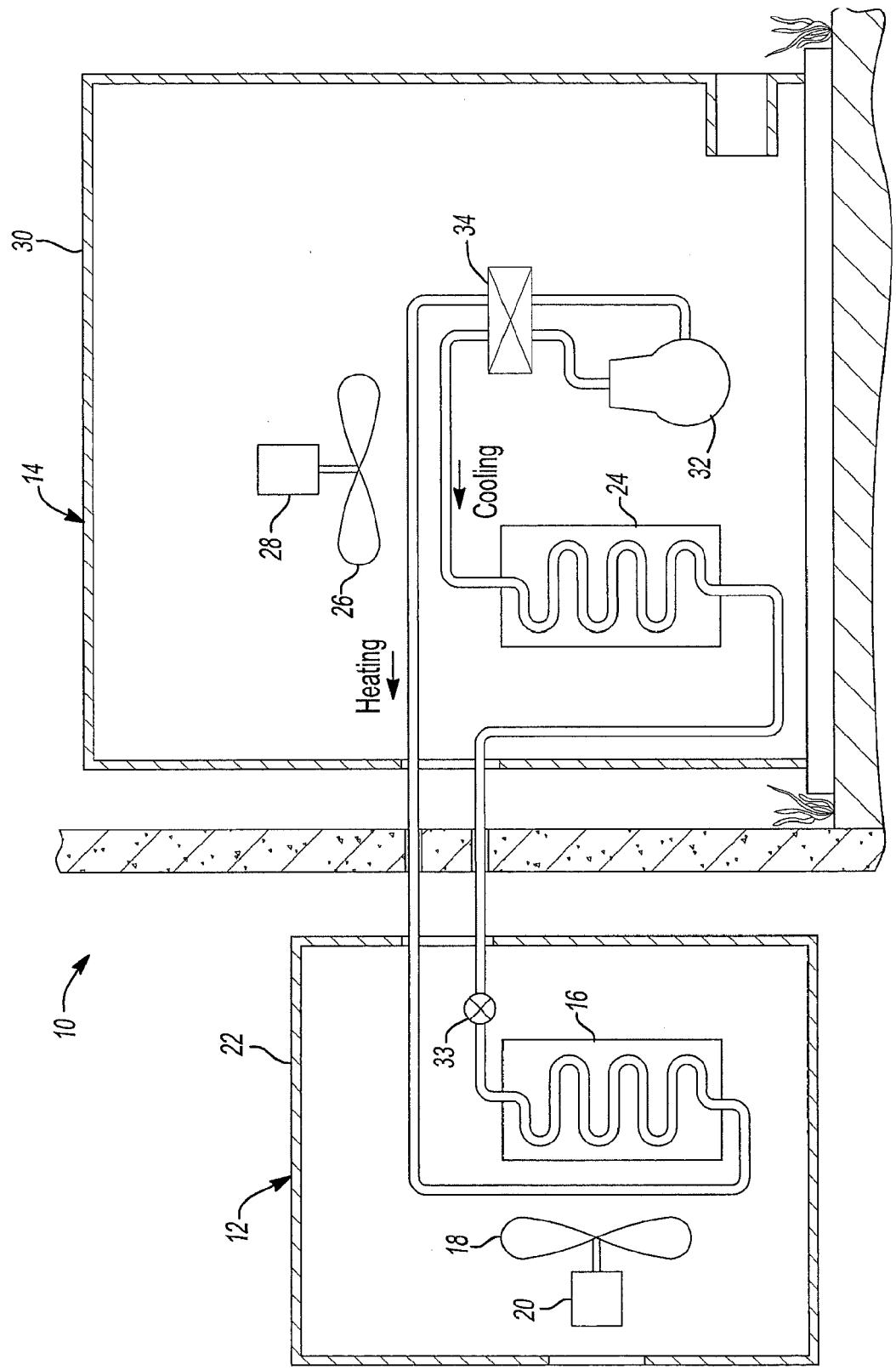
FIG. 1 is a schematic illustration of a heat pump system.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip (SOC). The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors or a group of execution engines. For example, multiple cores and/or multiple threads of a processor may be considered to be execution engines. In various implementations, execution engines may be grouped across a processor, across multiple processors, and across processors in multiple locations, such as multiple servers in a parallel processing arrangement. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

An original equipment manufacturer (OEM), such as a compressor manufacturer, determines a maximum continuous current (MCC) for a motor of a refrigerant compressor based on a variety of factors. For example only, the MCC for the motor may be set based on output capability of the motor (e.g., horsepower), one or more characteristics of the refrigerant compressor, the type of refrigerant, and an operating envelope. The operating envelope may include an evaporator temperature range and a condenser temperature range within which the refrigerant compressor will be allowed to operate.

The OEM may provide the refrigerator compressor with an MCC device. For example only, the MCC device may be integrated within a control module that controls the motor and the refrigerant compressor, integrated with the motor, or provided in another suitable manner. The MCC device generates an output, such as a resistance or a stored digital value. The output of the MCC device corresponds to the MCC determined by the OEM.

The control module may selectively disable current flow to the motor based on the output of the MCC device. For example, the control module may disable current flow to the motor when the output of the MCC device is outside of a predetermined range of values. The predetermined range of values may be set such that the output of the MCC device will be above or below the range when the MCC device has been open circuited or short circuited.

The control module may also determine a predetermined MCC for the motor based on the output of the MCC device. The motor draws current during operation of the refrigerant compressor. One or more current sensors measure current flow to the motor. The control module may selectively disable current flow to the motor when the current flowing to the motor is greater than the predetermined MCC.

One or more additional MCC devices may also be provided in various implementations. For example only, a system designer can provide an additional MCC device that indicates a value for the predetermined MCC that cannot be exceeded by the MCC device provided by the OEM. The system designer may provide an additional MCC device, for example, when one or more parameters of the operating envelope can be made narrower than the operating envelope used by the OEM in setting the MCC for the motor. The system designer may provide the additional MCC device(s) on a structure of the refrigeration or A/C system, away from a body of the compressor. The additional MCC device(s) may be connected with the control module via a physical connection or a wireless (e.g., near field communication) connection.

The control module determines an output (e.g., a resistance) of the additional MCC device and determines a second MCC for the motor based on the output of the additional MCC device. The control module may selectively set the predetermined MCC to the MCC determined based on the output of the MCC device or the second MCC determined based on the resistance of the additional MCC device. For example only, the control module may set the predetermined MCC equal to the lesser one of the MCCs. In this manner, if the second MCC is less than the MCC set by the OEM, the control module will disable current flow to the motor when the current flowing to the motor is greater than the second MCC. If the second MCC is greater than the MCC specified by the OEM, however, the MCC specified by the OEM will be used.

Referring now to FIG. 1, an example diagram of a heat pump system 10 is presented. Heat pump system 10 may include an indoor unit 12 and an outdoor unit 14. A heat pump system is used for illustration purposes only, and it should be understood that the present application is applicable to other systems including a motor-driven compressor, such as HVAC systems and refrigeration systems.

Indoor unit 12 may include an indoor coil or heat exchanger 16 and a variable speed indoor fan 18. Indoor fan 18 is driven by motor 20. Indoor coil 16 and indoor fan 18 may be enclosed in a housing 22 so indoor fan 18 may force air across indoor coil 16.

Outdoor unit 14 may include an outdoor coil or heat exchanger 24 and a variable speed outdoor fan 26. Outdoor fan 26 is driven by a motor 28. Outdoor coil 24 and outdoor fan 26 may be enclosed in a housing 30 so outdoor fan 26 may draw air across outdoor coil 24. Outdoor unit 14 may further include a compressor 32 connected to indoor coil 16 and outdoor coil 24. Compressor 32 may have a motor that is driven by a variable speed inverter drive as illustrated (see also FIG. 2) or a fixed speed motor.

Compressor 32, indoor coil 16, and outdoor coil 24 may be connected to generally form a loop where compressor 32, indoor coil 16, and outdoor coil 24 are arranged in series with one another and an expansion device 33 is located between indoor coil 16 and outdoor coil 24. Heat pump system 10 may include a reversing valve 34 disposed between compressor 32 and indoor and outdoor coils 16 and 24. Reversing valve 34 may enable the direction of flow between compressor 32, indoor coil 16, and outdoor coil 24 to be switched (reversed) between first and second directions.

In the first direction, heat pump system 10 operates in a cooling mode providing a flow in a direction indicated by the arrow labeled "cooling". In the cooling mode, compressor 32 provides a fluid (e.g., a refrigerant) to outdoor coil 24. The fluid then travels to indoor coil 16 and then back to compressor 32. In the cooling mode, indoor coil 16 functions as an evaporator coil and outdoor coil 24 functions as a condenser coil.

In the second direction, heat pump system 10 operates in a heating mode providing a flow in a direction indicated by the arrow labeled "heating". In the heating mode, flow is reversed relative to the first direction. Compressor 32 provides fluid to indoor coil 16. The fluid then travels to outdoor coil 24 and then back to compressor 32. In the heating mode, indoor coil 16 functions as a condenser coil and outdoor coil 24 functions as an evaporator coil.

Figure 2:
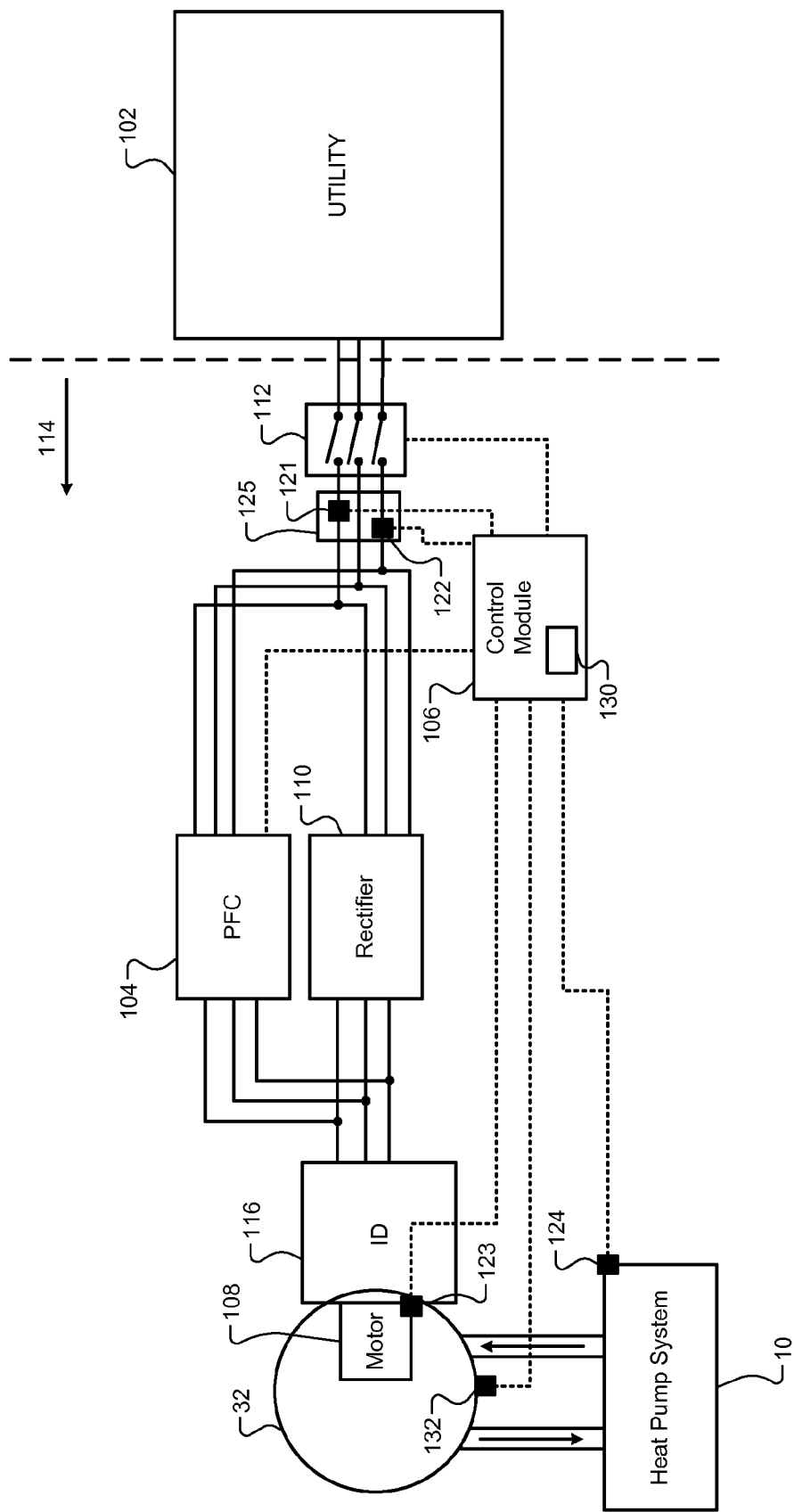
FIG. 2 is a functional block diagram of an example motor control system.

Referring now to FIG. 2, a block diagram of an example motor control system is presented. Utility 102 may provide alternating current (AC) power to customer 114. The AC power may be three-phase AC power as illustrated or single-phase AC power. Customer 114 may include heat pump system 10, compressor 32, a power factor correction (PFC) system 104, a control module 106, a motor 108, a rectifier 110, a switching device 112, an inverter drive 116, and sensors 121, 122, 123, and 124.

Customer 114 may have a load that includes compressor 32 and heat pump system 10. Although one or more components depicted separately from heat pump system 10 in FIG. 2, such as compressor 32, one or more components may be integral to heat pump system 10. Motor 108 of heat pump system 10 may be integral to compressor 32 of heat pump system 10. Motor 108 may be driven directly by utility 102 via the switching device 112, but for example purposes only, is driven by variable speed inverter drive 116 of compressor 32.

Sensor 121 may measure current flow through one of the three-legs of the AC power. For example only, sensor 121 may include a current transducer (CT). Current consumption may be expressed as amperage. Sensor 121 may also measure voltage and power (e.g., in volt-amps) delivered by utility 102. Sensor 121 may also provide a watt meter reading of the real power consumed by customer 114. Sensor 121 may be located at multiple positions relative to customer 114 or utility 102. Sensor 121 may be located, for example only, downstream of switching device 112 and upstream of PFC system 104 and rectifier 110.

Sensor 122 may measure current flow through another one of the three-legs of the AC power. For example only, sensor 122 may include a CT. Current consumption may be expressed as amperage. Sensor 122 may also measure voltage and power (e.g., in volt-amps) drawn by inverter drive 116. Sensor 122 may also provide a watt meter reading of the real power consumed by customer 114. Sensor 122 may be located at multiple positions relative to customer 114 or utility 102. In various implementations, sensor 121 and sensor 122 may be implemented together within a dual sensor module 125.

PFC system 104 may be connected to receive current output by switching device 112. PFC system 104 may be any suitable device that improves a power factor of a load. For example only, PFC system 104 may include a passive PFC, such as a bank of capacitors used to balance an inductive load or an inductor to balance a capacitive load. For another example only, PFC system 104 may include a conventional active PFC system that actively provides a high power factor, such as a power factor approaching 1.0. Control module 106 may control switching of PFC system 104 if PFC system 104 is an active PFC system. Rectifier 110 may also be connected to receive current output by switching device 112.

Current may be provided to inverter driver 116 by PFC system 104 and/or rectifier 110. Inverter drive 116 drives motor 108. Inverter drive 116 may drive motor 108 at a variable speed to regulate operation of compressor 32 of heat pump system 10. Control module 106 may regulate switching of inverter drive 116 to vary the speed of motor 108.

Sensor 123 may be implemented with motor 108 and may measure a temperature of motor 108. For example only, sensor 123 may include a negative temperature coefficient (NTC) sensor, a positive temperature coefficient (PTC) sensor, a thermistor, or another suitable type of temperature sensor. Sensor 123 may measure, for example only, a magnetic wire temperature of motor 108. Sensor 123 may also measure one or more other parameters from motor 108, such as current, voltage, compressor operating speed, and/or commanded operating speed, etc. Each of sensors 121, 122, and 123 may be a single sensor or multiple sensors that provide measurements to control module 106. Sensor 124 may be a single sensor or multiple sensors that measure parameters of heat pump system 10. For example only, sensor 124 may measure discharge temperature and/or pressure, suction temperature and/or pressure, condenser temperature and/or pressure, evaporator temperature and/or pressure, compressor speed, refrigerant temperature and/or pressure, etc.

Switching device 112 may be any device or combination of devices that enable (allow) and disable (prevent) current flow to motor 108. Switching device 112 may be an electrical switch, a contactor, a relay, or another suitable type of switching device. Switching device 112 may be implemented, for example, between sensor 121 and utility 102 in various implementations. However, switching device 112 may be located in another suitable location upstream of motor 108.

Control module 106 may include a motor protection module 130. Motor protection module 130 may control switching device 112 based on one or more parameters, for example, to protect motor 108. Motor protection module 130 may control switching device 112 based on a temperature of motor 108 measured using sensor 123. For example only, motor protection module 130 may control switching device 112 to enable current flow to motor 108 when the temperature is less than a predetermined temperature. Conversely, motor protection module 130 may control switching device 112 to disable current flow to motor 108 when the temperature is greater than the predetermined temperature.

Motor protection module 130 may additionally or alternatively control switching device 112 based on a measured current consumption of motor 108. For example only, motor protection module 130 may control switching device 112 to enable current flow to motor 108 when the current is less than a predetermined maximum continuous current (MCC). Conversely, motor protection module 130 may control switching device 112 to disable current flow to motor 108 when the current is greater than the predetermined MCC. Motor protection module 130 may disable current flow to motor 108 within a predetermined period when the current is greater than the predetermined MCC.

A first MCC device (e.g., see FIGS. 3A-B) may include a resistance. The first MCC device may be integrated with control module 106 or integrated with compressor 32. Motor protection module 130 determines a first MCC based on the resistance of the first MCC device or a digital value output by the first MCC device. The resistance of the first MCC device or the digital value output by the first MCC device may be set, for example, by an original equipment manufacturer (e.g., a compressor manufacturer) to indicate an MCC for an operating envelope and characteristics of motor 108, compressor 32, and the type of fluid used. The operating envelope may include a range of evaporator temperatures and a range of condenser temperatures within which the motor protection module 130 can operate compressor 32.

Motor protection module 130 may also control switching device 112 to disable current flow to motor 108 when the output of the first MCC device indicates that the first MCC device has been short circuited or open circuited. For example, motor protection module 130 may disable current flow to motor 108 when the resistance of the first MCC device is approximately zero (short circuit) or infinity (open circuit). Disabling current flow to motor 108 when the first MCC device is open circuited or short circuited may protect motor 108 in the event that an attempt to bypass the first MCC device is made.

A second MCC device 132 may also be implemented in various implementations. Second MCC device 132 is remote from control module 106. Second MCC device 132 may be, for example, integrated with compressor 32 or mounted to a structure of a system, such as housing 30. Second MCC device 132 may also include a resistance. Second MCC device 132 may be implemented and the resistance of second MCC device 132 may be selected, for example, down the distribution chain from the original equipment manufacturer, such as by a system designer.

The resistance of second MCC device 132 may be selected to provide a second MCC. Motor protection module 130 determines the second MCC based on the resistance of second MCC device 132. Motor protection module 130 selectively sets the predetermined MCC for use in enabling and disabling current flow to motor 108 to the first MCC or the second MCC.

For example only, when the first MCC is greater than the second MCC, the motor protection module 130 may set the predetermined MCC equal to the second MCC. In this manner, current drawn by motor 108 can be limited to the second MCC specified using second MCC device 132. The system designer can choose contactor size, size of electrical wiring, fuses, and one or more electrical components based on the second MCC. Under circumstances that allow for the second MCC to be used as the predetermined MCC, cost savings may be enjoyed as smaller electrical wiring, contactors, etc. may be implemented.

When the second MCC is greater than the first MCC, however, the motor protection module 130 may set the predetermined MCC equal to the first MCC. Using the first MCC as the predetermined MCC when the second MCC is greater than the first MCC may prevent the first MCC device from being bypassed or disconnected.

In the event that one or more of control module 106, second MCC device 132, and compressor 32 are replaced (e.g., for service reasons), the motor protection module 130 can establish the predetermined MCC. For example, when the control module 106 is replaced, the new control module can determine the first and second MCCs and determine the predetermined MCC based on the first and second MCCs. When the second MCC device 132 is replaced, the control module 106 can determine the new value of the second MCC and determine the predetermined MCC based on the first MCC and the (new) second MCC.

Figure 3A:
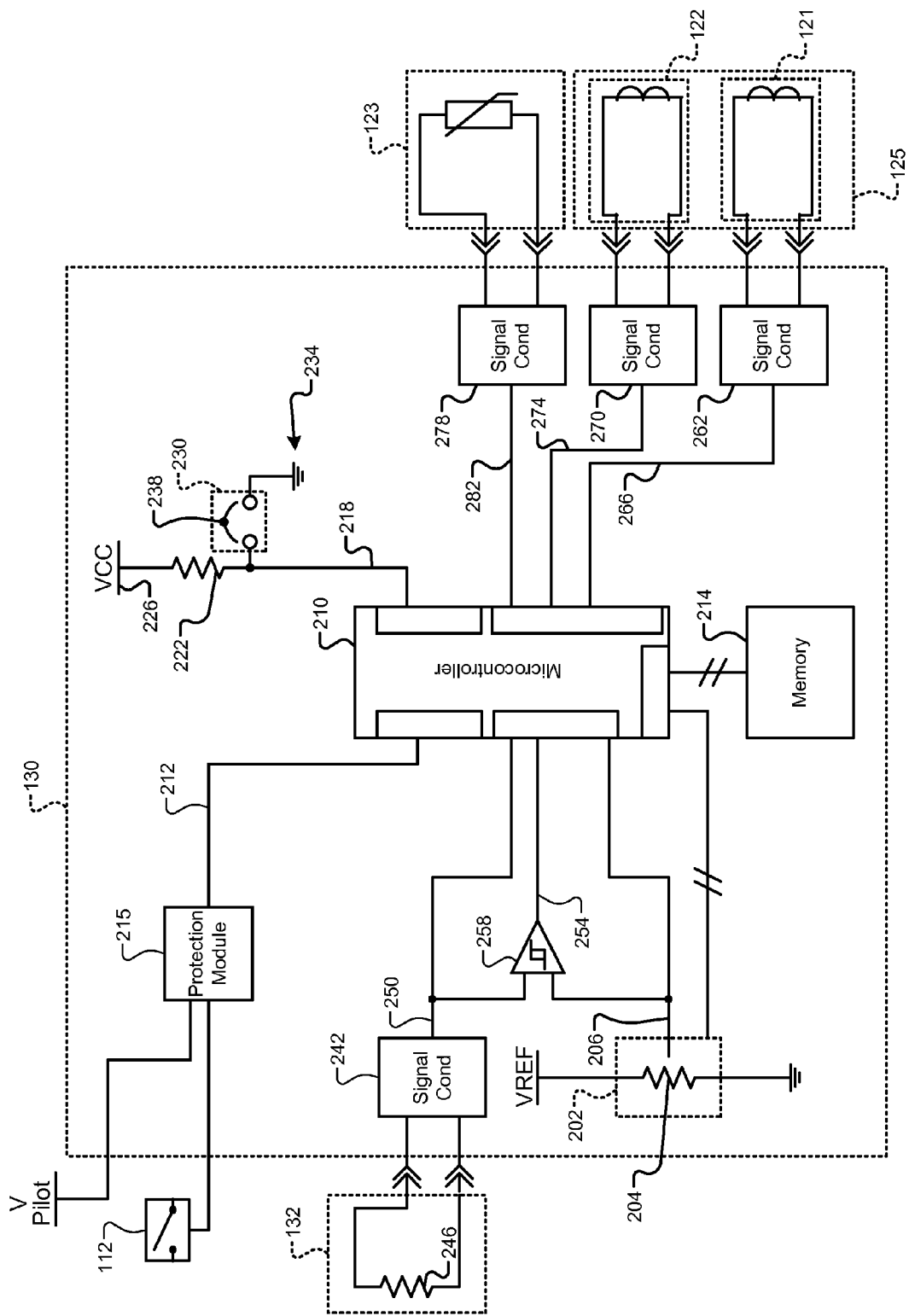
FIGS. 3A-3C are functional block diagrams of example current control systems.
Figure 3B:
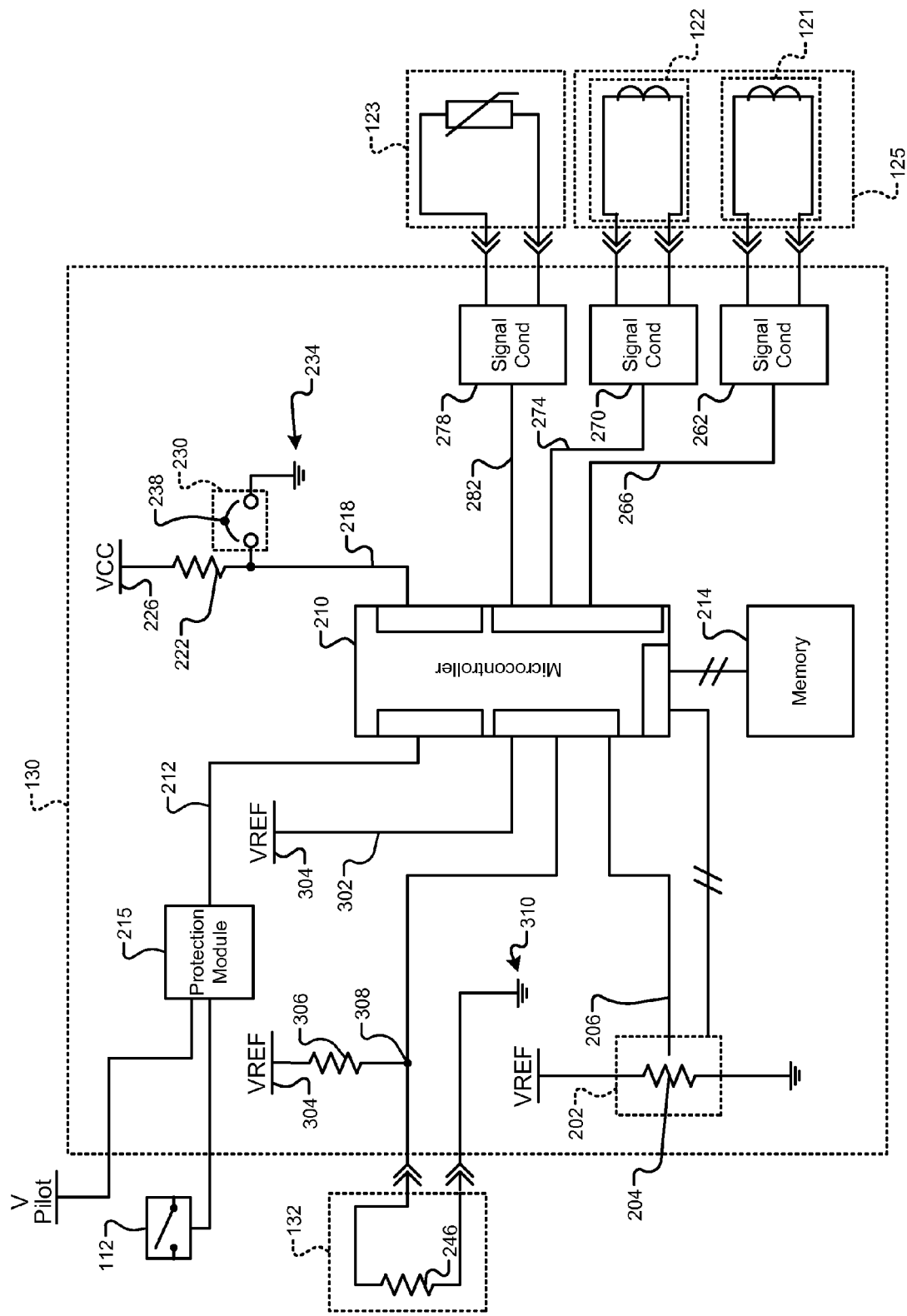
Figure 3C:
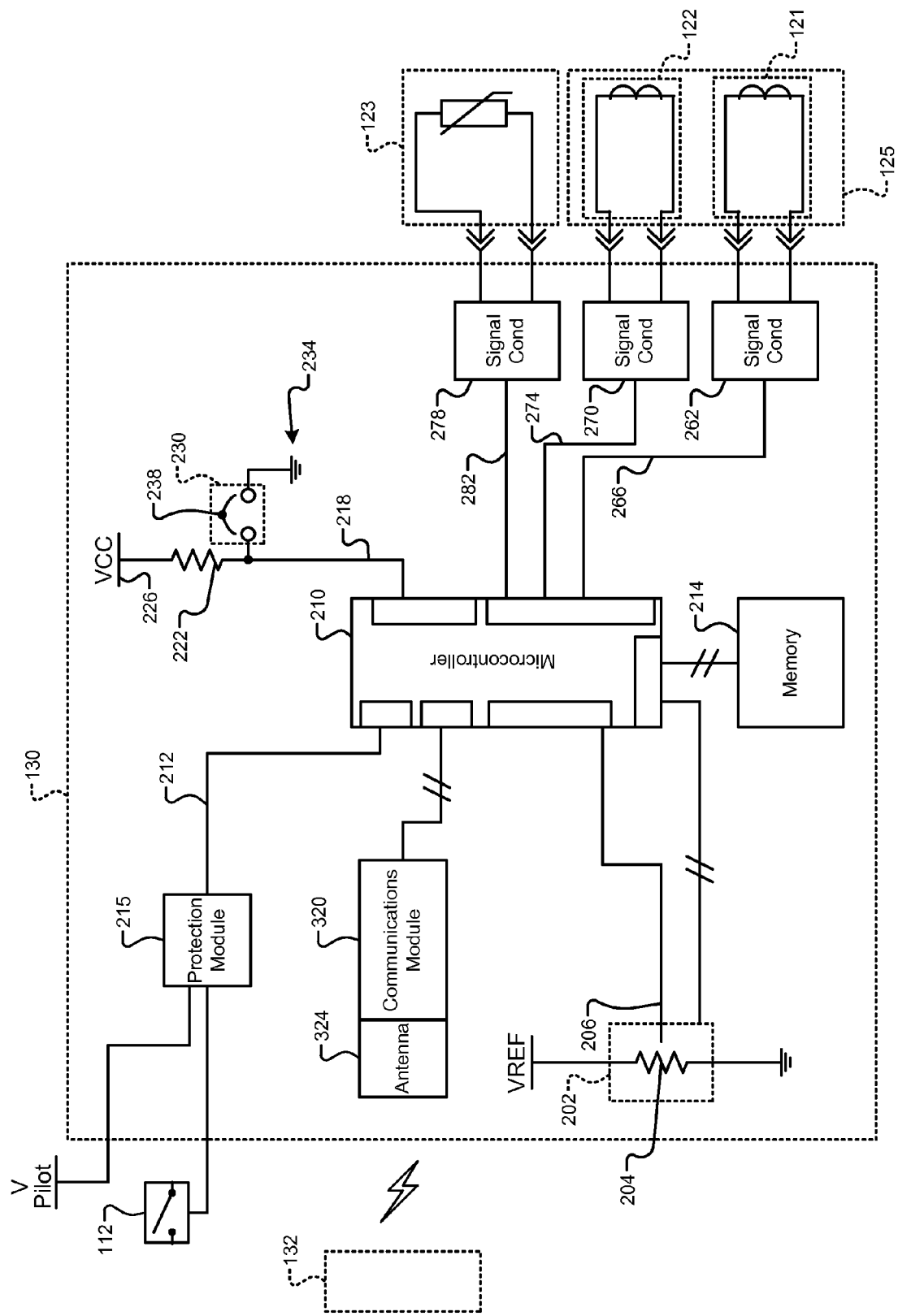

FIGS. 3A-3C include functional block diagrams of example current control systems. Referring now to FIG. 3A, a block diagram of an example current control system is presented. Motor protection module 130 may include a first MCC device 202. First MCC device 202 may output a first voltage 206 that corresponds to a resistance of a resistor 204 of first MCC device 202. For example only, the resistor 204 may include a programmable potentiometer, such as a digitally programmable potentiometer (DPP), or another suitable type of programmable resistance device. A microcontroller, microprocessor, or other suitable device 210 may selectively set (program) the resistance of first MCC device 202, for example, based on inputs from a service tool (not shown), a network connection, and/or one or more other suitable inputs.

Microcontroller 210 selectively determines the resistance of first MCC device 202 based on first voltage 206. For example only, microcontroller 210 may determine the resistance of first MCC device 202 using one of a function and a mapping (e.g., look up table) that relates voltage to resistance and first voltage 206 as input. The function or mapping may be stored, for example, in memory 214. For example only, memory 214 may include electrically erasable programmable read only memory (EEPROM) and/or one or more other suitable tangible storage mediums.

Microcontroller 210 determines the first MCC based on the resistance of first MCC device 202. For example only, microcontroller 210 may determine the first MCC using one of a function and a mapping (e.g., look up table) that relates resistance to MCC and the resistance of first MCC device 202 as input.

Microcontroller 210 selectively enables and disables current flow to motor 108 via switching device 112 using an output 212 to a protection module 215. For example only, microcontroller 210 may set output 212 to one of a first state and a second state at a given time, and protection module may one of enable and disable current flow to motor 108 via switching device 112 based on the state of output 212. Microcontroller 210 may enable and disable current flow to motor 108 or enable and disable current flow to motor 108 in another suitable manner. For example only, microcontroller 210 may disable switching of inverter drive 116 to prevent current flow to motor 108.

Microcontroller 210 selectively disables current flow to motor 108 based on the resistance of first MCC device 202. For example only, microcontroller 210 disables current flow to motor 108 when the resistance of first MCC device 202 is outside of a predetermined resistance range. Microcontroller 210 may enable current flow to motor 108 when the resistance of first MCC device 202 is within the predetermined resistance range.

A lower boundary of the predetermined resistance range may be set sufficiently close to zero such that the resistance of first MCC device 202 being less than the lower boundary indicates that first MCC device 202 is short circuited. An upper boundary of the predetermined resistance range may be set sufficiently greater than a maximum resistance such that the resistance of first MCC device 202 being greater than the upper boundary indicates that first MCC device 202 is open circuited or that microcontroller 210 and first MCC device 202 are disconnected.

Microcontroller 210 may determine whether to determine the second MCC based on a second voltage 218. A first terminal of a current limiting resistor 222 may be connected to a voltage potential 226. A second terminal of current limiting resistor 222 may be connected to microcontroller 210 and to a first terminal of a jumper device 230. A second terminal of jumper device 230 may be connected to a ground source 234.

Whether a jumper 238 is connected between the first and second terminals of jumper device 230 controls second voltage 218. For example only, when jumper 238 is connected, jumper 238 creates a short circuit between the first terminal and the second terminal of jumper device 230 and causes second voltage 218 to be approximately equal to a first predetermined voltage. When jumper 238 is not connected, second voltage 218 is approximately equal to a second predetermined voltage.

The OEM may provide the motor protection module 130 with jumper 238 connected between the first and second terminals of jumper device 230. Microcontroller 210 may determine the second MCC based on the resistance of second MCC device 132 when second voltage 218 is approximately equal to the first predetermined voltage. In various implementations, the opposite may be true. Motor protection module 130 may be provided without jumper 238 being connected between the first and second terminals of jumper device 230, and microcontroller 210 may determine the second MCC based on the resistance of second MCC device 132 when second voltage 218 is approximately equal to the second predetermined voltage.

A first signal conditioner module 242 may be connected to second MCC device 132. First signal conditioner module 242 receives a signal (e.g., a voltage) output by second MCC device 132 that corresponds to the resistance of a resistor 246 within second MCC device 132. First signal conditioner module 242 may also output a reference voltage (not shown) to second MCC device 132. First signal conditioner module 242 outputs a third voltage 250 that corresponds to the resistance of resistor 246 of second MCC device 132. First signal conditioner module 242 may condition the signal in one or more ways to generate third voltage 250, such as by filtering, buffering, digitizing, and/or performing one or more other suitable signal conditioning functions.

Microcontroller 210 selectively determines the resistance of second MCC device 132 based on third voltage 250. For example only, microcontroller 210 may determine the resistance of second MCC device 132 using one of the function and the mapping (e.g., look up table) that relates voltage to resistance and third voltage 250 as input. Microcontroller 210 determines the second MCC based on the resistance of second MCC device 132. For example only, microcontroller 210 may determine the second MCC using one of the function and the mapping (e.g., look up table) that relates resistance to MCC and the resistance of second MCC device 132 as input.

Microcontroller 210 selectively sets the predetermined MCC equal to one of the first MCC and the second MCC. For example only, when the second MCC is not determined (e.g., when jumper 238 is connected), microcontroller 210 may set the predetermined MCC equal to the first MCC. When the second MCC is determined, microcontroller 210 may set the predetermined MCC equal to the lesser one of the first and second MCCs. In this manner, when the resistance of second MCC device 132 is set such that the second MCC is greater than the first MCC, the predetermined MCC will be set to the first MCC to prevent the first MCC from being exceeded. Additionally, when the resistance of second MCC device 132 is set such that the second MCC is less than the first MCC, the predetermined MCC will be set to the second MCC such that current consumption of motor 108 can be limited to less than the first MCC. Limiting current consumption of motor 108 to less than the first MCC may enable smaller electrical wiring and smaller electrical contactors to be used. Use of smaller electrical wiring and electrical contactors may provide a cost savings.

While the present application is discussed in terms of one second MCC device, one or more additional second MCC device may be used in various implementations. Microcontroller 210 may determine resistance(s) within the one or more additional second MCC devices, determine MCC(s) based on the resistance(s), and set the predetermined MCC equal to the smallest one of the MCCs.

In various implementations, microcontroller 210 may set the predetermined MCC equal to one of the first and second MCCs based on an output 254 of a comparator module 258. For example only, comparator module 258 may include a Schmitt trigger or another suitable type of comparator. Comparator module 258 may receive first voltage 206 (corresponding to the resistance of first MCC device 202) and third voltage 250 (corresponding to the resistance of second MCC device 132). Comparator module 258 compares first voltage 206 with third voltage 250 and generates output 254 based on the comparison.

For example only, comparator module 258 may set output 254 to a first state when the relationship between first and third voltages 206 and 250 is such that the first MCC is less than the second MCC. Once comparator module 258 has set output 254 to the first state, comparator module 258 may transition output 254 to a second state when the relationship between first and third voltages 206 and 250 is such that the second MCC is less than the first MCC by at least a predetermined amount. When output 254 is in the first state, microcontroller 210 may set the predetermined MCC equal to the first MCC. Microcontroller 210 may set the predetermined MCC equal to the second MCC when output 254 is in the second state.

A second signal conditioner module 262 may be connected to sensor 121. Second signal conditioner module 262 receives a signal (e.g., a voltage) output by sensor 121 that corresponds to current flowing through switching device 112. Second signal conditioner module 262 outputs a fourth voltage 266 that corresponds to the current flowing through switching device 112. Second signal conditioner module 262 may condition the signal in one or more ways to generate fourth voltage 266, such as by filtering, buffering, digitizing, and/or performing one or more other suitable signal conditioning functions. Microcontroller 210 may determine a first current using one of a function and a mapping that relates voltage to current using fourth voltage 266 as input.

A third signal conditioner module 270 may be connected to sensor 122. Third signal conditioner module 270 receives a signal (e.g., a voltage) output by sensor 122 that corresponds to current flowing to inverter drive 116. Third signal conditioner module 270 outputs a fifth voltage 274 that corresponds to the current flowing to inverter drive 116. Third signal conditioner module 270 may condition the signal in one or more ways to generate fifth voltage 274, such as by filtering, buffering, digitizing, and/or performing one or more other suitable signal conditioning functions. Microcontroller 210 may determine a second current using one of the function and the mapping that relates voltage to current using fifth voltage 274 as input.

Microcontroller 210 selectively enables and disables current flow to motor 108 based on current flow to motor 108 and the predetermined MCC. The first current, the second current, a current determined based on the first and second currents, or another suitable measured current may be used as the current flow to motor 108. Microcontroller 210 disables current flow to motor 108 when the current flow to motor 108 is greater than the predetermined MCC. Conversely, microcontroller 210 enables current flow to motor 108 when the current flow to motor 108 is less than the predetermined MCC.

When the current flow to motor 108 is greater than the predetermined MCC, microcontroller 210 may wait to disable the current flow to motor 108 for a predetermined period after the current flow to motor 108 becomes greater than the predetermined MCC. If the current flow to the motor 108 becomes less than the predetermined MCC during the predetermined period, microcontroller 210 may override the decision to disable current flow to motor 108 and maintain current flow to motor 108.

Microcontroller 210 may disable current flow to motor 108 during the predetermined period, however, when one or more predetermined conditions are satisfied. For example only, microcontroller 210 may disable current flow to motor 108 during the predetermined period when a rate of change of the current flow to motor 108 ($di/dt$) is greater than a predetermined rate of change. Additionally or alternatively, microcontroller 210 may disable current flow to motor 108 during the predetermined period when an acceleration of the current flow to motor 108 ($d^2i/dt^2$) is greater than a predetermined acceleration. Additionally or alternatively, microcontroller 210 may disable current flow to motor 108 during the predetermined period when the current flow to the motor 108 becomes greater than a predetermined current that is a predetermined percentage greater than the predetermined MCC. For example only, the predetermined percentage may be 5 percent, 10 percent, 15 percent, or another suitable percentage. Additionally or alternatively, microcontroller 210 may disable current flow to motor 108 during the predetermined period when an electric charge value is greater than a predetermined electric charge value. Microcontroller 210 may determine the electric charge value, for example, based on an integral (mathematical) of the current flow to motor 108 during the period. For example, the mathematical integral may be $\int(i-MCC_{pre})*dt$, where $MCC_{pre}$ is the predetermined MCC value and I is the measured current value, in order to put the reference at the predetermined MCC value. When the measured current exceeds the predetermined MCC value, the electric charge value (e.g., in Coulombs) increases due to the positive difference between the measured current value and the predetermined MCC value. A negative difference between the measured current value and the predetermined MCC value will cause the electric charge value to decrease. The integral may continue summing until it exceeds the predetermined electric charge value, wherein the switching device 112 would be opened by microcontroller 210. Additionally, the integral will continue summing until the electric charge value returns to zero due to the amount and duration of the current dropping below the predetermined MCC value.

A fourth signal conditioner module 278 may be connected to sensor 123. Fourth signal conditioner module 278 receives a signal (e.g., a voltage) output by sensor 123 that corresponds to a temperature of motor 108. Fourth signal conditioner module 278 outputs a sixth voltage 282 that corresponds to the temperature of motor 108. Fourth signal conditioner module 278 may condition the signal in one or more ways to generate sixth voltage 282, such as by filtering, buffering, digitizing, and/or performing one or more other suitable signal conditioning functions.

Microcontroller 210 may determine the temperature of motor 108 using one of a function and a mapping that relates voltage to temperature using sixth voltage 282 as input. Microcontroller 210 disables current flow to motor 108 when the temperature of motor 108 is greater than the predetermined temperature. Conversely, microcontroller 210 enables current flow to motor 108 when the temperature of motor 108 is less than the predetermined temperature.

Microcontroller 210 may also selectively enable and disable current flow to motor 108 based on one or more other parameters. For example only, microcontroller 210 may disable current flow to motor 108 when a shell temperature is greater than a predetermined temperature, when a compressor discharge temperature is greater than a predetermined temperature, and/or when one or more suitable disabling conditions occur. Microcontroller 210 may enable current flow to the motor 108 when the disabling conditions are not occurring.

While the present application is discussed in terms of devices with resistances that convey information regarding MCC, the resistances of onboard and remote devices may also be used to set predetermined values used in enabling and disabling current flow to motor 108. For example only, the resistances of onboard and remote devices may also be used to set the predetermined temperature.

When microcontroller 210 determines that current flow to motor 108 should be disabled via opening switching device 112, microcontroller may determine a response time. The response time may be or correspond to a period between a time when the decision to disable current flow to motor 108 is made and a time when microcontroller 210 commands opening of switching device 112. Microcontroller 210 may determine the response time, for example, based on a difference between the current to motor 108 and the predetermined MCC, a rate of change of the difference, and/or one or more other suitable parameters. For example only, the response time may decrease as the difference increases and/or as the rate of change of the difference increases and vice versa.

Referring now to FIG. 3B, another functional block diagram of another example current control system is presented. Microcontroller 210 may receive a reference voltage 302 from a reference voltage source (VREF) 304. A resistor 306 is connected between reference voltage source 304 and node 308. Resistor 246 of second MCC device 132 is connected between node 308 and a ground source 310, such as ground source 234. As such, the voltage at node 308 corresponds to the resistance of resistor 236 of second MCC device 132.

Microcontroller 210 may also receive the voltage at node 308. Microcontroller determines the resistance of resistor 246 of second MCC device 132 based on the relationship between reference voltage 302 and the voltage at node 308. Microcontroller 210 determines the second MCC based on the resistance of resistor 246. Microcontroller 210 sets the predetermined MCC based on the first and second MCCs and selectively disables current flow to motor 108 based on the predetermined MCC as discussed above.

Second MCC device 132 may output a value indicative of the second MCC to motor protection module 130 via a wired connection (e.g., as discussed above in conjunction with the examples of FIGS. 3A and 3B). Alternatively, second MCC device 132 may communicate the second MCC or a value indicative of the second MCC to motor protection module 130 wirelessly.

Referring now to FIG. 3C, a functional block diagram of another example current control system is presented. For example only, second MCC device 132 may communicate the second MCC or a value indicative of the second MCC to motor protection module 130 using near field communications, such as radio frequency identification (RFID), a Bluetooth communication protocol, or another suitable type of wireless communications.

Motor protection module 130 may include a communications module 320 and an antenna 324. Antenna 324 receives wireless output from second MCC device 132 and relays the output from second MCC device 132 to communications module 320. Communications module 320 may output one or more signals that prompt or cause second MCC device 132 to generate the output in various types of wireless communication. Communications module 320 provides output that is indicative of the second MCC to microcontroller 210. Microcontroller 210 can determine the second MCC based on the output. Microcontroller 210 sets the predetermined MCC based on the first and second MCCs and selectively disables current flow to motor 108 based on the predetermined MCC as discussed above.

Figure 4:
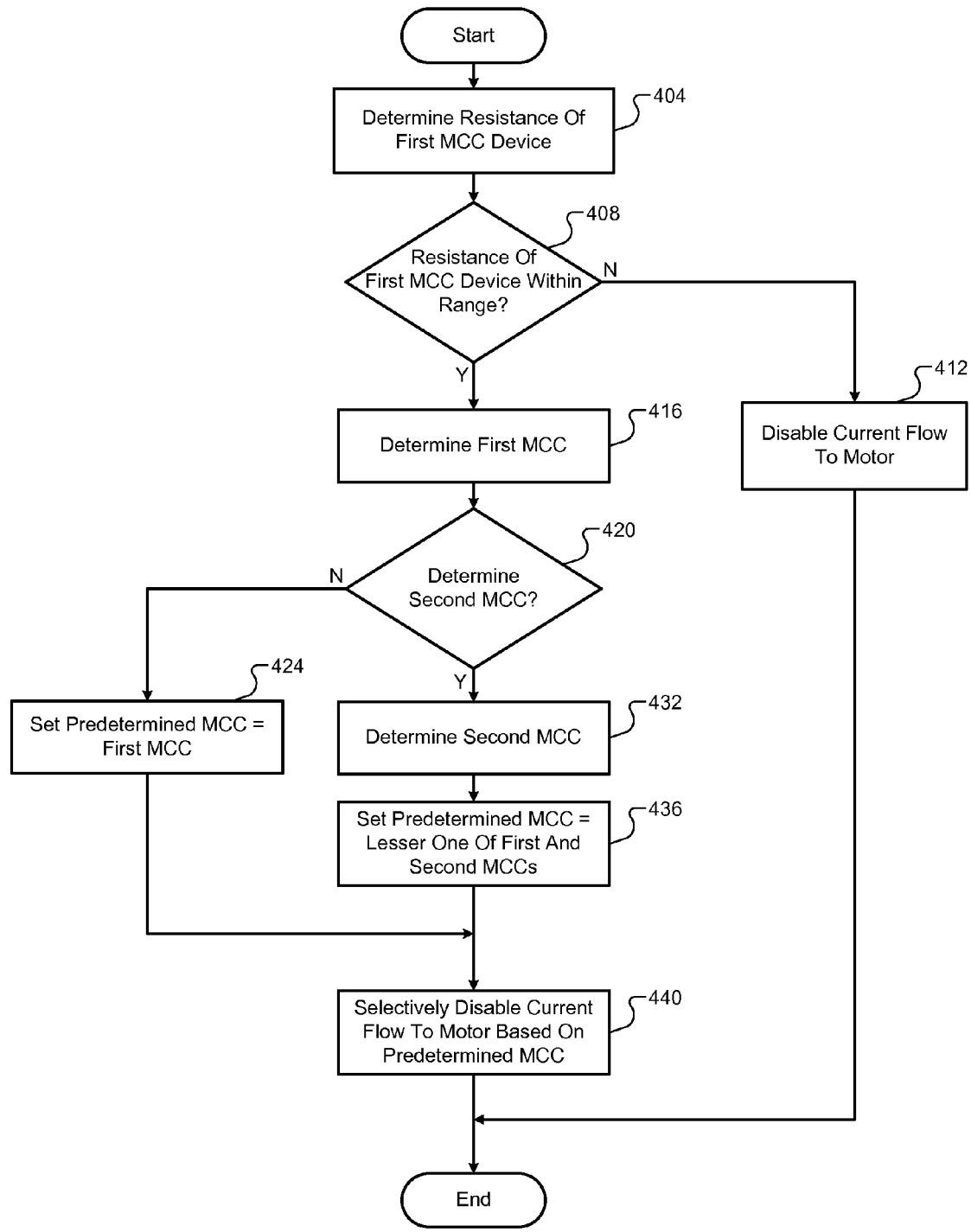
FIG. 4 is a flowchart depicting an example method of controlling current flow to an electric motor.

Referring now to FIG. 4, a flowchart depicting an example method of controlling current flow to motor 108 is presented. At 404, control determines the resistance of first MCC device 202. Control may determine whether the resistance of first MCC device 202 is within the predetermined resistance range at 408. If false, control may disable current flow to motor 108 at 412, and control may end. If true, control may proceed with 416. When the resistance of first MCC device 202 is outside of the predetermined resistance range, first MCC device 202 may be short or open circuited.

At 416, control determines the first MCC based on the resistance of first MCC device 202. Control determines the first MCC as a function of the resistance of first MCC device 202. For example only, control may determine the first MCC using one of a function and a mapping that relates resistance to MCC. Control determines whether the second MCC should be determined at 420. If false, control may set the predetermined MCC equal to the first MCC at 424 and continue with 440. 440 is discussed further below. If true, control may continue with 428.

Control determines the second MCC at 432. Control determines the second MCC based on the output of second MCC device 132. Control determines the second MCC as a function of the resistance of second MCC device 132. For example only, control may determine the second MCC using one of a function and a mapping that relates resistance to MCC. Control may determine the first and second MCCs using the same or different functions and/or mappings. Control may set the predetermined MCC equal to the lesser one of the first and second MCCs at 436.

Control selectively disables current flow to motor 108 based on the predetermined MCC and current flowing to motor 108 at 440. More specifically, control disables current flow to motor 108 when the current to motor 108 is greater than the predetermined MCC. When the current to motor 108 is greater than the predetermined MCC, control may determine the response time. The response time may be or correspond to a period between the time when the current to motor 108 is greater than the predetermined MCC and a time when control commands opening of switching device 112. Control may determine the response time, for example, based on the difference between the current to motor 108 and the predetermined MCC, a rate of change of the difference, and/or one or more other suitable parameters. For example only, the response time may decrease as the difference increases and/or as the rate of change of the difference increases and vice versa. The current flow to motor 108 may be provided using one or more current sensors, such as sensor 121 and/or sensor 122. Control may disable current flow to motor 108 by opening switching device 112.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:
a refrigerant compressor including an electric motor;
a current sensor that measures current flow to the electric motor;
a switching device configured to close and open to allow and prevent current flow to the electric motor, respectively;
a first maximum continuous current (MCC) device that includes a stored digital value corresponding to a maximum continuous current for the electric motor
a second MCC device;
a motor protection module that:
communicates with the first MCC device, the second MCC device, the current sensor, and the switching device;
determines a first MCC for the electric motor based on the stored digital value received from the first MCC device;
determines a second MCC for the electric motor based on an output of the second MCC device;
sets a predetermined MCC to one of the first MCC and the second MCC; and controls the switching device based on a comparison of the current flow to the electric motor and the predetermined MCC.

2. The system of claim 1 wherein the motor protection module opens the switching device when the current flow to the electric motor is greater than the predetermined MCC.

3. The system of claim 1 wherein the motor protection module receives the stored digital value wirelessly from the first MCC device using near field communication.

4. The system of claim 1 wherein the motor protection module receives the stored digital value wirelessly from the first MCC device using radio frequency identification (RFID).

5. The system of claim 1 wherein the motor protection module receives the stored digital value wirelessly from the first MCC device using a Bluetooth communication protocol.

6. The system of claim 1 wherein the motor protection module determines the first MCC for the electric motor using a lookup table that relates digital values to respective first MCCs.

7. The system of claim 1 wherein the first MCC device is integrated with the motor protection module.

8. The system of claim 1 wherein the motor protection module sets the predetermined MCC equal to a lesser one of the first and second MCCs.

9. The system of claim 1 wherein the second MCC device is integrated with the refrigerant compressor and remote from the motor protection module.

10. A method comprising:
measuring, using a current sensor, current flow to an electric motor of a refrigerant compressor;
selectively opening and closing a switching device to allow and prevent current flow to the electric motor, respectively;
communicating with the current sensor, the switching device, and a first maximum continuous current (MCC) device, and a second MCC device, the first MCC device including a stored digital value corresponding to a maximum continuous current for the electric motor;
receiving the stored digital value from the first MCC device;
determining a first MCC for the electric motor based on the stored digital value received from the first MCC device;
determining a second MCC for the electric motor based on an output of the second MCC device;
setting a predetermined MCC to one of the first MCC and the second MCC; and
controlling the switching device based on a comparison of the current flow to the electric motor and the predetermined MCC.

11. The method of claim 10 further comprising opening the switching device when the current flow to the electric motor is greater than the predetermined MCC.

12. The method of claim 10 wherein receiving the stored digital value from the first MCC device includes receiving the stored digital value wirelessly from the first MCC device using near field communication.

13. The method of claim 10 wherein receiving the stored digital value from the first MCC device includes receiving the stored digital value wirelessly from the first MCC device using radio frequency identification (RFID).

14. The method of claim 10 wherein receiving the stored digital value from the first MCC device includes receiving the stored digital value wirelessly from the first MCC device using a Bluetooth communication protocol.

15. The method of claim 10 wherein determining the first MCC includes determining the first MCC for the electric motor using a lookup table that relates digital values to respective first MCCs.

16. The method of claim 10 further comprising setting the predetermined MCC equal to a lesser one of the first and second MCCs.

17. The method of claim 10 wherein the second MCC device is integrated with the refrigerant compressor.

* * * * *